(12) United States Patent
Kao et al.

(10) Patent No.: US 12,087,843 B2
(45) Date of Patent: Sep. 10, 2024

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Wan-Yi Kao, Hsinchu County (TW); Fang-Yi Liao, Hsinchu (TW); Che-Hao Chang, Hsinchu (TW); Yung-Cheng Lu, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 333 days.

(21) Appl. No.: 17/475,068

(22) Filed: Sep. 14, 2021

(65) Prior Publication Data

US 2022/0328659 A1    Oct. 13, 2022

Related U.S. Application Data

(60) Provisional application No. 63/173,223, filed on Apr. 9, 2021.

(51) Int. Cl.
| | |
|---|---|
| H01L 21/8234 | (2006.01) |
| H01L 27/088 | (2006.01) |
| H01L 29/06 | (2006.01) |
| H01L 29/66 | (2006.01) |
| H01L 29/78 | (2006.01) |

(52) U.S. Cl.
CPC ........... *H01L 29/66795* (2013.01); *H01L 21/823431* (2013.01); *H01L 21/823481* (2013.01); *H01L 27/0886* (2013.01); *H01L 29/0649* (2013.01); *H01L 29/66545* (2013.01); *H01L 29/7851* (2013.01)

(58) Field of Classification Search
None
See application file for complete search history.

(56) References Cited

U.S. PATENT DOCUMENTS

2019/0067446 A1* 2/2019 Ching ............... H01L 27/0924
2020/0091311 A1* 3/2020 Hsu ................. H01L 21/823821

* cited by examiner

*Primary Examiner* — Joseph C. Nicely
*Assistant Examiner* — Lamont B Koo
(74) *Attorney, Agent, or Firm* — Maschoff Brennan

(57) ABSTRACT

A device includes a semiconductor fin, an isolation layer, a dielectric fin structure, and a gate structure. The semiconductor fin is over a substrate. The isolation layer is over the substrate and adjacent the semiconductor fin. The dielectric fin structure is over the isolation layer and includes a bottom dielectric fin and a top dielectric fin. The isolation layer surrounds a bottom of the bottom dielectric fin. The top dielectric fin is over the bottom dielectric fin and is spaced apart from the isolation layer. The gate structure is across the semiconductor fin and the dielectric fin structure, wherein a portion of the gate structure in contact with the isolation layer has a first width, and another portion of the gate structure in contact with the top dielectric fin has a second width greater than the first width.

20 Claims, 41 Drawing Sheets

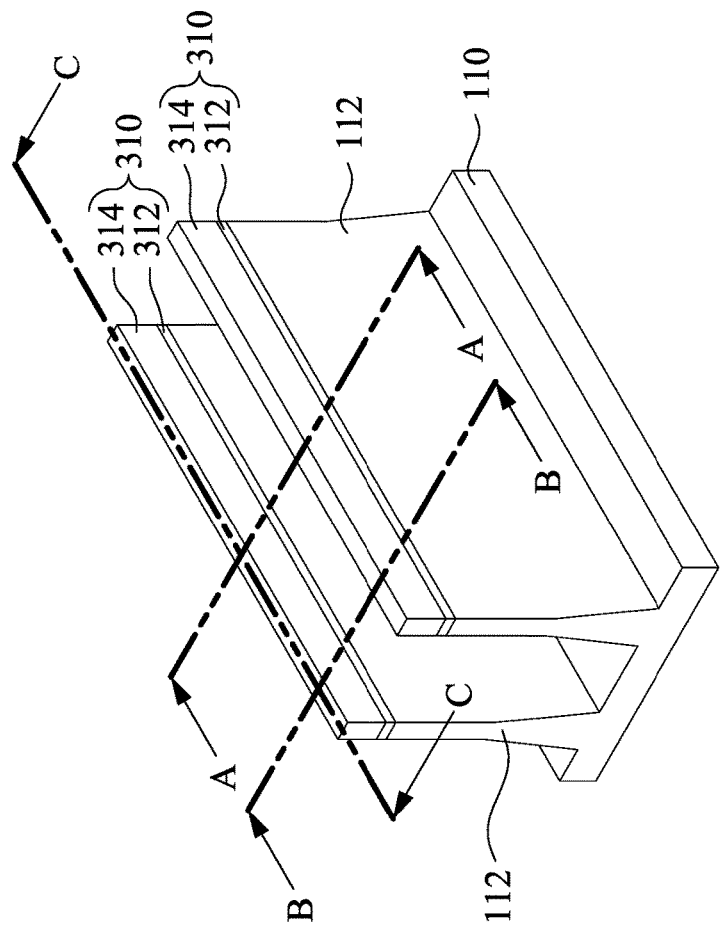
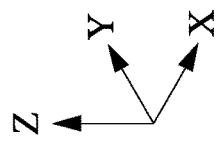
Fig. 1A

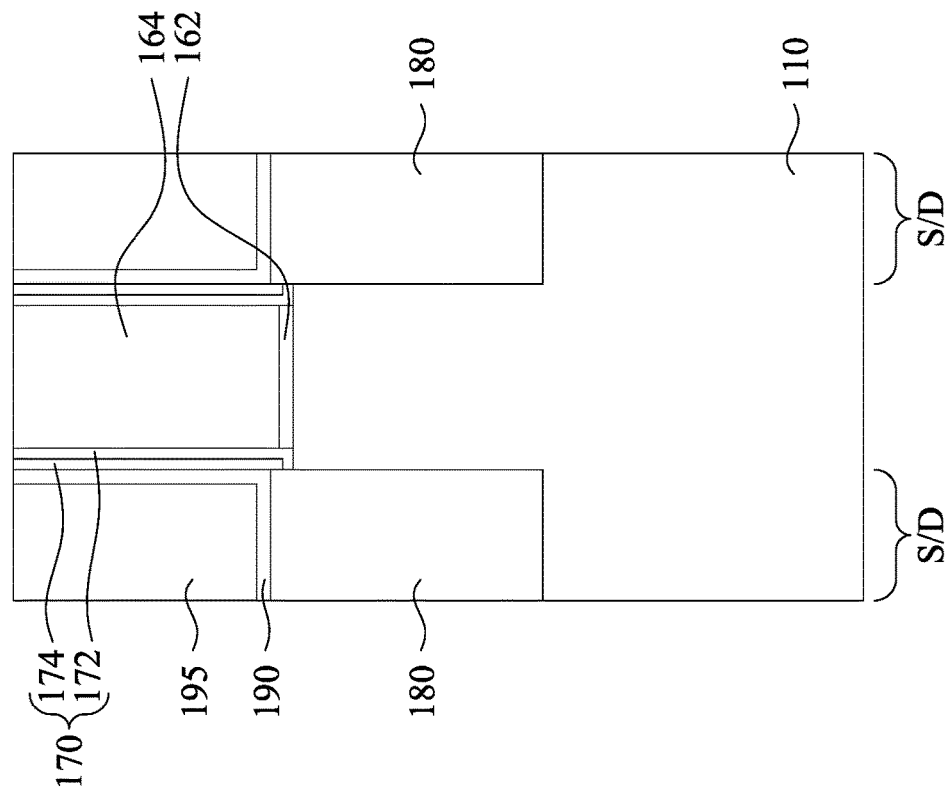

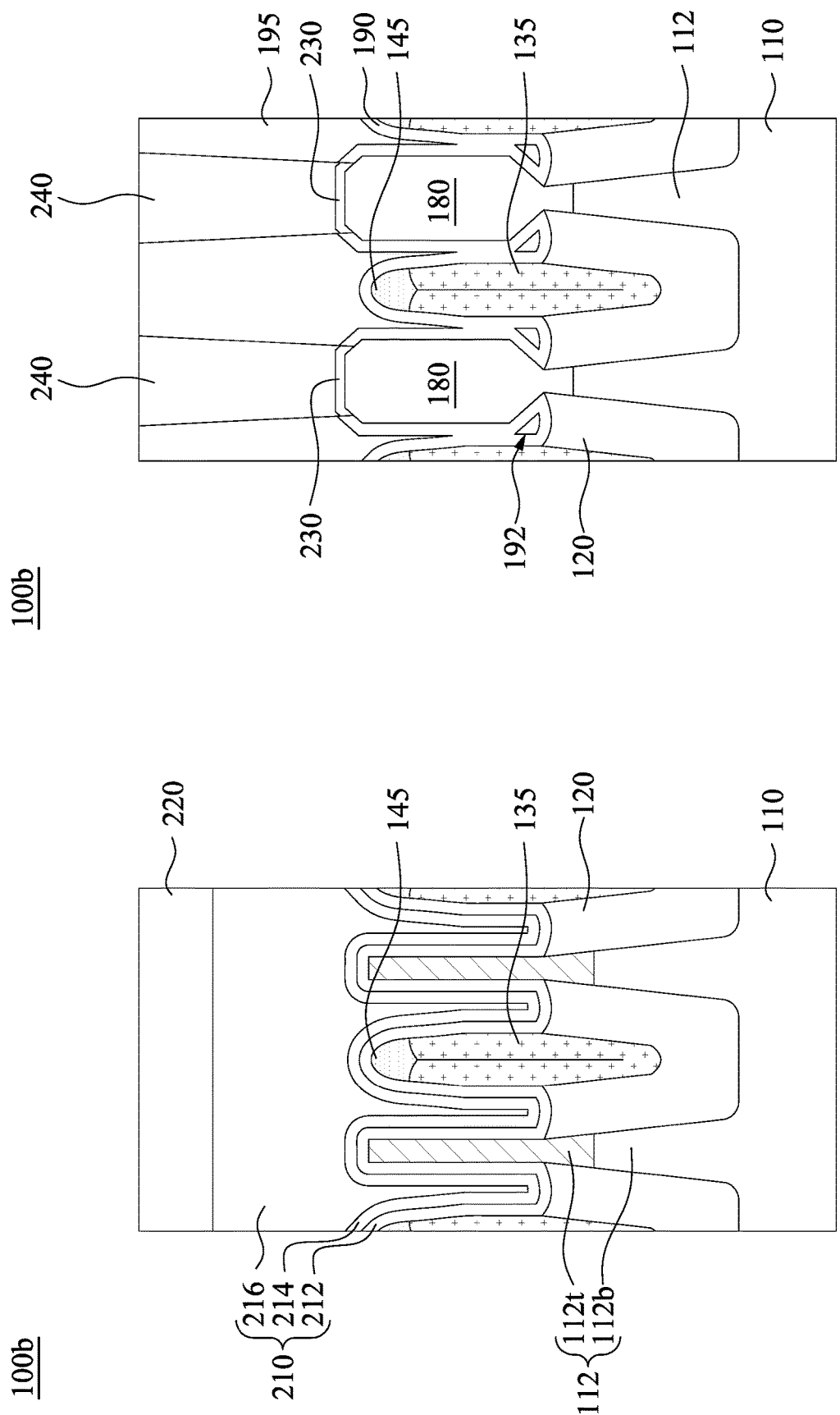

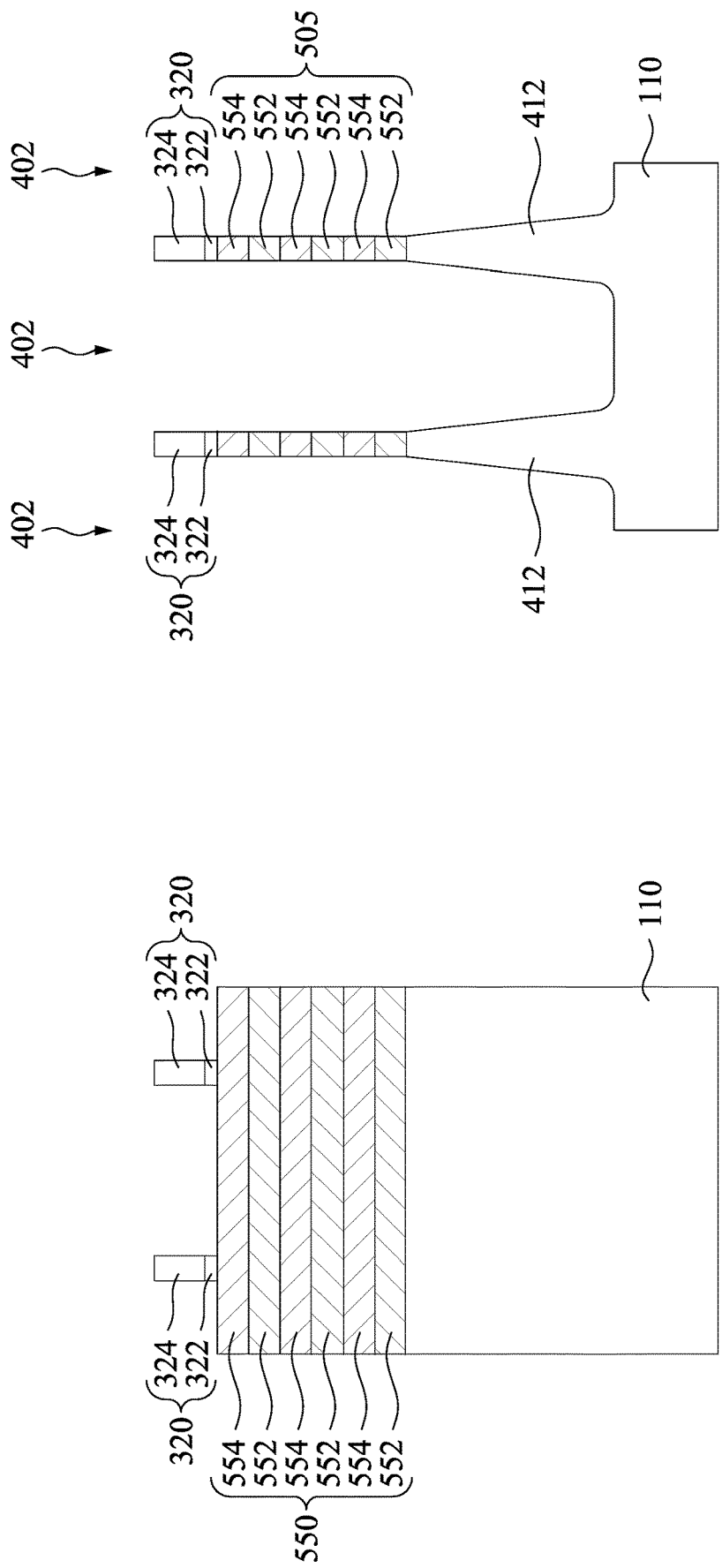

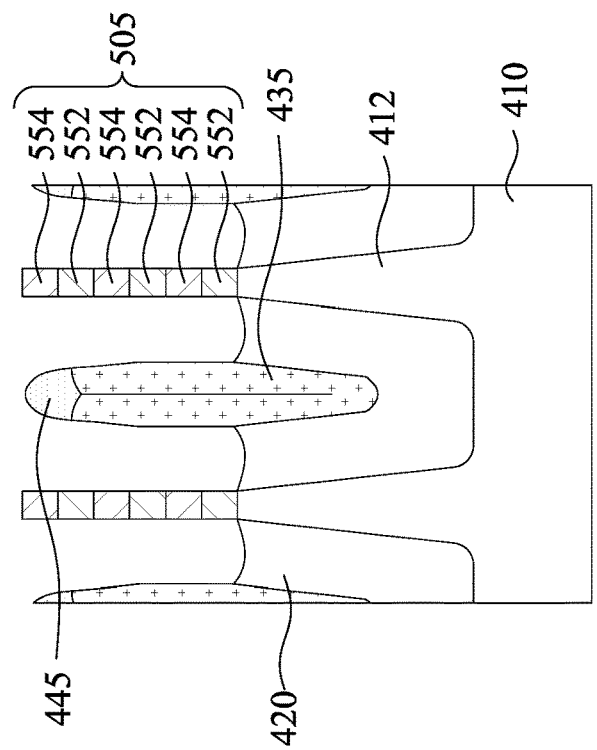
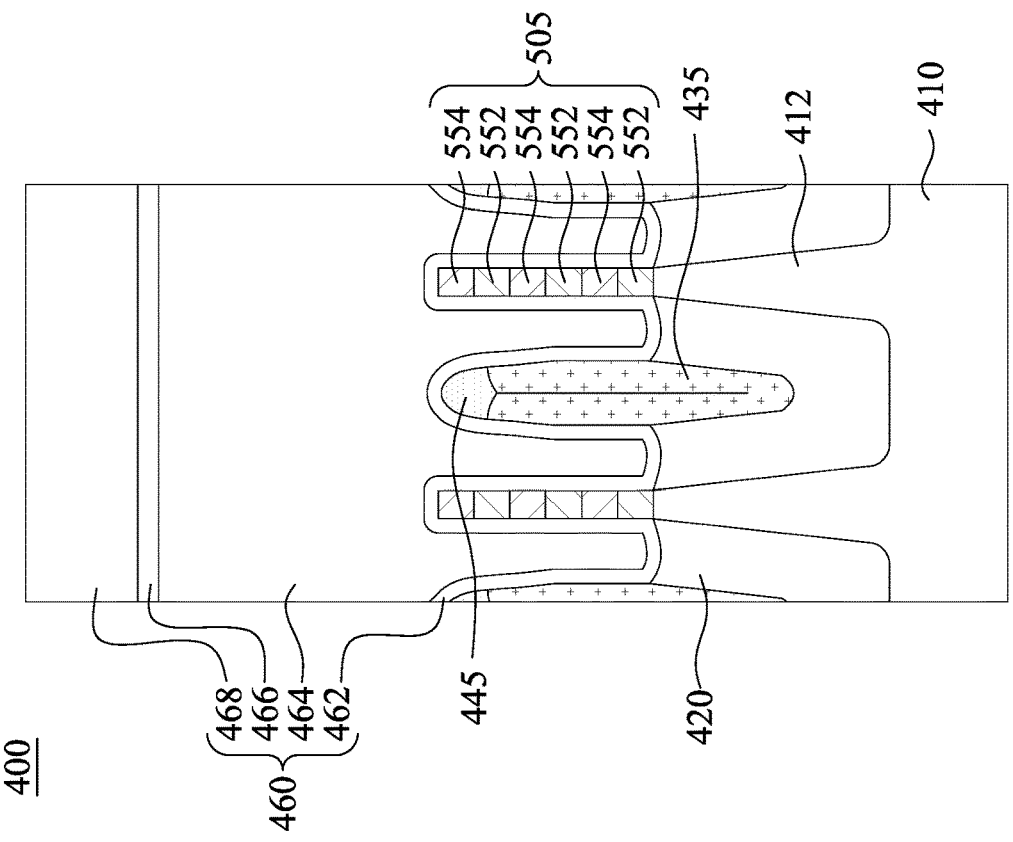
Fig. 22A
Fig. 22B

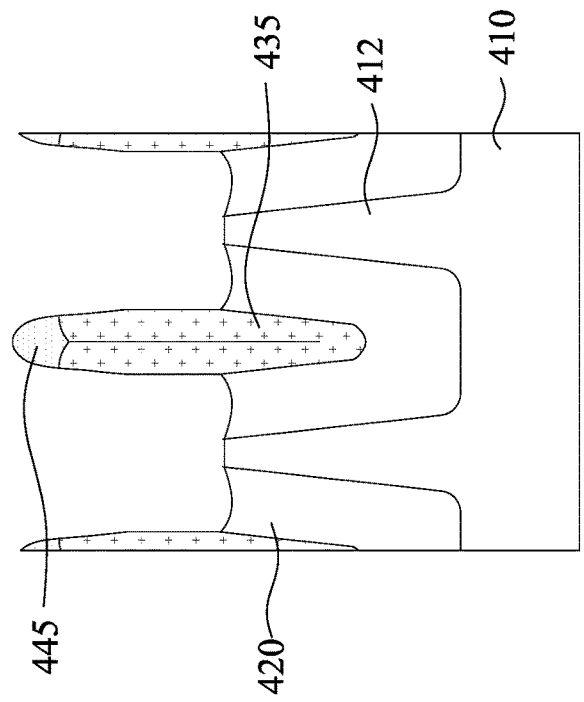
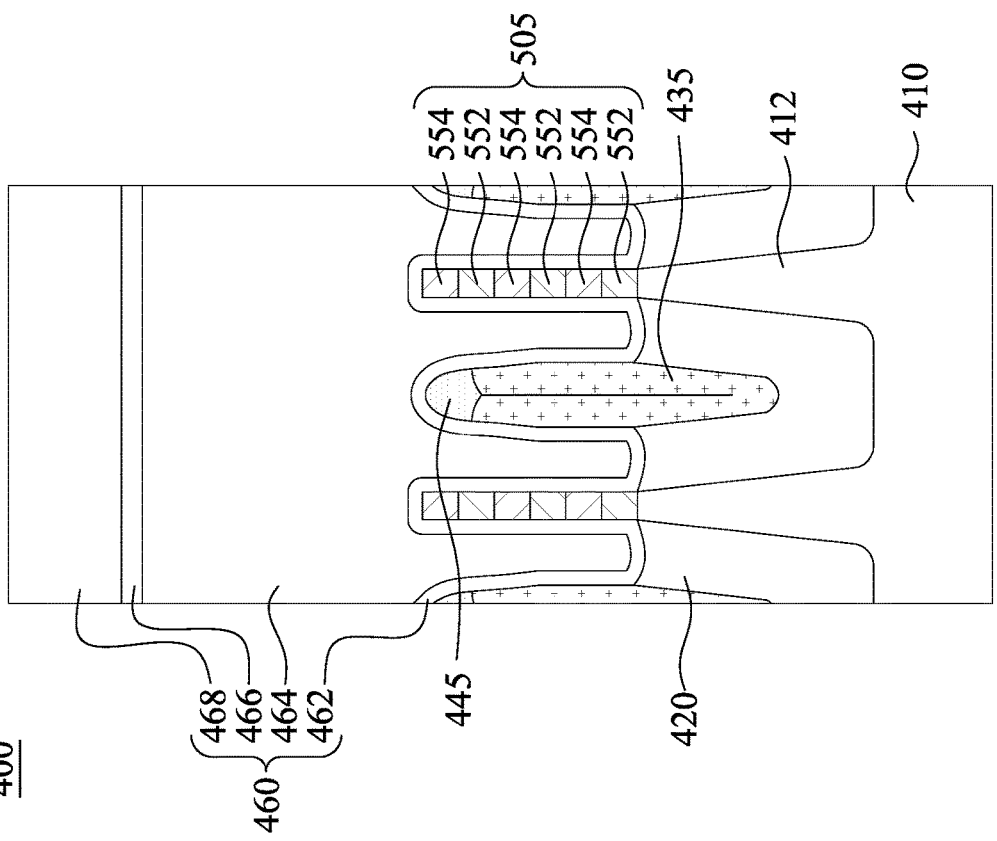
Fig. 23B
Fig. 23A

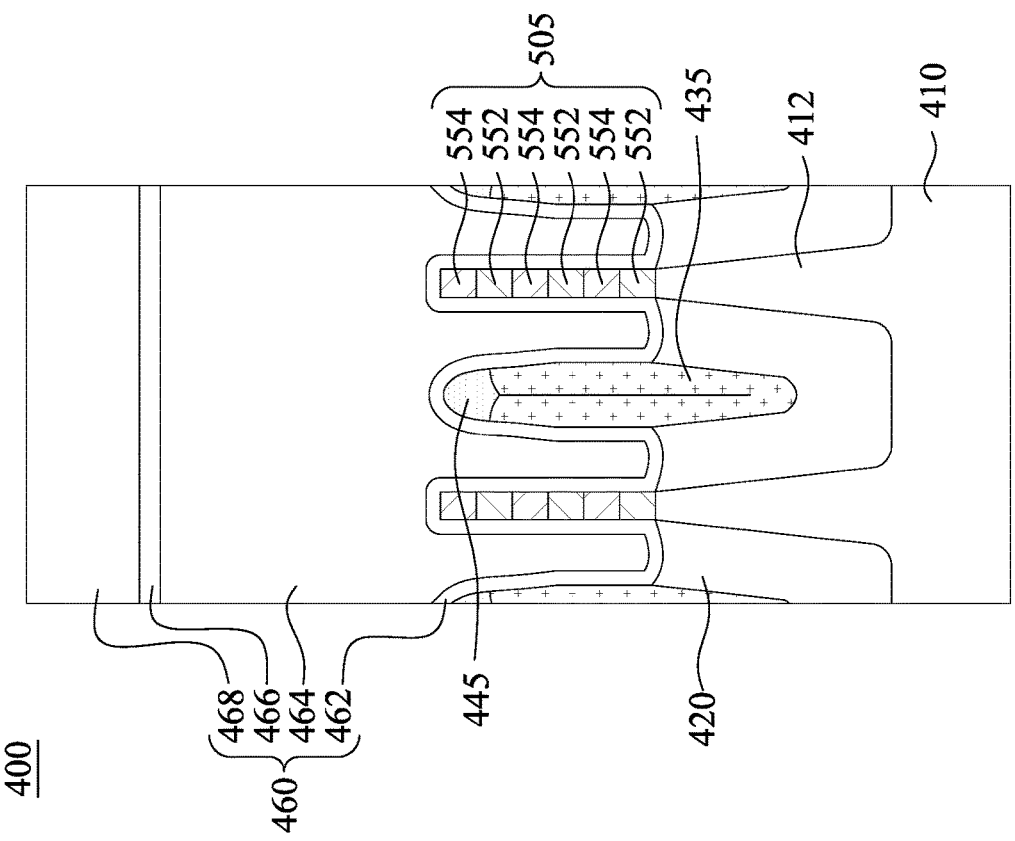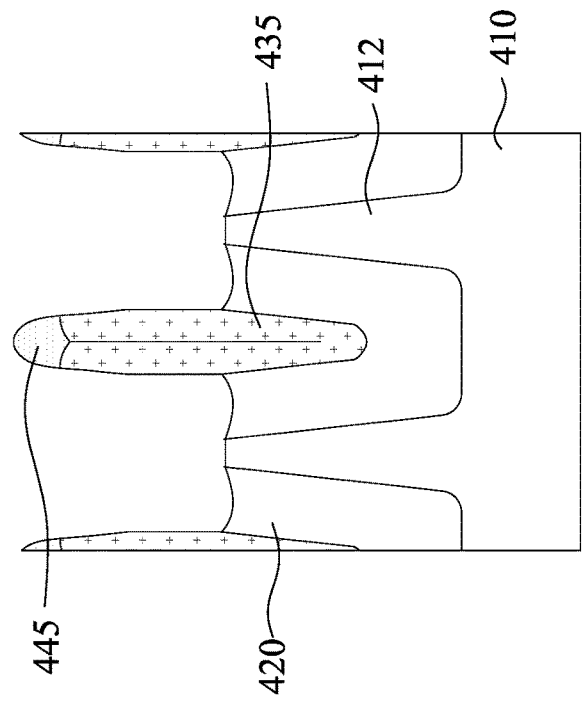
Fig. 24A
Fig. 24B

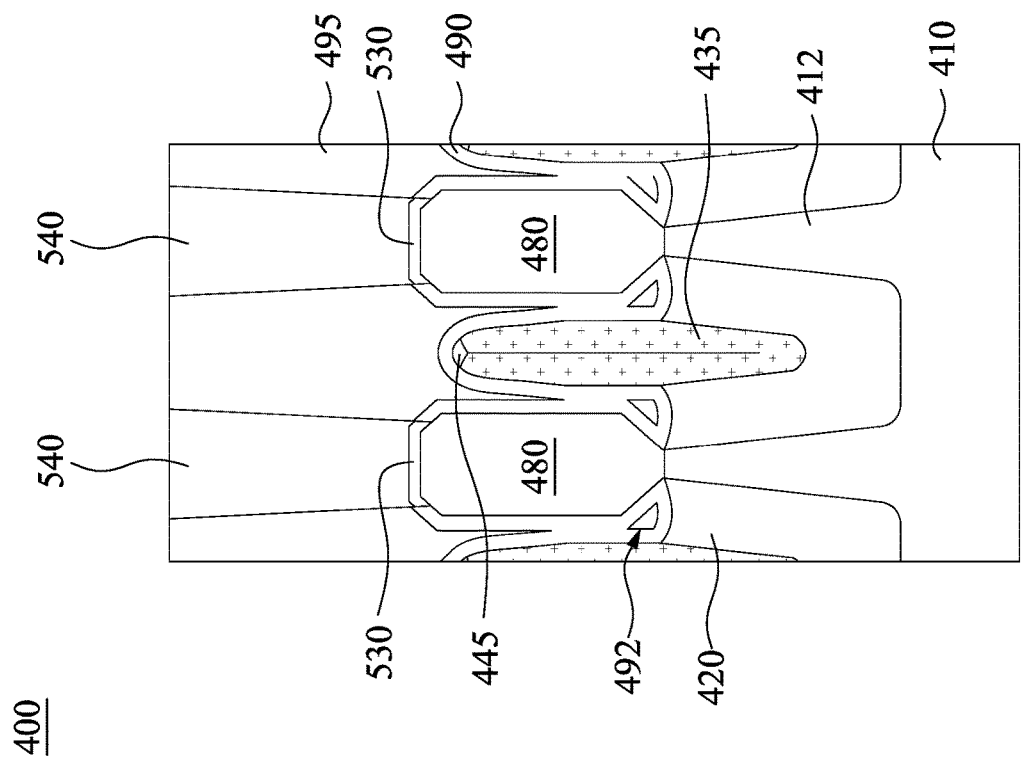
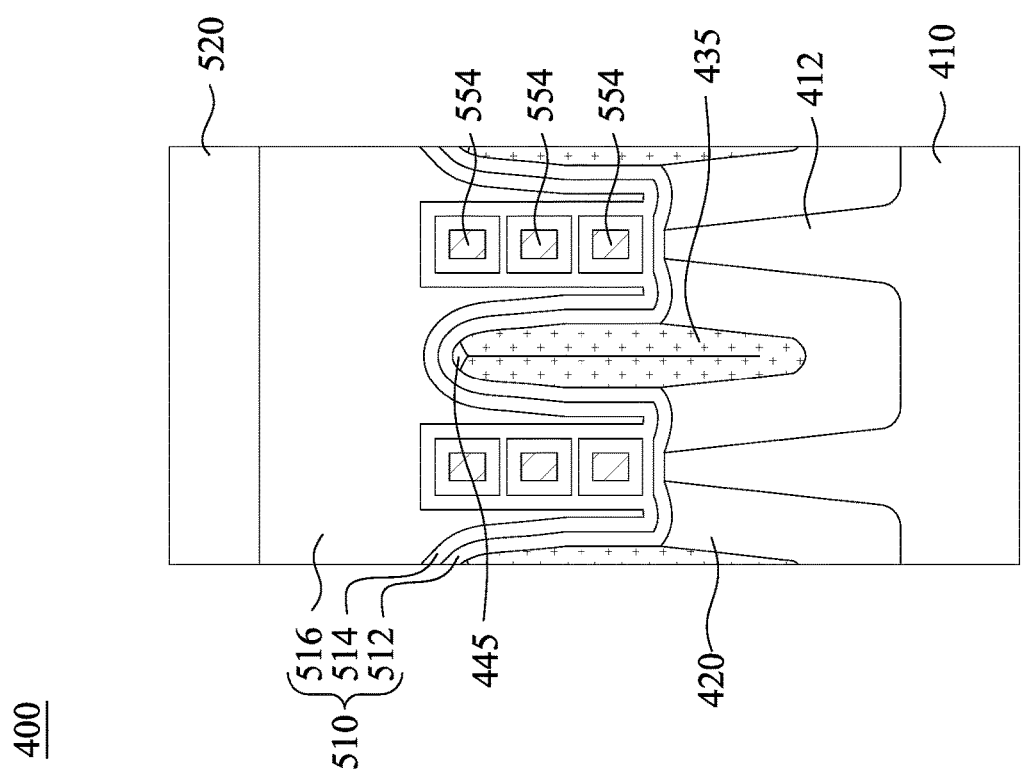
Fig. 30B
Fig. 30A

SEMICONDUCTOR DEVICE AND MANUFACTURING METHOD THEREOF

PRIORITY CLAIM AND CROSS-REFERENCE

This application claims priority to U.S. Provisional Application Ser. No. 63/173,223, filed Apr. 9, 2021, which is herein incorporated by reference.

BACKGROUND

Transistors are components of modern integrated circuits. To satisfy the requirements of increasingly faster speed, the drive currents of transistors are increasingly greater. To achieve this increase in performance, the gate lengths of transistors are constantly being scaled down. Scaling down the gate lengths, however, leads to undesirable effects such as "short-channel effects," in which the control of current flow by the gates is compromised. Among the short-channel effects are the Drain-Induced Barrier Lowering (DIBL) and the degradation of sub-threshold slope, both of which resulting in the degradation in the performance of transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15A and 15B are cross-sectional views of an integrated circuit structure in accordance with some embodiments of the present disclosure.

FIGS. 16A-29C illustrate perspective views and cross-sectional views of intermediate stages in the formation of an integrated circuit structure in accordance with some embodiments of the present disclosure.

FIGS. 30A and 30B are cross-sectional views of an integrated circuit structure in accordance with some embodiments of the present disclosure.

DETAILED DESCRIPTION

Figure 2:
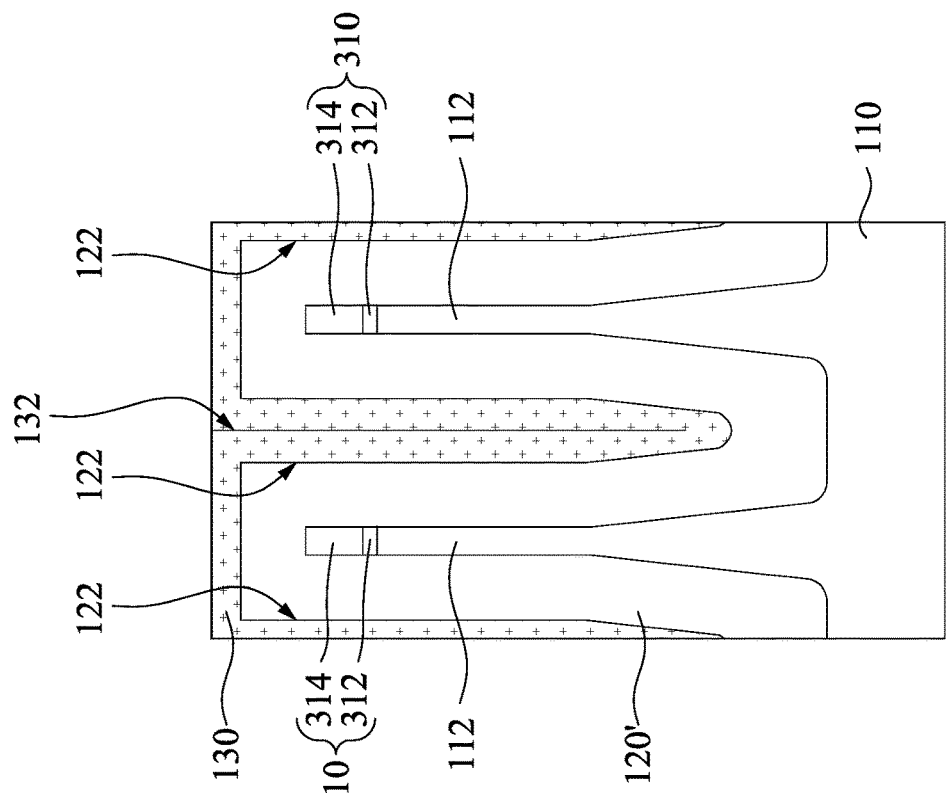
FIGS. 1A-13C illustrate perspective views and cross-sectional views of intermediate stages in the formation of an integrated circuit structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

Some embodiments of the present disclosure are related to integrated circuit structures and methods of forming the same. More particularly, some embodiments of the present disclosure are related to semiconductor devices including dielectric fin structures having tapered and/or rounded tops. The improved shape of the dielectric fin structures improves the windows for depositing gate structures.

FIGS. 1A-13C illustrate perspective views and cross-sectional views of intermediate stages in the formation of an integrated circuit structure (or a semiconductor device) 100 in accordance with some embodiments of the present disclosure. In addition to the integrated circuit structure, FIG. 1A depicts X-axis, Y-axis, and Z-axis directions. The formed transistors (integrated circuit structure) may include a p-type transistor (such as a p-type Fin FET) and/or an n-type transistor (such as an n-type Fin FET) in accordance with some exemplary embodiments. Throughout the various views and illustrative embodiments, like reference numbers are used to designate like elements. It is understood that additional operations can be provided before, during, and after the processes shown by FIGS. 1A-13C, and some of the operations described below can be replaced or eliminated, for additional embodiments of the method. The order of the operations/processes may be interchangeable.

Figure 1B:
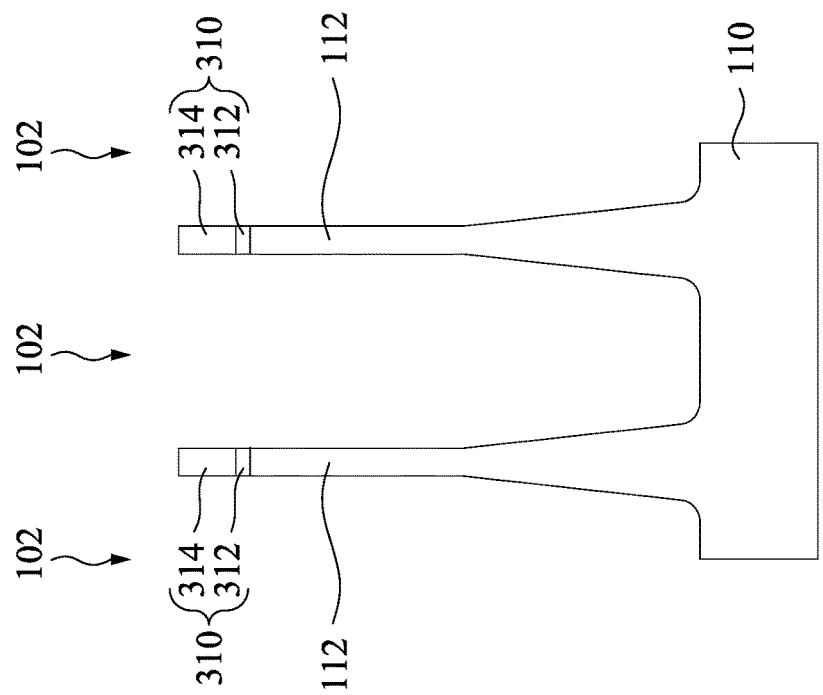

FIG. 1A is a perspective view of some embodiments of the integrated circuit structure 100 at intermediate stages in accordance with some embodiments of the present disclosure. FIGS. 1B, 2-7A, 8A, 9A, 10A, 11A, 12A, and 13A are cross-sectional views of some embodiments of the integrated circuit structure 100 at intermediate stages along a first cut (e.g., cut A-A in FIG. 1A). FIGS. 7B, 8B, 9B, 10B, 11B, 12B, and 13B are cross-sectional views of some embodiments of the integrated circuit structure 100 at intermediate stages along a second cut (e.g., cut B-B in FIG. 1A). FIGS. 7C, 8C, 9C, 10C, 11C, 12C, and 13C are cross-sectional views of some embodiments of the integrated circuit structure 100 at intermediate stages along a third cut (e.g., cut C-C in FIG. 1A).

Reference is made to FIGS. 1A and 1B. A substrate 110 is illustrated. In some embodiments, the substrate 110 includes silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or combinations thereof) or other appropriate semiconductor materials. In some embodiments, the substrate 110 includes a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method.

One or more semiconductor fins 112 are formed on the substrate 110. The semiconductor fins 112 may be N-type or P-type. For example, one or some of the semiconductor fins 112 are N-type, and one or some of the semiconductor fins 112 are P-type. The semiconductor fins 112 may be formed using, for example, a patterning process to form trenches 102 such that the trenches 102 are formed between adjacent semiconductor fins 112. As discussed in greater detail below, the semiconductor fins 112 will be used to form FinFETs. It is understood that two semiconductor fins 112 are illustrated for purposes of illustration, but other embodiments may include any number of semiconductor fins. In some embodiments, one or more dummy semiconductor fins are formed adjacent to the semiconductor fins 112.

The semiconductor fins 112 may be formed by performing an etching process to the substrate 110. Specifically, a patterned hard mask structure 310 is formed over the substrate 110. In some embodiments, the patterned hard mask structure 310 is formed of silicon nitride, silicon oxynitride, silicon carbide, silicon carbo-nitride, or the like. For example, the patterned hard mask structure 310 includes an oxide pad layer 312 and a nitride mask layer 314 over the oxide pad layer 312. The patterned hard mask structure 310 covers a portion of the substrate 110 while leaves another portion of the substrate 110 uncovered. The substrate 110 is then patterned using the patterned hard mask structure 310 as a mask to form the trenches 102. Accordingly, the semiconductor fins 112 are formed.

Reference is made to FIG. 2. An isolation layer 120' is formed over the substrate 110 and in the trenches 102. In some embodiments, the isolation layer 120' is formed to conformally cover the semiconductor fins 112 by suitable deposition process, such as atomic layer deposition (ALD). Thus, plural trenches 122 are formed in the isolation layer 120 and between the semiconductor fins 112. In some embodiments, the isolation layer 120' includes oxide, e.g., a silicon dioxide.

Subsequently, a first dielectric fin layer 130 is formed over the substrate 110 and covers the isolation layer 120'. The first dielectric fin layer 130 is filled in the recesses 122 in the isolation layer 120'. In some embodiments, the recesses 122 may be filled by suitable processes such as, for example, ALD, CVD, FCVD, PVD, MBE, HDPCVD, MOCVD, RPCVD, PECVD, other suitable methods, and/or combinations thereof. In some embodiments, filling of the recesses 122 may be performed by an ALD process such that a seam 132 may be formed in the first dielectric fin layer 130. In some embodiments, the first dielectric fin layer 130 includes silicon carbon nitride (SiCN), silicon oxygen carbon nitride (SiOCN), or other carbon-containing materials.

The first dielectric fin layer 130 is formed using a deposition technique that can form conformal dielectric layers, such as thermal atomic layer deposition (ALD), plasma-enhanced (PE) ALD, pulsed PEALD, or atomic layer chemical vapor deposition (AL-CVD). ALD is an approach to filling dielectrics that involves depositing a monolayer of precursor over the substrate 110, purging the chamber, and introducing a reactant that reacts with the precursor to leave a monolayer of product. The cycle can be repeated many times to build a layer with a sufficient thickness to be functional. In some embodiments, the first dielectric fin layer 130 is formed by performing m cycles of the first deposition process to achieve a desired thickness, where m is equal to or greater than 1.

During the deposition processes, the structure is positioned on a chuck in a deposition process chamber. A vacuum is then applied to the deposition process chamber to remove oxygen and moisture and the temperature is raised to an acceptable level that is suitable for the deposition. Precursors are then fed into the deposition process chamber. The precursors may be silicon-containing precursors such as dichlorosilane (DCS), $SiH_4$, or other suitable materials.

In some embodiments, process gases are fed into the ALD process chamber. The process gas can be a nitride-containing gas, such as $NH_3$, $N_2/H_2$, or other suitable gases. Hence, the first dielectric fin layer 130 further includes nitride, and is a nitride-containing dielectric layer. In some other embodiments, the nitride-containing gas and oxygen-containing gas, such as $O_2$, $H_2O$, and/or other suitable gases, are sequentially fed into the ALD process chamber to modulate the N/O ratio of the first dielectric fin layer 130. In some embodiments, the ALD processes can be plasma-enhanced ALD processes. That is, the ALD processes include plasma treatments.

In embodiments where the precursors do not contain carbon, some other carbon-containing materials (such as carbon sources or organic hydrocarbons) may be provided. Carbon addition results in a layer with more resistance to wet etching process, such that increases the wet etch selectivity. In some embodiments, the carbon-containing materials may be chain-type hydrocarbon, written as CxHy, 2>X>4 and including at least one C=C bond. The carbons of C=C bond can be bond to Si or other elements of the first dielectric fin layer 130. The above mentioned processes (the precursor feeding process, the process gas feeding process, the plasma treatments, and/or the carbon addition process) are separated by individual purge periods. In some embodiments, a carbon concentration of the first dielectric fin layer 130 is greater than about 10%, such as about 10% to about 20%.

Figure 3:
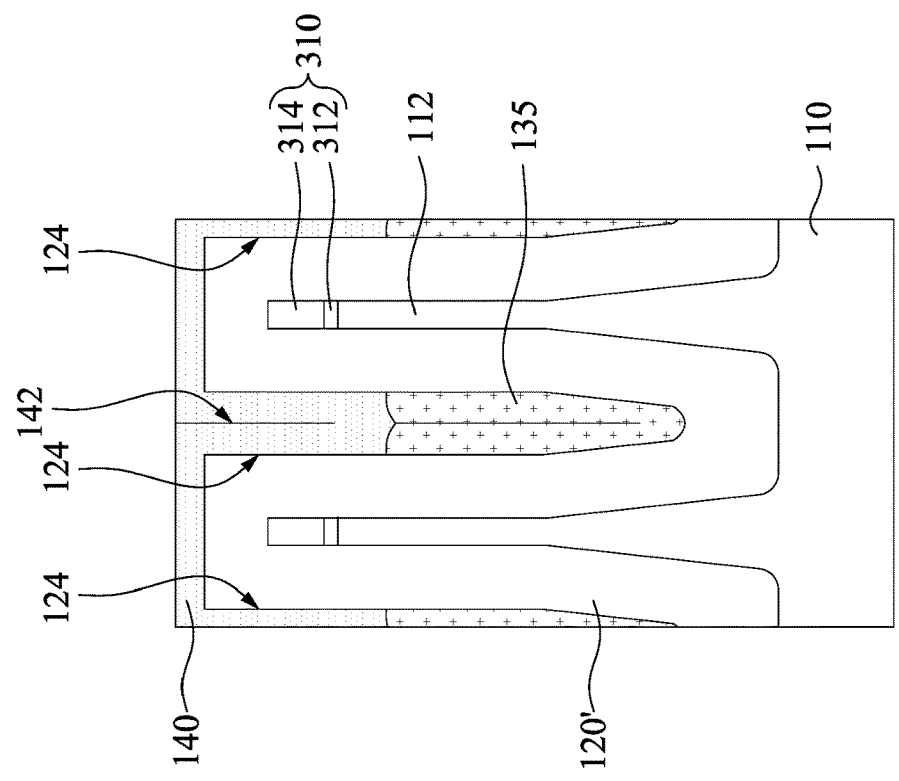

Reference is made to FIG. 3. One or more etching process(es) are performed to remove excess first dielectric fin layer 130 to form bottom dielectric fins 135 and recesses 124 thereon. As such, top surfaces 136 of the bottom dielectric fins 135 are lower than top surfaces 113 of the semiconductor fins 112 by a distance D1. In some embodiments, the distance D1 is less than about 30 nm, e.g., in a range of about 20 nm to about 30 nm. In some embodiments, if the top surface 136 is higher than the top surface 113, the following formed second dielectric fin layer 140 will be totally removed during the planarization process (see FIG. 5); if the distance D1 is greater than about 30 nm, the following formed top dielectric fins 145 (see FIG. 6) may be removed too much during the etching process shown in FIG. 6.

In some embodiments, since the first dielectric fin layer 130 has the seam 132 therein, etching gas of the etching process may enter the seam 132. As such, portions of the first dielectric fin layer 130 near the seam 132 may be etched at a faster rate than other portions of the first dielectric fin layer 130, and the top surface 136 of the bottom dielectric fins 135 has convex portions on opposite sides of the seam 132.

In some embodiments, the etching process is performed by using a gaseous mixture of a fluorine containing gas, such as $C_4F_8$, $C_5F_8$, $C_4F_6$, $CHF_3$ or similar species, an inert gas, such as argon or helium, an optional weak oxidant, such as $O_2$ or CO or similar species, for a duration time sufficient to etch first dielectric fin layer 130 to form the bottom dielectric fins 135. The etching environment has a temperature between about 600° C. and about 700° C.

Figure 4:
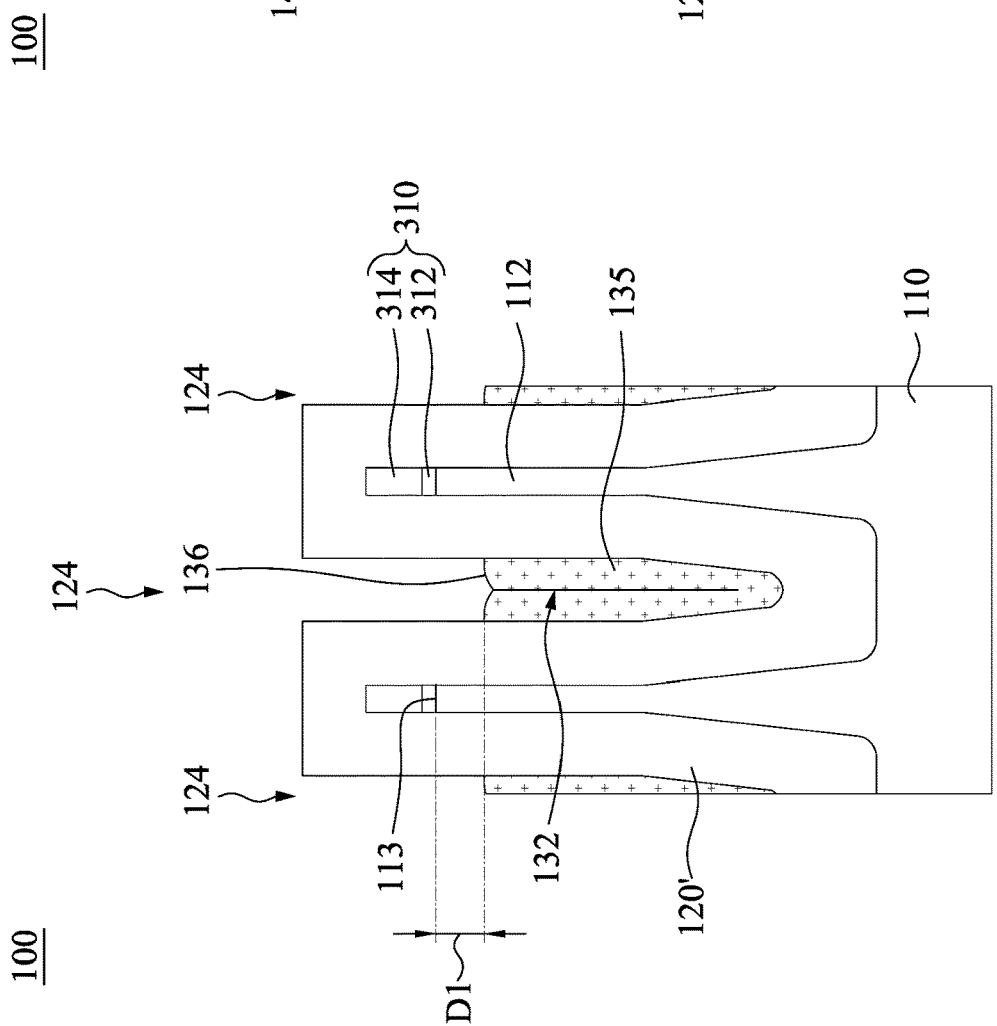

Reference is made to FIG. 4. A second dielectric fin layer 140 is formed over the substrate 110 and covers the isolation layer 120' and the bottom dielectric fins 135. The second dielectric fin layer 140 is filled in the trenches 124 in the isolation layer 120'. In some embodiments, the trenches 124 may be filled by suitable processes such as, for example, ALD, CVD, FCVD, PVD, MBE, HDPCVD, MOCVD, RPCVD, PECVD, other suitable methods, and/or combinations thereof. In some embodiments, filling of the trenches 124 may be performed by an ALD process such that another seam 142 may be formed in the second dielectric fin layer 140. In some embodiments, the second dielectric fin layer 140 includes silicon nitride ($SiN_x$), silicon oxynitride (SiON), silicon carbon nitride (SiCN), silicon oxygen carbon nitride (SiOCN).

During the deposition processes, the structure of FIG. 3 is positioned on a chuck in a deposition process chamber. A vacuum is then applied to the deposition process chamber to remove oxygen and moisture and the temperature is raised to an acceptable level that is suitable for the deposition. Precursors are then fed into the deposition process chamber. The precursors may be silicon-containing precursors such as dichlorosilane (DCS), $SiH_4$, or other suitable materials.

In some embodiments, process gases are fed into the ALD process chamber. The process gas can be a nitride-containing gas, such as $NH_3$, $N_2/H_2$, or other suitable gases. Hence, the second dielectric fin layer 140 further includes nitride, and is a nitride-containing dielectric layer. In some other embodiments, the nitride-containing gas and oxygen-containing gas, such as $O_2$, $H_2O$, or other suitable gases, are sequentially fed into the ALD process chamber to modulate the N/O ratio of the second dielectric fin layer 140. In some embodiments, the ALD processes can be plasma-enhanced ALD processes. That is, the ALD processes include plasma treatments.

In embodiments where the precursors do not contain carbon, some other carbon-containing materials (such as carbon sources or organic hydrocarbons) may be provided. Carbon addition results in a layer with more resistance to wet etching process, such that increases the wet etch selectivity. In some embodiments, the carbon-containing materials may be chain-type hydrocarbon, written as CxHy, 2>X>4 and including at least one C=C bond. The carbons of C=C bond can be bond to Si or other elements of the second dielectric fin layer 140. The above mentioned processes (the precursor feeding process, the process gas feeding process, the plasma treatments, and/or the carbon addition process) are separated by individual purge periods. In some embodiments, a carbon concentration of the second dielectric fin layer 140 is in a range of about 0% to about 10%. The carbon addition process can be omitted when the second dielectric fin layer 140 is free from carbon. That is, the carbon concentration of the second dielectric fin layer 140 is lower than the carbon concentration of the first dielectric fin layer 130. With such configuration, the first dielectric fin layer 130 and the second dielectric fin layer 140 have a slightly etching selectivity.

Figure 5:
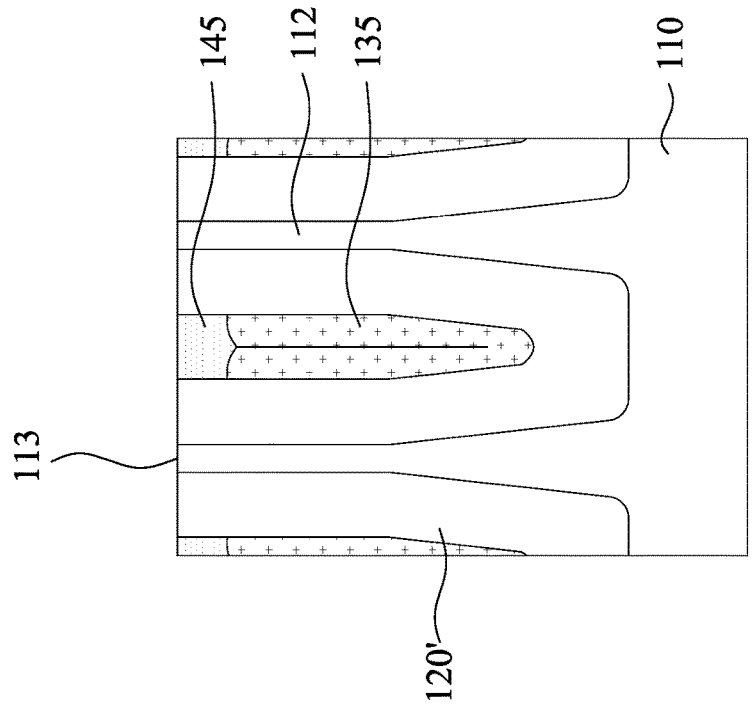

Reference is made to FIG. 5. One or more planarization process(es) and/or etching process(es) are performed to remove excess second dielectric fin layer 140 to form top dielectric fins 145 respectively over the bottom dielectric fins 135. For example, a planarization process is performed to remove portions of the second dielectric fin layer 140, the isolation layer 120, and the mask layers 310 until the top surfaces 113 of the semiconductor fins 112 are exposed.

Figure 6:
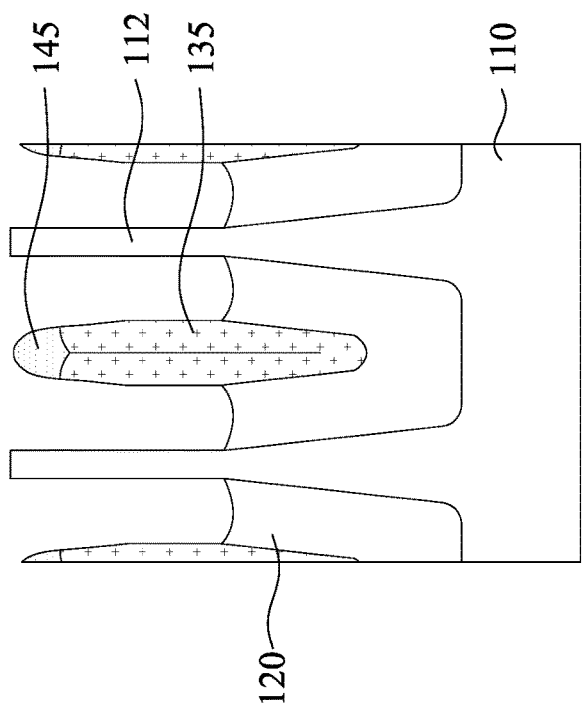

Reference is made to FIG. 6. Subsequently, the isolation layer 120' (see FIG. 5) is etched back such that the top dielectric fins 145, portions of the semiconductor fins 112 and portions of the bottom dielectric fins 135 protrude from the remaining portions of the isolation layer 120'. The remaining portions of isolation layer 120' form isolation structures 120. The isolation structures 120 can be achieved by suitable methods such as, for example, an etching process that has suitable etch selectivity between materials of the isolation layer 120', the semiconductor fins 112, the top dielectric fins 145, and the bottom dielectric fins 135. In some embodiments, the etching process is performed by using an etchant including $HF/NH_3$.

The etching process can have a higher etch rate of the isolation layer 120' than the etch rate of the semiconductor fins 112, the top dielectric fins 145, and the bottom dielectric fins 135. Further, the etching process has a slightly etch selectivity between materials of the top dielectric fins 145 and the bottom dielectric fins 135. That is, the etching process etches the top dielectric fins 145 at an etching rate faster than that etches the bottom dielectric fins 135. For example, the etching process etches the top dielectric fins 145 faster than that etches the bottom dielectric fins 135 by more than about 3 times to about 5 times. Stated another way, the etching process etches the isolation layer 120' at a first etching rate, etches the first dielectric fin layer 130 at a second etching rate, and etches the second dielectric fin layer 140 at a third etching rate. The first etching rate is higher than the third etching rate, and the third etching rate is higher than the second etching rate. As such, top surfaces of the top dielectric fins 145 are slightly etched and are rounded. Comparing with the top dielectric fins 145, the bottom dielectric fins 135 are not or barely etched during the etching process.

Figure 7A:
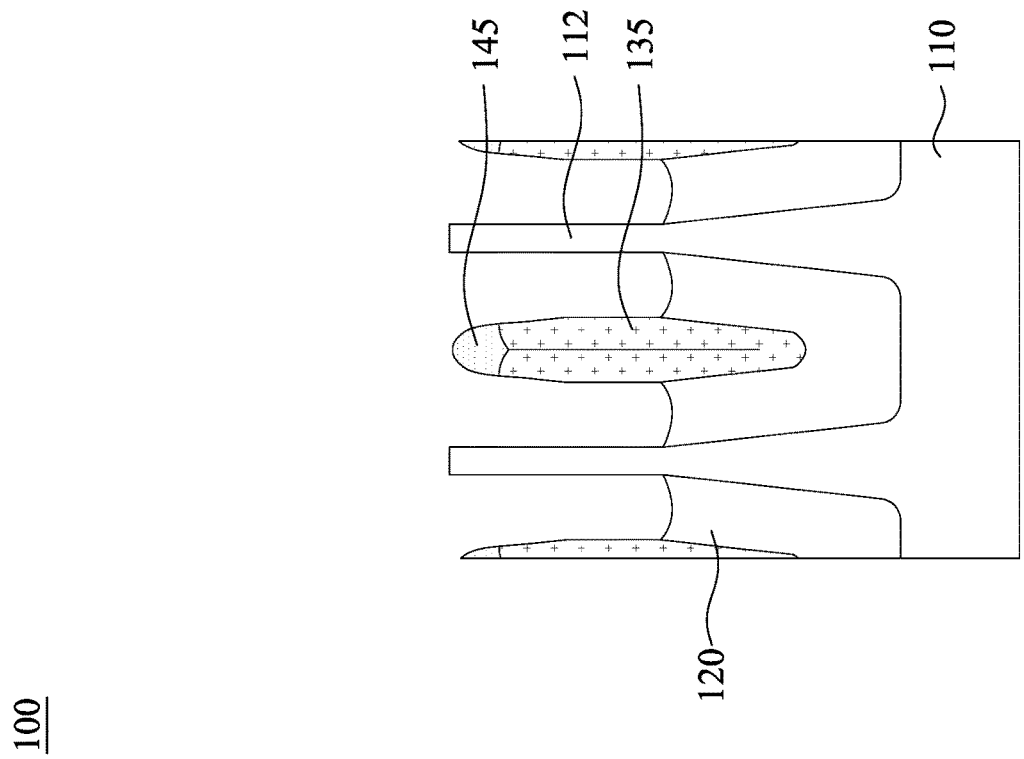
Figure 7B:
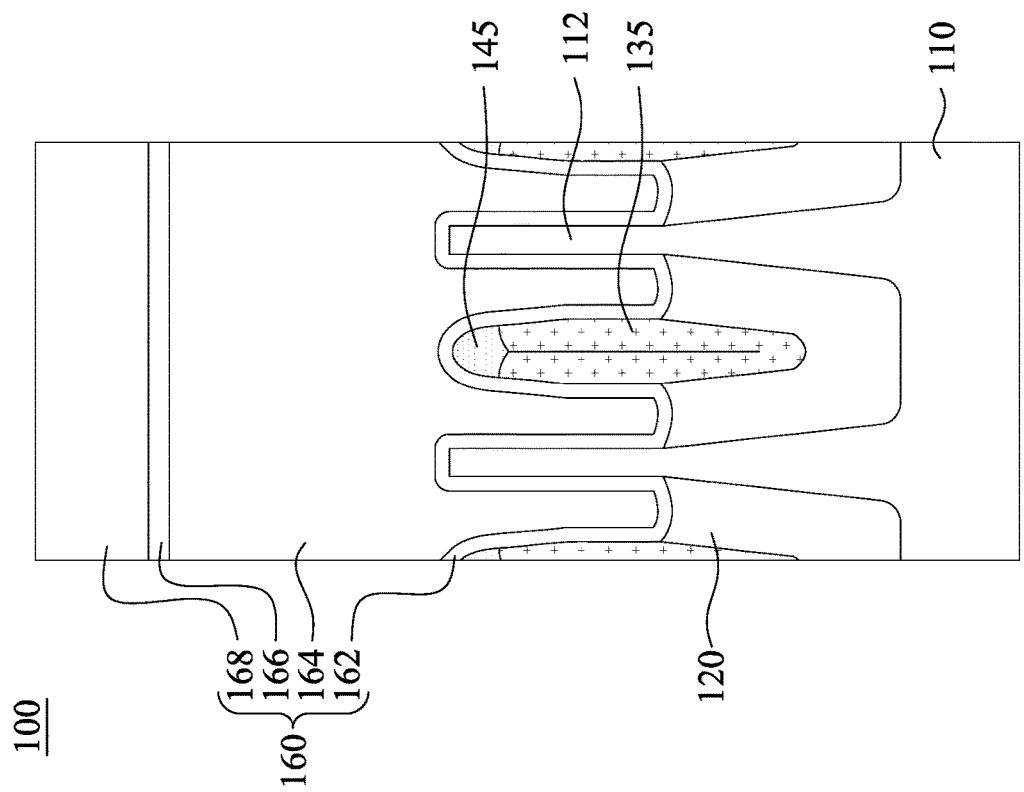
Figure 7C:
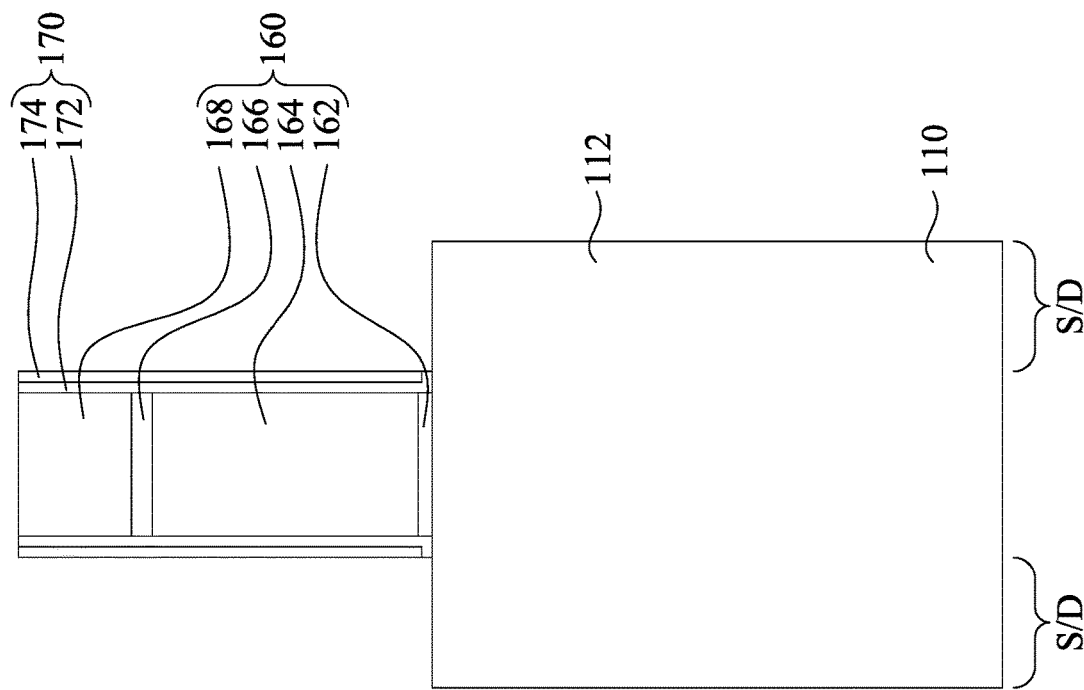

Reference is made to FIGS. 7A-7C. At least one dummy gate structure 160 is formed over the substrate 110 and at least partially disposed over the semiconductor fins 112. The portions of the semiconductor fins 112 underlying the dummy gate structure 160 may be referred to as the channel regions. The dummy gate structure 160 may also define source/drain (S/D) regions of the semiconductor fins 112, for example, the regions of the semiconductor fins 112 adjacent and on opposing sides of the channel regions. As shown in FIG. 7A, since portions of the top dielectric fins 145 are removed during the etching process in FIG. 6, the gaps between the semiconductor fins 112 and the top dielectric fins 145 are enlarged, and the dummy gate structure 160 can be easily deposited between the semiconductor fins 112 and the top dielectric fins 145.

Dummy gate formation operation first forms a dummy gate dielectric layer 162 over the semiconductor fins 112. Subsequently, a dummy gate electrode layer and a hard mask which may include multiple layers (e.g., an oxide layer and a nitride layer) are formed over the dummy gate dielectric layer. The hard mask is then patterned to be nitride mask layers 168 and oxide mask layers 166, followed by patterning the dummy gate electrode layer to be dummy gate electrodes 164 by using the mask layers 168 and pad layers 166 as etch masks. In some embodiments, after patterning the dummy gate electrode layer, the dummy gate dielectric layer is removed from the S/D regions of the semiconductor fins 112 and to be dummy gate dielectric layers 162. The etching process may include a wet etch, a dry etch, and/or combinations thereof. The etching process is chosen to selectively etch the dummy gate dielectric layer without substantially etching the semiconductor fins 112, the dummy gate electrode layers 164, the oxide mask layers 166 and the nitride mask layers 168.

After formation of the dummy gate structure 160 is completed, gate spacers 170 formed on sidewalls of the dummy gate structure 160. In some embodiments of the gate spacer formation operations, a spacer material layer is deposited on the substrate 110. The spacer material layer may be a conformal layer that is subsequently etched back to form gate spacers 170. In some embodiments, the spacer material layer includes multiple layers, such as a first spacer layer 172 and a second spacer layer 174 formed over the first spacer layer 172. The first and second spacer layers 172 and 174 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 172 and 174 may be formed by depositing in sequence two different dielectric materials over the dummy gate structure 160 using processes such as, CVD process, a subatmospheric CVD (SACVD) process, a flowable CVD process, an ALD process, a PVD process, or other suitable process. An anisotropic etching process is then performed on the deposited spacer layers 172 and 174 to expose portions of the semiconductor fins 112 not covered by the dummy gate structure 160 (e.g., in source/drain regions of the semiconductor fins 112). Portions of the spacer layers 172 and 174 directly above the dummy gate structure 160 may be removed by this anisotropic etching process. Portions of the spacer layer 172 and 174 on sidewalls of the dummy gate structure 160 may remain, forming gate sidewall spacers, which are denoted as the gate spacers 170, for the sake of simplicity. In some embodiments, the first spacer layer 172 is formed of silicon oxide that has a lower dielectric constant than silicon nitride, and the second spacer layer 174 is formed of silicon nitride that has a higher etch resistance against subsequent etching processing (e.g., etching source/drain recesses in the semiconductor fins 112) than silicon oxide. In some embodiments, the gate spacers 170 may be used to offset subsequently formed doped regions, such as source/drain regions. The gate spacers 170 may further be used for designing or modifying the source/drain region profile.

Figure 8B:
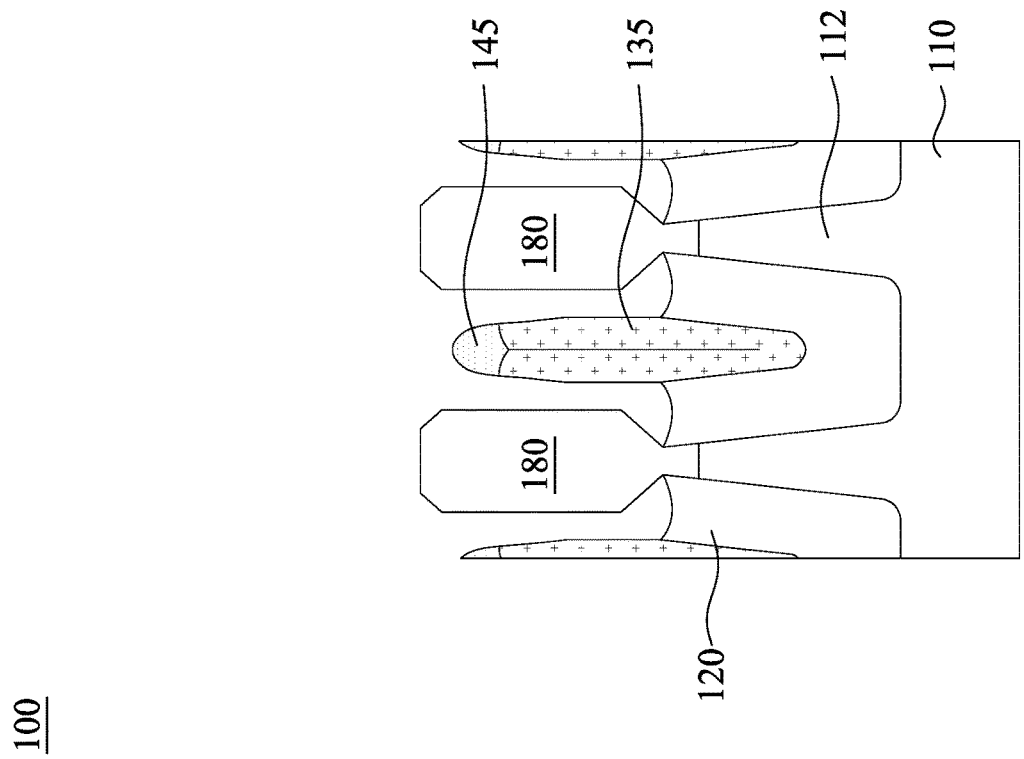
Figure 8A:
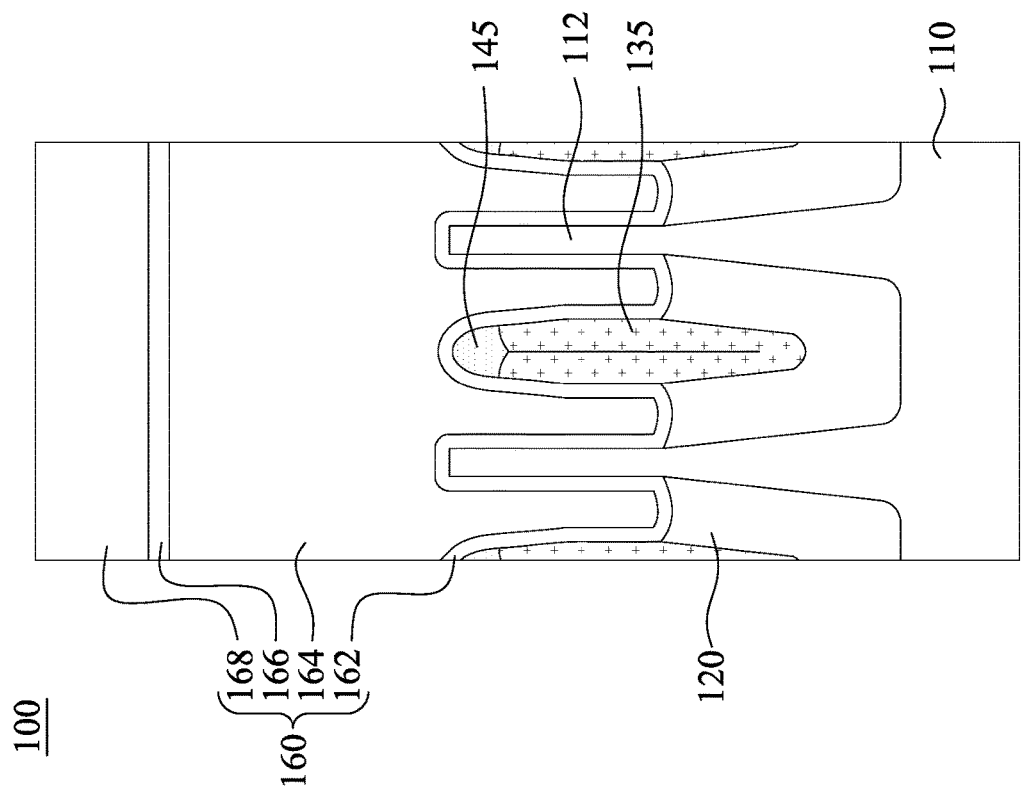
Figure 8C:
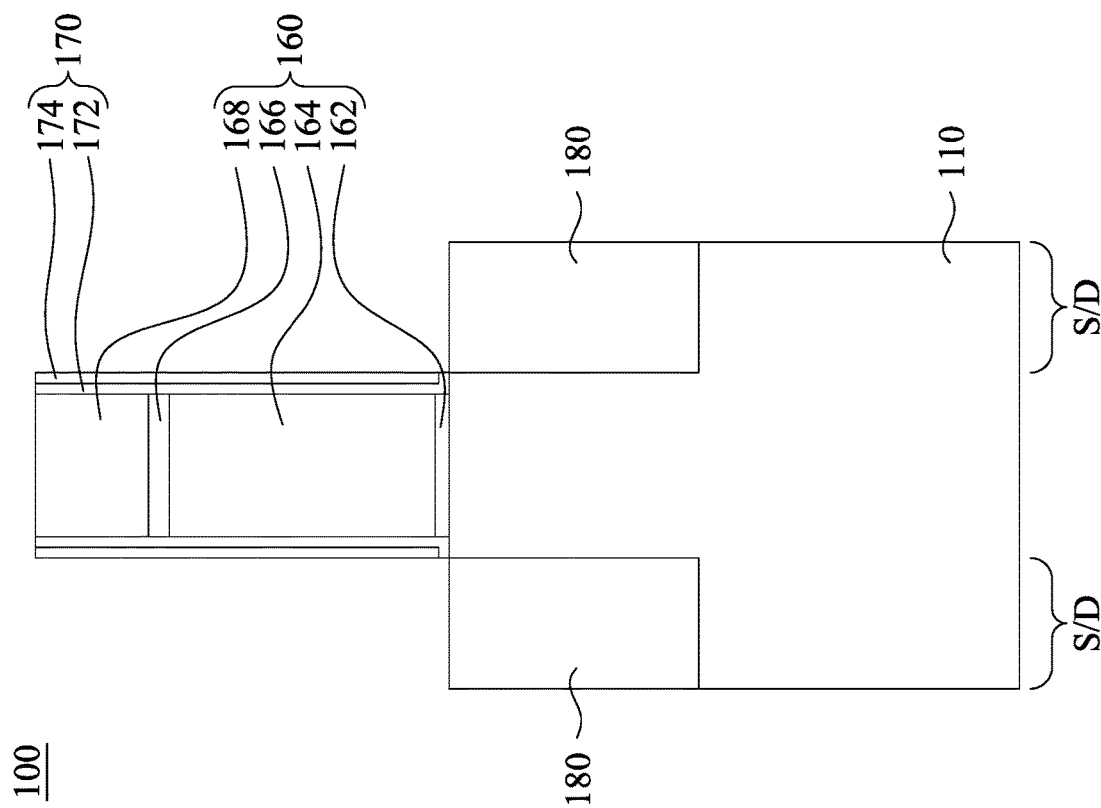

Reference is made to FIGS. 8A-8C. After formation of the gate spacers 170 is completed, source/drain epitaxial structures 180 are formed on source/drain regions of the semiconductor fins 112 that are not covered by the dummy gate structure 160 and the gate spacers 170. In some embodiments, formation of the source/drain epitaxial structures 180 includes recessing source/drain regions S/D of the semiconductor fins 112, followed by epitaxially growing semiconductor materials in the recessed source/drain regions of the semiconductor fins 112.

The source/drain regions S/D of the semiconductor fins 112 can be recessed using suitable selective etching processing that attacks the semiconductor fins 112, but barely attacks the gate spacers 170 and the top masks 168 of the dummy gate structure 160. For example, recessing the semiconductor fins 112 may be performed by a dry chemical etch with a plasma source and an etchant gas. The plasma source may be inductively coupled plasma (ICP) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fins 112 at a faster etch rate than it etches the gate spacers 170 and the top masks 168 of the dummy gate structure 160. In some other embodiments, recessing the semiconductor fins 112 may be performed by a wet chemical etch, such as ammonium peroxide mixture (APM), NH$_4$OH, tetramethylammonium hydroxide (TMAH), combinations thereof, or the like, which etches the semiconductor fins 112 at a faster etch rate than it etches the gate spacers 170 and the top masks 168 of the dummy gate structure 160. In some other embodiments, recessing the semiconductor fins 112 may be performed by a combination of a dry chemical etch and a wet chemical etch.

Once recesses are created in the source/drain regions S/D of the semiconductor fins 112, source/drain epitaxial structures 180 are formed in the source/drain recesses in the semiconductor fins 112 by using one or more epitaxy or epitaxial (epi) processes that provides one or more epitaxial materials on the semiconductor fins 112. During the epitaxial growth process, the gate spacers 170 limit the one or more epitaxial materials to source/drain regions in the semiconductor fins 112. In some embodiments, the lattice constants of the source/drain epitaxial structures 180 are different from the lattice constant of the semiconductor fins 112, so that the channel region in the semiconductor fins 112 and between the source/drain epitaxial structures 180 can be strained or stressed by the source/drain epitaxial structures 180 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 112.

In some embodiments, the source/drain epitaxial structures 180 may include Ge, Si, GaAs, AlGaAs, SiGe, GaAsP, SiP, or other suitable material. The source/drain epitaxial structures 180 may be in-situ doped during the epitaxial process by introducing doping species including: p-type dopants, such as boron or BF$_2$; n-type dopants, such as phosphorus or arsenic; and/or other suitable dopants including combinations thereof. If the source/drain epitaxial structures 180 are not in-situ doped, an implantation process (i.e., a junction implant process) is performed to dope the source/drain epitaxial structures 180. In some exemplary embodiments, the source/drain epitaxial structures 180 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed semiconductor fins 112 in the p-type device regions. The mask may then be removed. Subsequently, a mask, such as a photoresist, may be formed over the p-type device region while exposing the n-type device regions, and n-type epitaxial structures may be formed on the exposed semiconductor fins 112 in the n-type device region. The mask may then be removed.

Once the source/drain epitaxial structures 180 are formed, an annealing process can be performed to activate the p-type dopants or n-type dopants in the source/drain epitaxial structures 180. The annealing process may be, for example, a rapid thermal anneal (RTA), a laser anneal, a millisecond thermal annealing (MSA) process or the like.

Figure 9B:
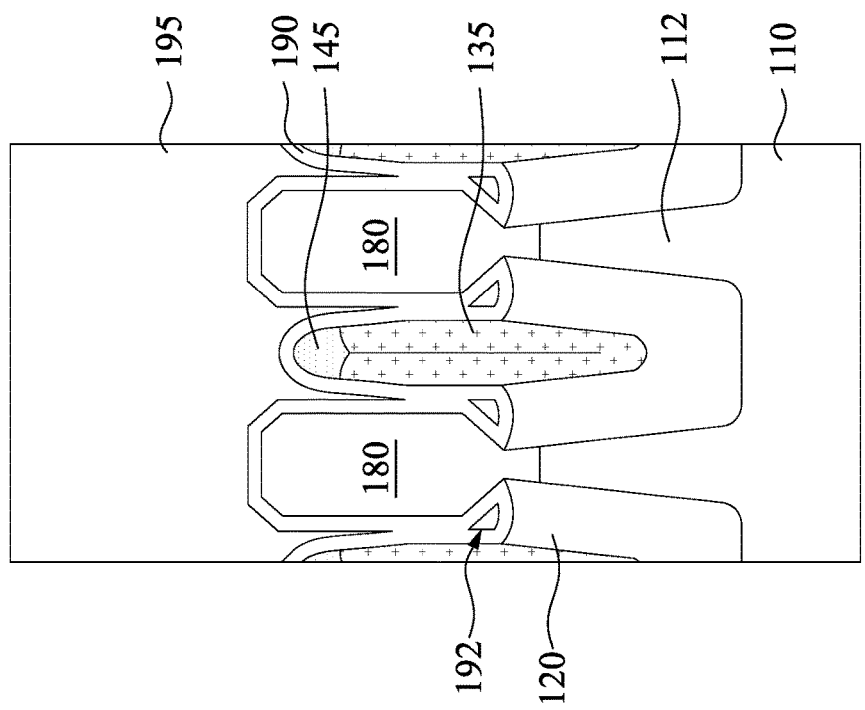
Figure 9A:
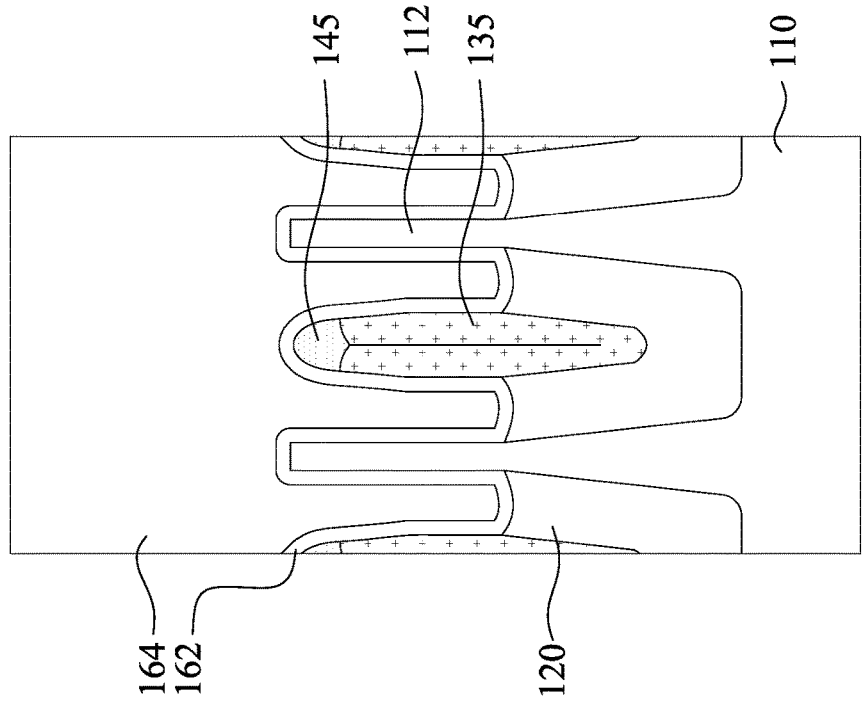

Reference is made to FIGS. 9A-9C. An interlayer dielectric (ILD) layer 195 is formed on the substrate 110. In some embodiments, a contact etch stop layer (CESL) 190 is also formed prior to forming the ILD layer 195. In some examples, the CESL 190 includes a silicon nitride layer, silicon oxide layer, a silicon oxynitride layer, and/or other suitable materials having a different etch selectivity than the ILD layer 195. The CESL 190 may be formed by plasma-enhanced chemical vapor deposition (PECVD) process and/or other suitable deposition or oxidation processes. In some embodiments, the ILD layer 195 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The ILD layer 195 may be deposited by a PECVD process or other suitable deposition technique. In some embodiments, after formation of the ILD layer 195, the wafer may be subject to a high thermal budget process to anneal the ILD layer 195. In some embodiments, at least one air gap 192 is defined by the CESL 190 and is formed under the source/drain epitaxial structures 180.

In some examples, after forming the ILD layer 195, a planarization process may be performed to remove excessive materials of the ILD layer 195. For example, a planarization process includes a chemical mechanical planarization (CMP) process which removes portions of the ILD layer 195 (and the CESL 190, if present) overlying the dummy gate structure 160. In some embodiments, the CMP process also removes the oxide mask layer 166 and the nitride mask layer 168 (as shown in FIG. 8A) and exposes the dummy gate electrodes 164.

Figure 10B:
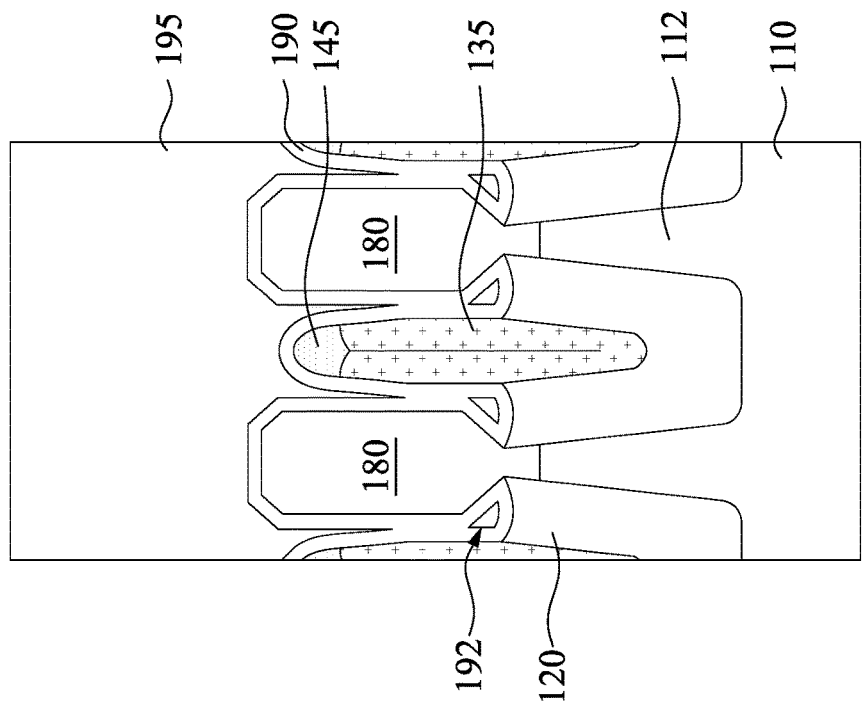
Figure 10A:
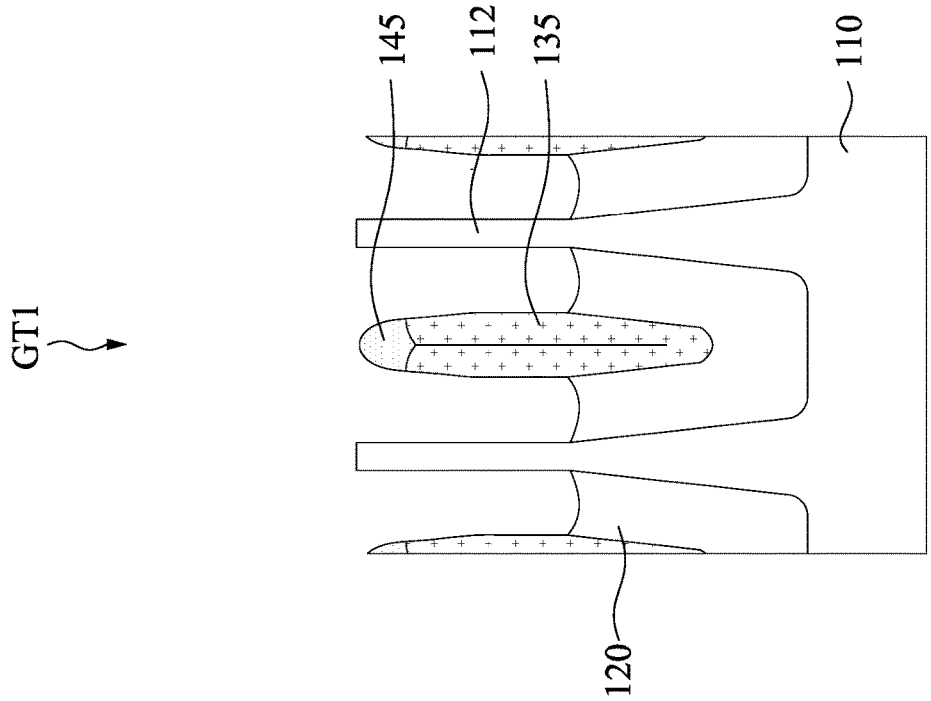
Figure 10C:
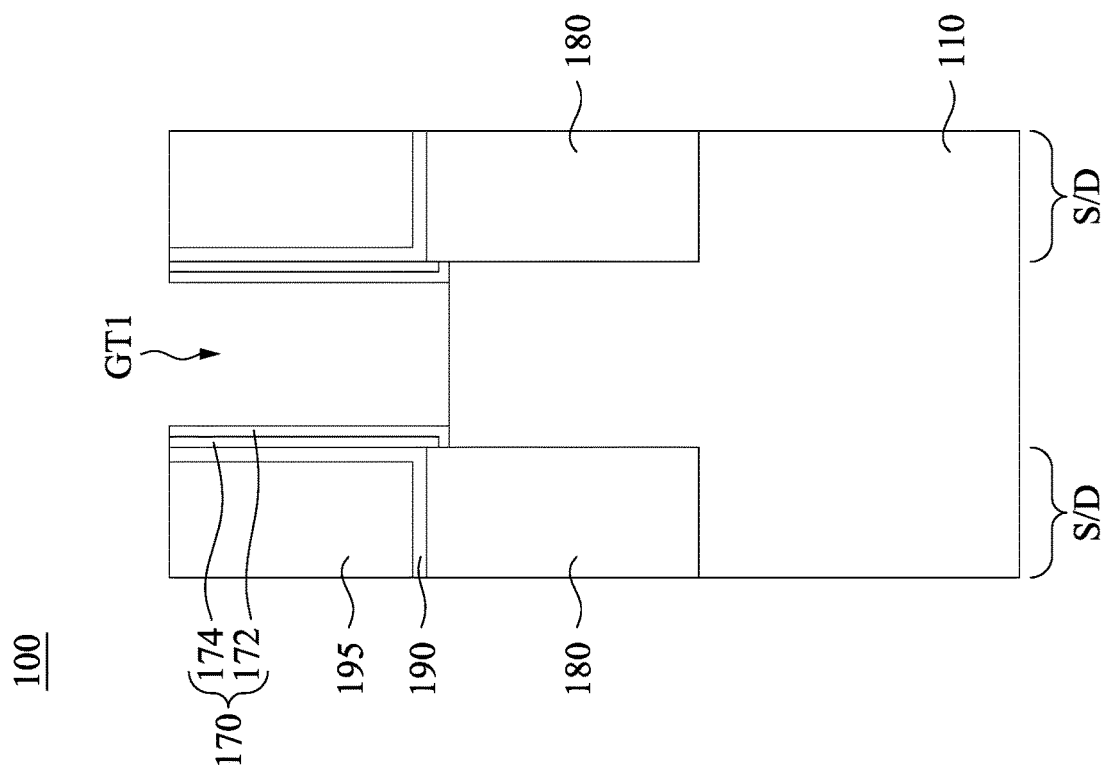

Reference is made to FIGS. 10A-10C. The dummy gate electrodes 164 and the dummy gate dielectric layer 162 (see FIG. 9A) are removed, resulting in a gate trench GT1 between the gate spacers 170. The dummy gate electrodes 164 and the dummy gate dielectric layer 162 are removed using a selective etching process (e.g., selective dry etching, selective wet etching, or combinations thereof) that etches materials in the dummy gate electrodes 164 at a faster etch rate than it etches other materials (e.g., the gate spacers 170, the CESL 190, and/or the ILD layer 195).

Figure 11B:
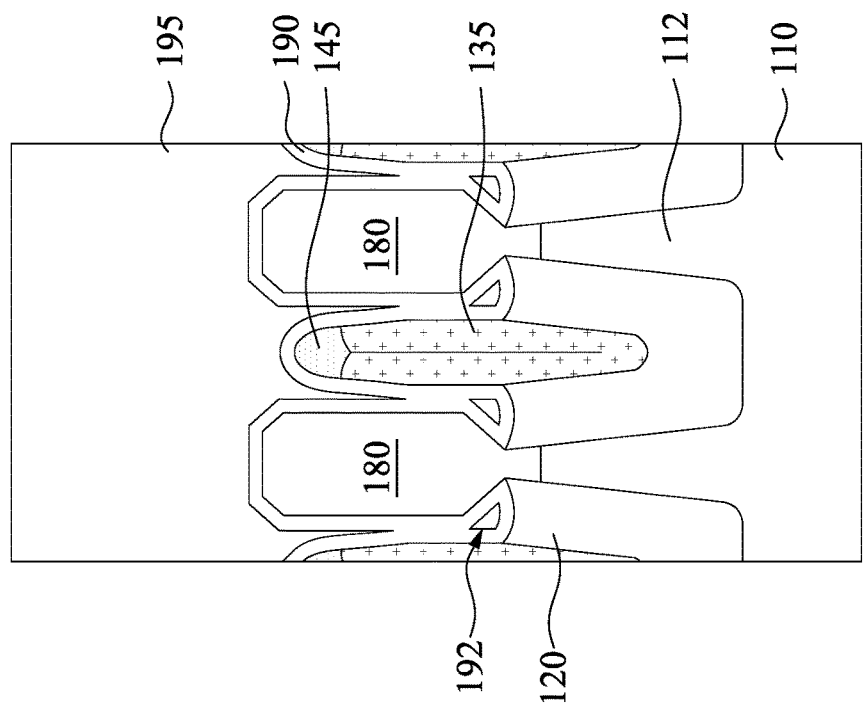
Figure 11A:
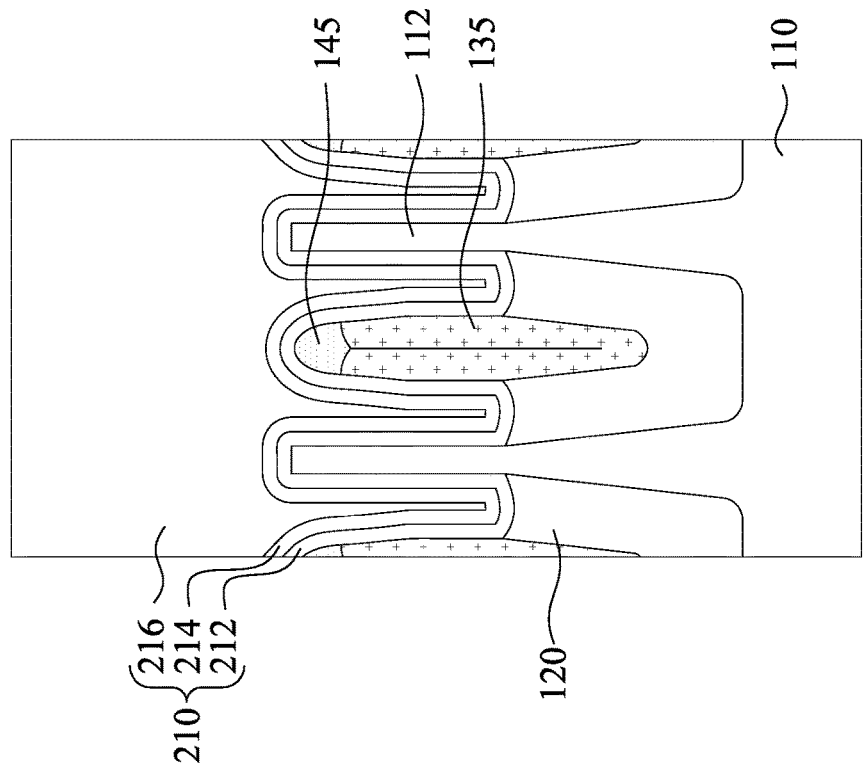
Figure 11C:
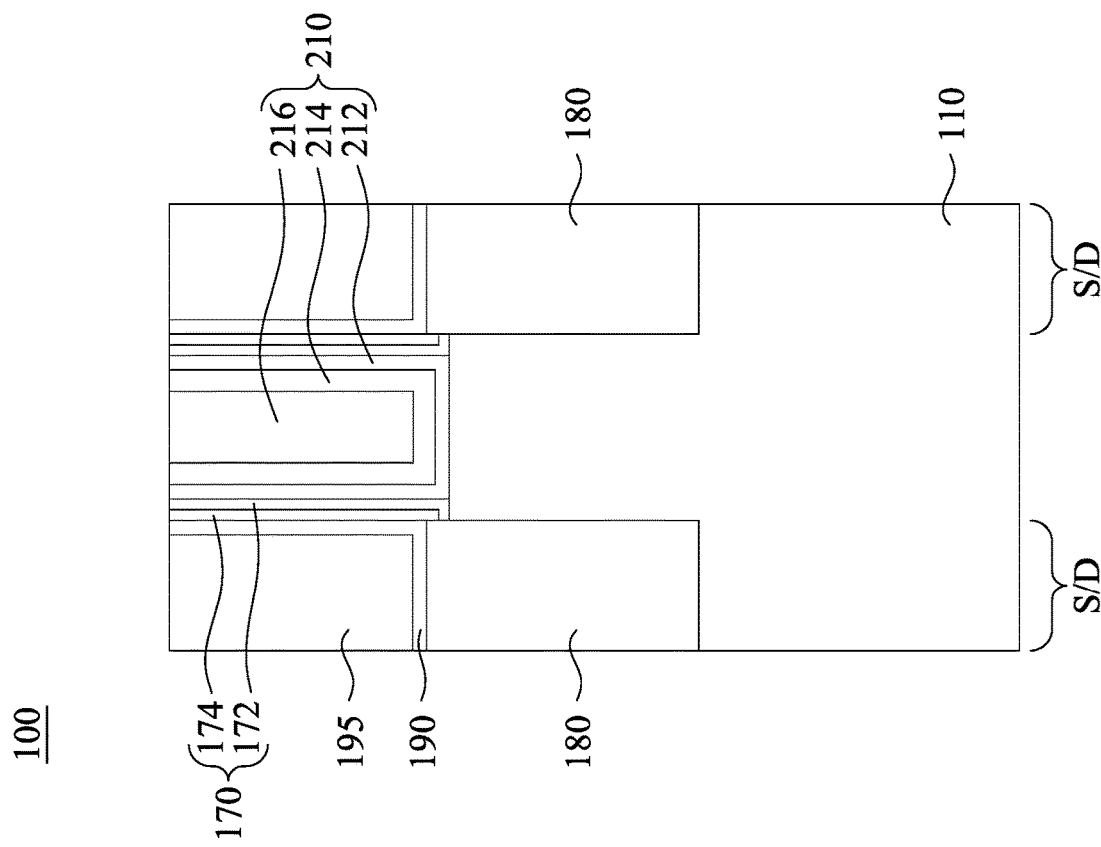

Reference is made to FIGS. 11A-11C. A replacement gate structure 210 is formed in the gate trench GT1. The gate structure 210 may be the final gates of FinFETs. As shown in FIG. 11A, since portions of the top dielectric fins 145 are removed during the etching process in FIG. 6, the gaps between the semiconductor fins 112 and the top dielectric fins 145 are enlarged, and the gate structure 210 can be easily deposited between the semiconductor fins 112 and the top dielectric fins 145. The final gate structure may be a high-k/metal gate stack, however other compositions are possible. In some embodiments, the gate structure 210 forms the gate associated with the three-sides of the channel region provided by the semiconductor fins 112. Stated another way, the gate structure 210 wraps around the semiconductor fins 112 on three sides. In various embodiments, the gate structure 210 includes a gate dielectric layer 212 lining the gate trench GT1, a work function metal layer 214 formed over the gate dielectric layer 212, and a fill metal 216 formed over the work function metal layer 214 and filling a remainder of the gate trench GT1. The gate dielectric layer 212 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 214 and/or fill metal 216 used within the gate structure 210 may include a metal, metal alloy, or metal silicide. Formation of the gate structure 210 may include multiple deposition processes to form various gate materials, one or more liner layers, and one or more CMP processes to remove excessive gate materials.

Figure 12B:
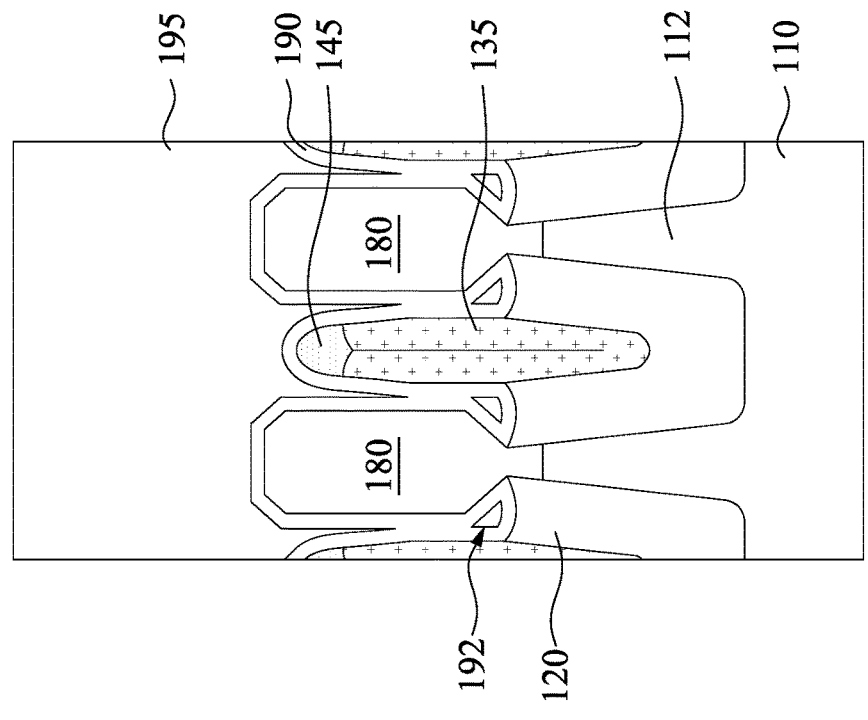
Figure 12A:
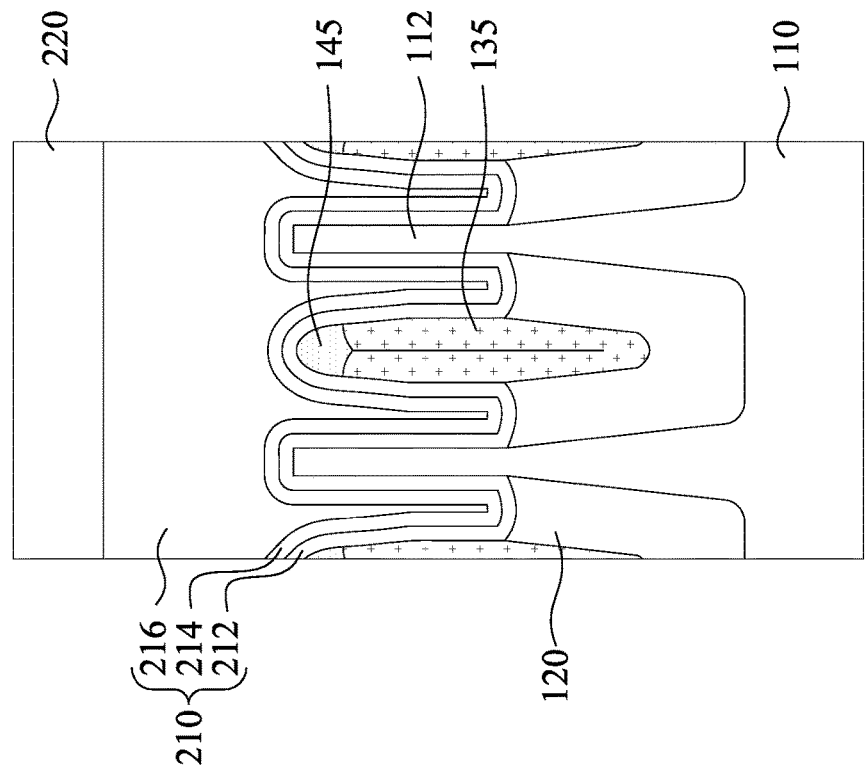
Figure 12C:
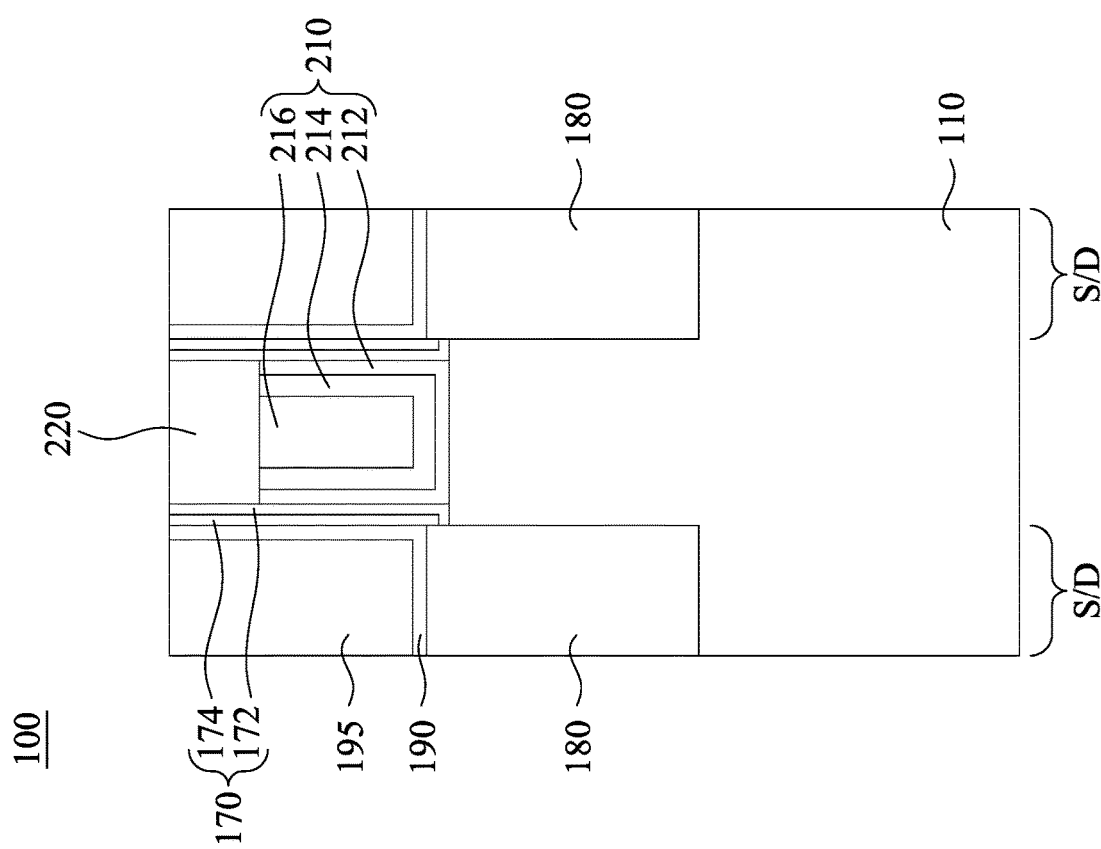

Reference is made to FIGS. 12A-12C. Optionally, an etching back process is performed to etch back the replacement gate structure 210, resulting in a recess over the etched-back gate structure 210. In some embodiments, because the materials of the replacement gate structure 210 have a different etch selectivity than the gate spacers 170, the top surfaces of the replacement gate structure 210 may be at a lower level than the top surfaces of the gate spacers 170.

A dielectric cap 220 is optionally formed over the etched-back gate structures 210. For example, a dielectric cap layer, including $SiN_x$, $Al_xO_y$, AlON, $SiO_xC_y$, $SiC_xN_y$, combinations thereof or the like, is formed by a suitable deposition technique such as CVD, plasma-enhanced CVD (PECVD), ALD, remote plasma ALD (RPALD), plasma-enhanced ALD (PEALD), combinations thereof or the like. A CMP process is then performed to remove the dielectric cap layer outside the recess, leaving portions of the dielectric cap layer in the recess to serve as the dielectric cap 220.

Figure 13B:
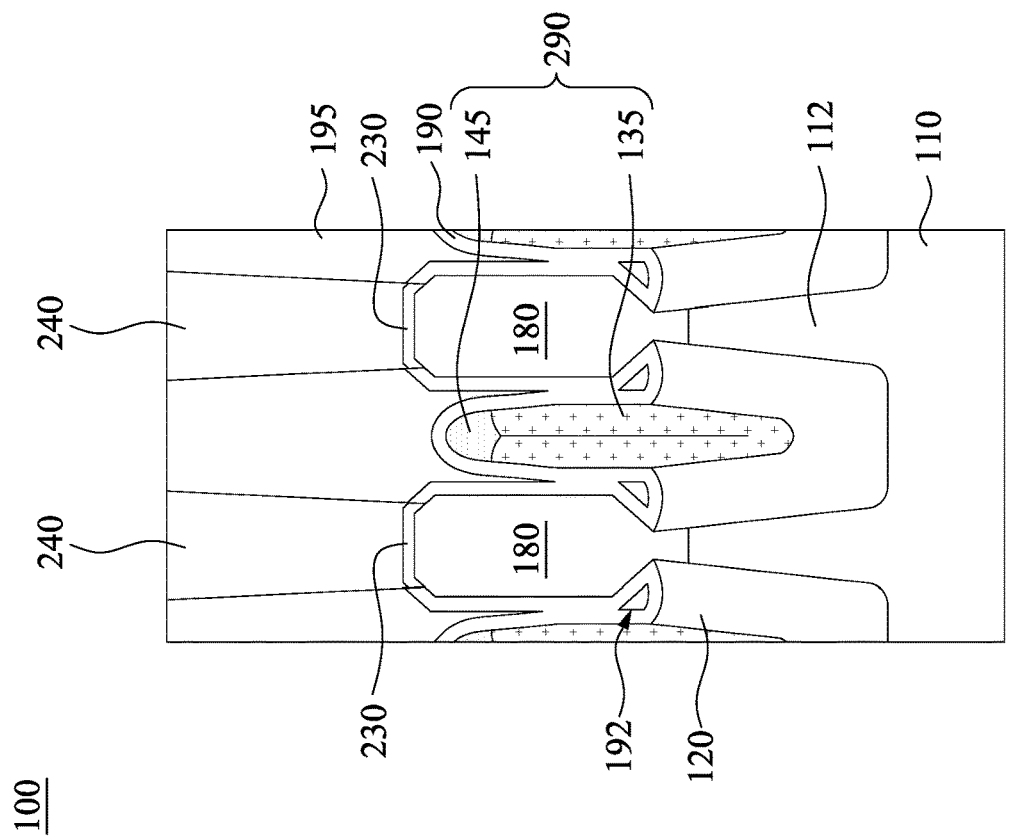
FIG. 13D is an enlarged view of area M in FIG. 13A.
Figure 13A:
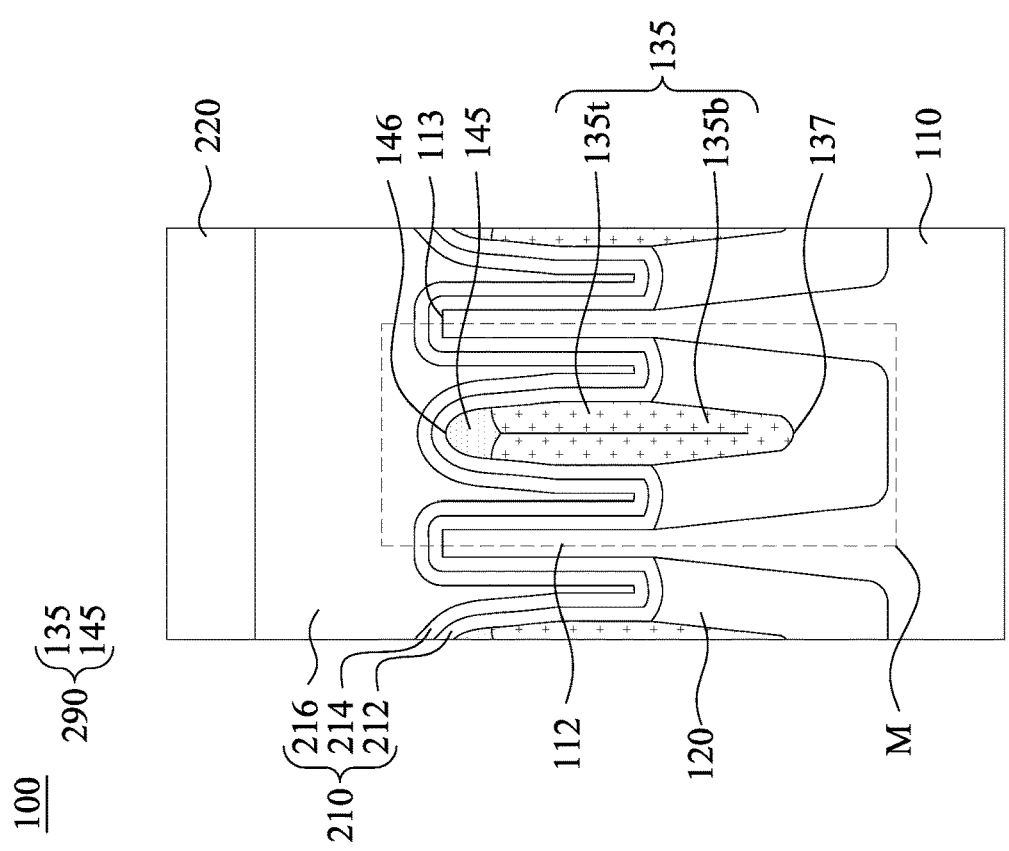
Figure 13D:
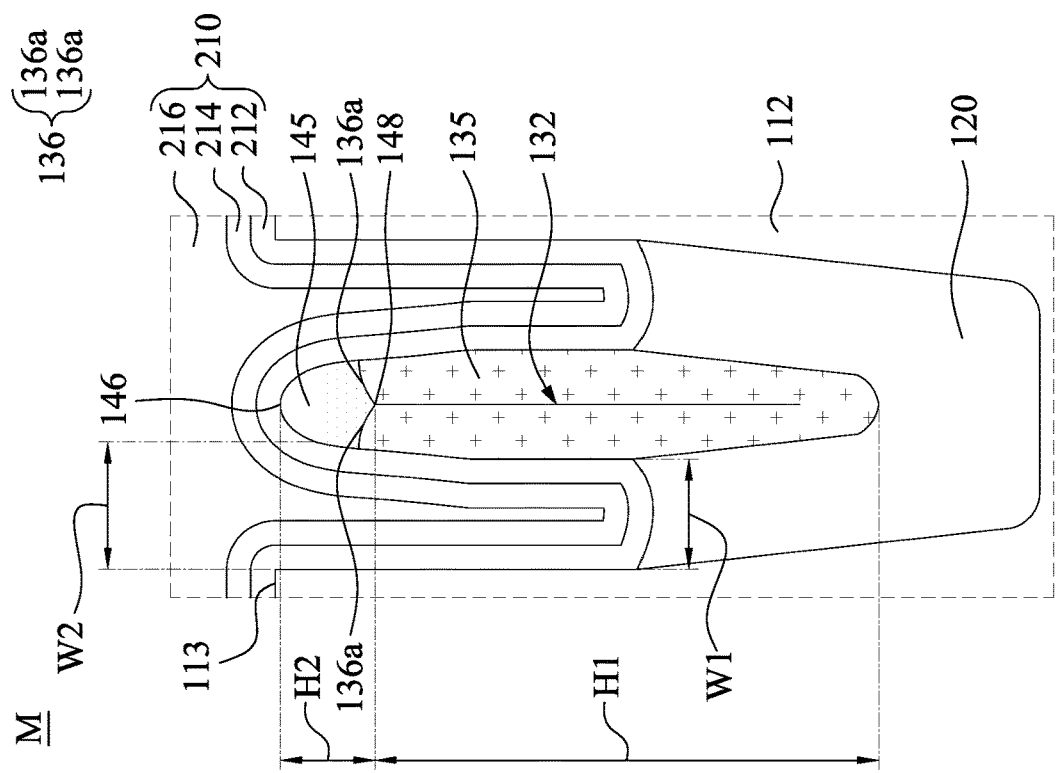
Figure 13C:
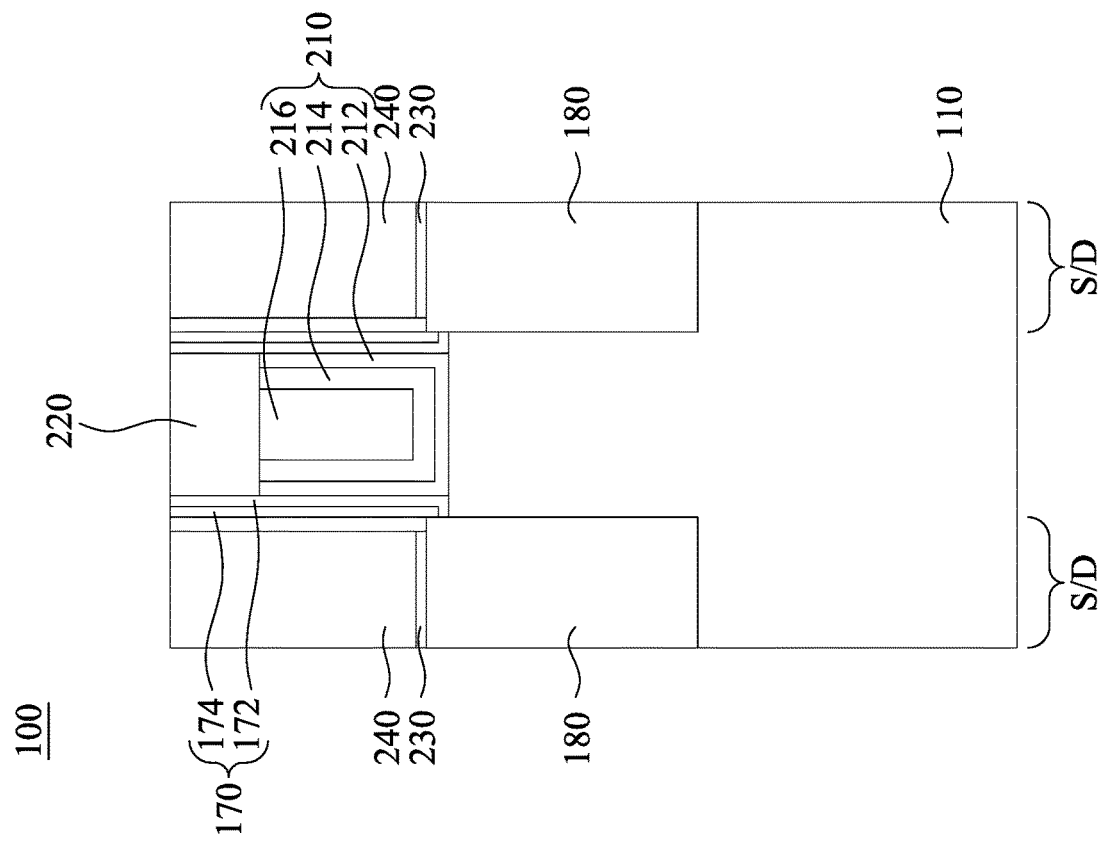

Reference is made to FIGS. 13A-13C. Source/drain contacts 240 are formed extending through the ILD layer 195 (and the CESL 190, if present). Formation of the source/drain contacts 240 includes, by way of example and not limitation, performing one or more etching processes to form contact openings extending though the ILD layer 195 to expose the source/drain epitaxial structures 180, depositing one or more metal materials overfilling the contact openings, and then performing a CMP process to remove excessive metal materials outside the contact openings. In some embodiments, the one or more etching processes are selective etching that etches the ILD layer 195 at a faster etch rate than etching the dielectric caps 220 and the gate spacers 170. As a result, the selective etching is performed using the dielectric caps 220 and the gate spacers 170 as an etch mask, such that the contact openings and hence the source/drain contacts 240 are formed self-aligned to the source/drain epitaxial structures 180 without using an additional photolithography process. In that case, the dielectric caps 220 allowing for forming the source/drain contacts 240 can be called SAC caps 220. In some embodiments, metal alloy layers 230 are formed over the source/drain epitaxial structures 180 prior to form the source/drain contacts 240. The metal alloy layers 230 may be silicide when the source/drain epitaxial structures 180 include silicon.

In FIG. 13A, the integrated circuit structure 100 includes the semiconductor fins 112, dielectric fin structures 290, isolation layers 120, and the gate structures 210. The semiconductor fins 112 extend from the substrate 110. The isolation layers 120 are over the substrate 110 and between the semiconductor fins 112. For example, the isolation layers 120 are in contact with the semiconductor fins 112. Each of the dielectric fin structures 290 are respectively protrude from the isolation layers 120 and includes the bottom dielectric fin 135 and the top dielectric fin 145. The carbon concentration of the bottom dielectric fin 135 is greater than the carbon concentration of the top dielectric fin 145. The bottom 135b of the bottom dielectric fin 135 is embedded in and in contact with the isolation layer 120, and the top 135t of the bottom dielectric fin 135 protrudes from the isolation layer 120. The isolation layer 120 surrounds the bottom 135b of the bottom dielectric fin 135. The top dielectric fin 145 is over the bottom dielectric fin 135 and is spaced apart from the isolation layer 120. The bottom 135b of the bottom dielectric fin 135 tapers downward, and the top 135t of the bottom dielectric fin 135 tapers upward. Stated another way, a sidewall of the top 135t of the bottom dielectric fin 135 and a sidewall of the bottom 135b of the bottom dielectric fin 135 are not parallel to each other. In FIG. 13B, the integrated circuit structure 100 further includes the source/drain epitaxial structures 180 connected to the semiconductor fins 112. The source/drain epitaxial structures 180 have sidewalls facing the dielectric fin structures 290, and the sidewalls of the source/drain epitaxial structures 180 are not parallel to the sidewalls of the top dielectric fin 145.

FIG. 13D is an enlarged view of area M in FIG. 13A. In FIGS. 13A and 13D, the bottom dielectric fin 135 has a seam 132 therein, and the top dielectric fin 145 covers the seam 132 of the bottom dielectric fin 135. The bottom dielectric fin 135 has a top surface 136 which includes two convex portions 136a on opposite sides of the seam 132 of the bottom dielectric fin 135. Stated another way, the top dielectric fin 145 has a bottom surface (corresponding to the top surface 136 of the bottom dielectric fin 135) includes a bottommost portion 148 and two concave portions (corresponding to the convex portions 136a of the bottom dielectric fin 135) on opposite sides of the bottommost portion 148. Further, the bottommost portion 148 is directly above the seam 132 of the bottom dielectric fin 135.

The top dielectric fin 145 has a top surface 146. In some embodiments, the top surface 146 is rounder than the top surface 113 of the semiconductor fin 112. Moreover, the top surface 146 of the top dielectric fin 145 is rounded than the convex portions 136a of the top surface 136 of the bottom dielectric fin 135 (corresponding to the concave portions of the bottom surface of the top dielectric fin 145). Further, the bottom surface 137 of the bottom dielectric fin 135 is rounded.

The top dielectric fin 145 has a height H2 shorter than about 30 nm, e.g., about 20 nm to about 30 nm. The bottom dielectric fin 135 has a height H1 in a range of about 80 nm to about 120 nm. In some embodiments, a ratio of the height H2 to the height H1 is in a range of about 1/10 to about 1/2.

The gate structure 210 is across the semiconductor fins 112 and the dielectric fin structures 290. As shown in FIG. 13D, a portion of the gate structure 210 in contact with the isolation layer 120 has a width W1, and another portion of the gate structure 210 in contact with the top dielectric fin 145 has a width W2 greater than the width W1. That is, the portion of the gate structure 210 between the semiconductor fin 112 and the dielectric fin structure 290 tapers downward (tapers toward the isolation layer 120).

Figure 14B:
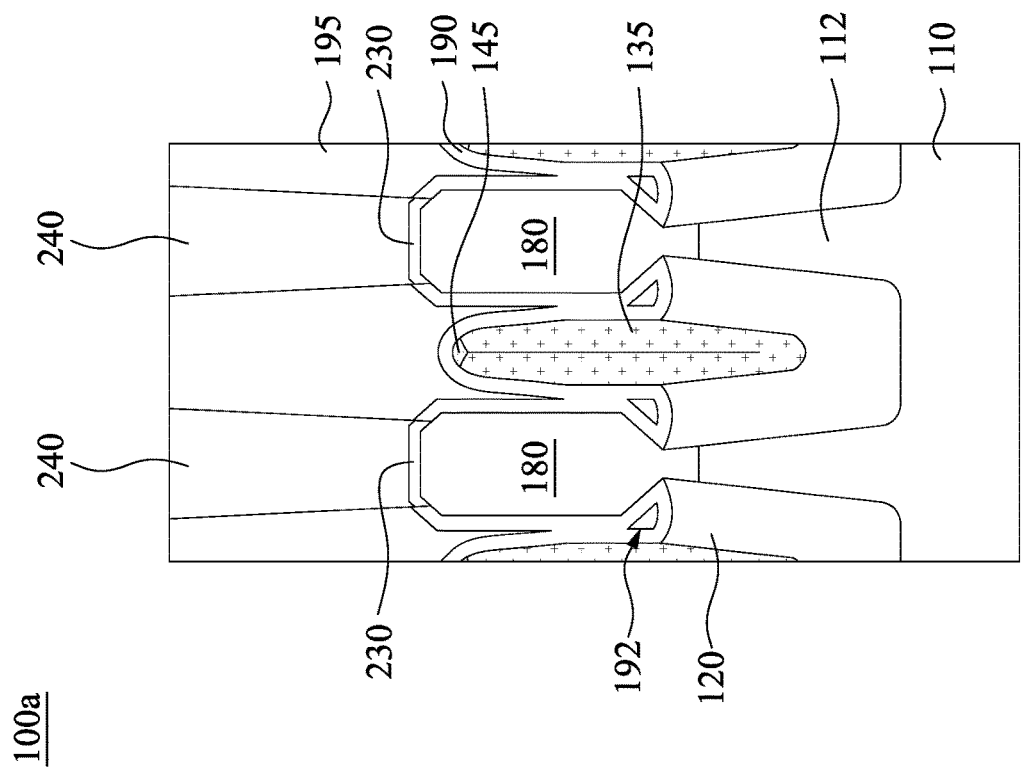
FIGS. 14A and 14B are cross-sectional views of an integrated circuit structure in accordance with some embodiments of the present disclosure.
Figure 14A:
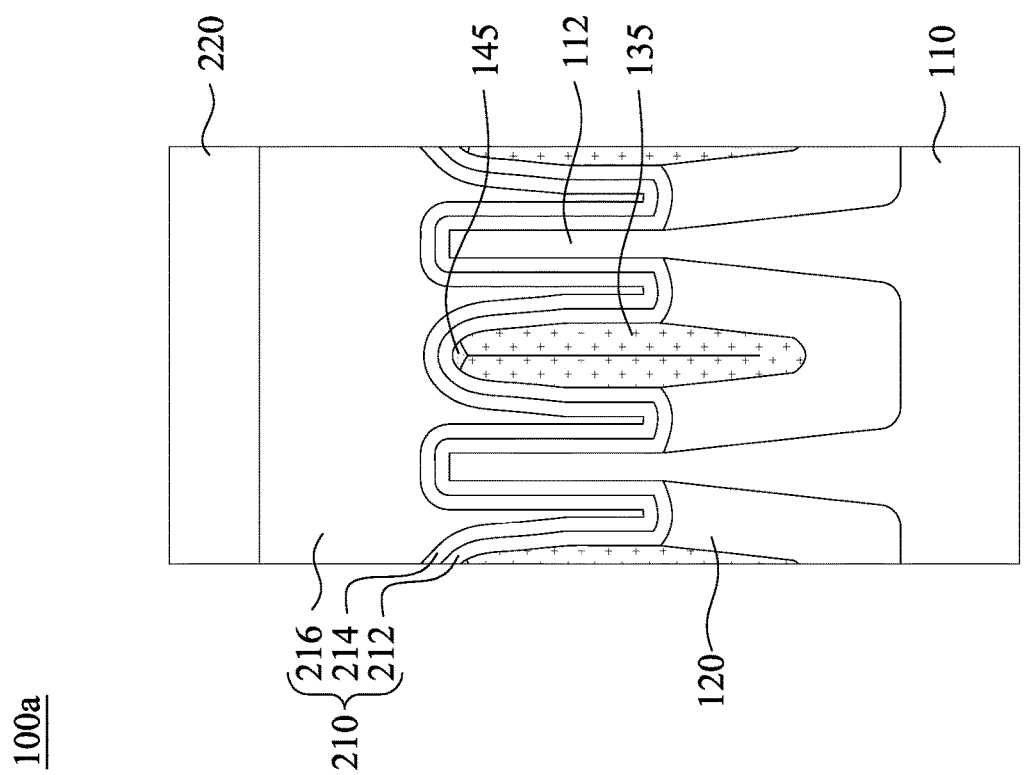

FIGS. 14A and 14B are cross-sectional views of an integrated circuit structure (or a semiconductor device) 100a in accordance with some embodiments of the present disclosure. The difference between the semiconductor device 100a in FIGS. 14A and 14B and the semiconductor device 100 in FIGS. 13A-13C is the height of the bottom dielectric fins 135 and the height of the top dielectric fins 145. Other relevant structural details of the semiconductor device 100a in FIGS. 14A and 14B are the same as or similar to the semiconductor device 100 in FIGS. 13A-13C, and, therefore, a description in this regard will not be repeated hereinafter.

FIGS. 15A and 15B are cross-sectional views of an integrated circuit structure (or a semiconductor device) 100b in accordance with some embodiments of the present disclosure. The difference between the semiconductor device 100a in FIGS. 15A and 15B and the semiconductor device 100 in FIGS. 13A-13C is the configuration of the semiconductor fins 112. In FIGS. 15A and 15B, the semiconductor fin 112 includes a top portion 112t and a bottom portion 112b. The bottom portion 112b extended from the substrate 110, and the top portion 112t is over the bottom portion 112b. The top portion 112t and the bottom portion 112b have different materials. For example, the top portion 112t is made of SiGe, and the bottom portion 112b is made of Si. Other relevant structural details of the semiconductor device 100b in FIGS. 15A and 15B are the same as or similar to the semiconductor device 100 in FIGS. 13A-13C, and, therefore, a description in this regard will not be repeated hereinafter.

Figure 16A:
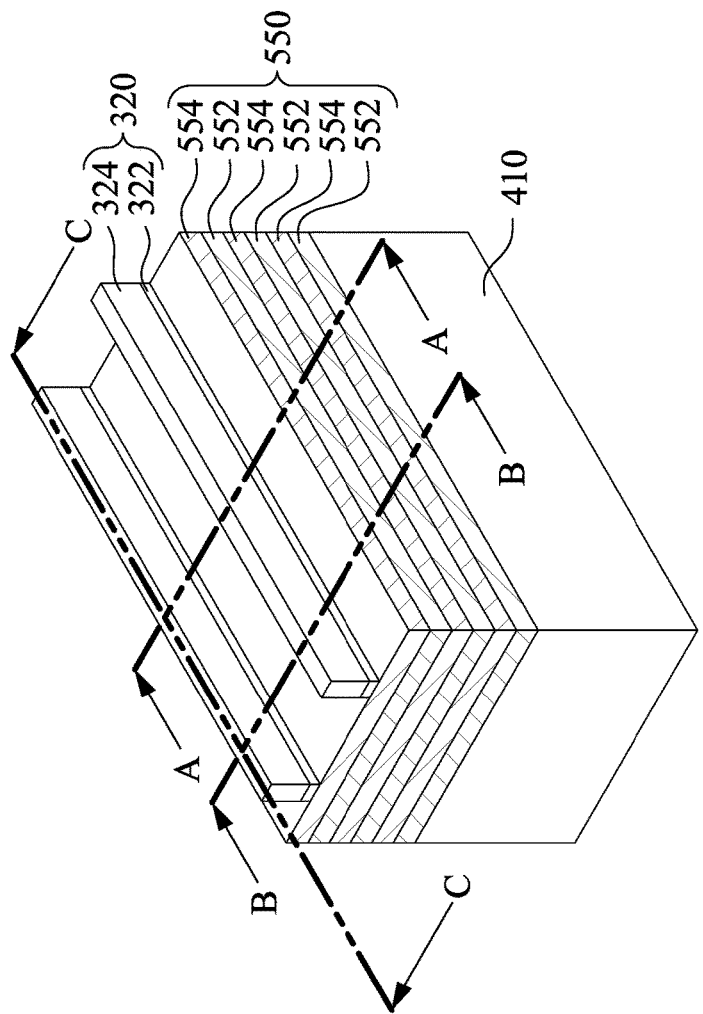

FIGS. 16A-29C illustrate perspective views and cross-sectional views of intermediate stages in the formation of an integrated circuit structure (or a semiconductor device) 400 in accordance with some embodiments of the present disclosure. In addition to the integrated circuit structure, FIG. 16A depicts X-axis, Y-axis, and Z-axis directions. The formed transistors (integrated circuit structure) may include a p-type transistor (such as a p-type GAA FET) and/or an n-type transistor (such as an n-type GAA FET) in accordance with some exemplary embodiments. Throughout the various views and illustrative embodiments, like reference numbers are used to designate like elements. It is understood that additional operations can be provided before, during, and after the processes shown by FIGS. 16A-29C, and some of the operations described below can be replaced or eliminated, for additional embodiments of the method. The order of the operations/processes may be interchangeable.

FIG. 16A is a perspective view of some embodiments of the integrated circuit structure 400 at intermediate stages in accordance with some embodiments of the present disclosure. FIGS. 16B, 17-22A, 23A, 24A, 25A, 26A, 27A, 28A, and 29A are cross-sectional views of some embodiments of the integrated circuit structure 400 at intermediate stages along a first cut (e.g., cut A-A in FIG. 16A). FIGS. 22B, 23B, 24B, 25B, 26B, 27B, 28B, and 29B are cross-sectional views of some embodiments of the integrated circuit structure 400 at intermediate stages along a second cut (e.g., cut B-B in FIG. 16A). FIGS. 22C, 23C, 24C, 25C, 26C, 27C, 28C, and 29C are cross-sectional views of some embodiments of the integrated circuit structure 400 at intermediate stages along a second cut (e.g., cut C-C in FIG. 16A).

Reference is made to FIGS. 16A and 16B. An epitaxial stack 550 is formed over a substrate 410. In some embodiments, the substrate 410 may include silicon (Si). Alternatively, the substrate 410 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or combinations thereof) or other appropriate semiconductor materials. In some embodiments, the substrate 410 may include a semiconductor-on-insulator (SOI) structure such as a buried dielectric layer. Also alternatively, the substrate 410 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 550 includes epitaxial layers 552 of a first composition interposed by epitaxial layers 554 of a second composition. The first and second compositions can be different. In some embodiments, the epitaxial layers 552 are SiGe and the epitaxial layers 554 are silicon (Si). However, other embodiments are possible including those that provide for a first composition and a second composition having different oxidation rates and/or etch selectivity. In some embodiments, the epitaxial layers 552 include SiGe and where the epitaxial layers 554 include Si, the Si oxidation rate of the epitaxial layers 554 is less than the SiGe oxidation rate of the epitaxial layers 552.

The epitaxial layers 554 or portions thereof may form nanostructure channel(s) of a nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry.

It is noted that three layers of the epitaxial layers 552 and three layers of the epitaxial layers 554 are alternately arranged as illustrated in FIG. 16A, which is for illustrative purposes only and not intended to be limiting beyond what is specifically recited in the claims. It can be appreciated that any number of epitaxial layers can be formed in the epitaxial stack 550; the number of layers depending on the desired number of channels regions for the transistor. In some embodiments, each of the numbers of the epitaxial layers 552 and 554 is between 2 and 10.

As described in more detail below, the epitaxial layers 554 may serve as channel region(s) for a subsequently-formed semiconductor device. The epitaxial layers 552 in channel regions(s) may eventually be removed and serve to define vertical distances between adjacent channel region(s) for a subsequently-formed multi-gate device and the thickness is chosen based on device performance considerations. Accordingly, the epitaxial layers 552 may also be referred to as sacrificial layers, and the epitaxial layers 554 may also be referred to as channel layers.

By way of example, epitaxial growth of the layers of the epitaxial stack 550 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 554 include the same material as the substrate 410. In some embodiments, the epitaxial layers 552 and 554 include a different material than the substrate 410. As stated above, in at least some examples, the epitaxial layers 552 include an epitaxially grown silicon germanium (SiGe) layer and the epitaxial layers 554 include an epitaxially grown silicon (Si) layer. Alternatively, in some embodiments, either of the epitaxial layers 552 and 554 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 552 and 554 may be chosen based on providing differing oxidation and/or etching selectivity properties. In some embodiments, the epitaxial layers 552 and 554 are substantially dopant-free (i.e., having an extrinsic dopant concentration from about 0 $cm^{-3}$ to about $1 \times 10^{18}$ $cm^{-3}$), where for example, no intentional doping is performed during the epitaxial growth process.

Mask patterns 320 are formed over the epitaxial stack 550. Each of the mask patterns 320 includes a mask layer 324 and a pad layer 322 between the mask layer 324 and the substrate 410. In some embodiments, the mask layer 324 is a nitride layer, and the pad layer 322 is an oxide layer.

Reference is made to FIG. 17. The epitaxial stack 550 (see FIG. 16B) is patterned by using the patterned mask layer 320 as an etch mask, such that the epitaxial stack 550 is patterned into fin structures 505 and trenches 402 extending in the Y direction. In FIG. 17, two fin structures 505 are arranged in the X direction. But the number of the fin structures is not limited to, and may be as small as one and three or more. In some embodiments, one or more dummy fin structures are formed on both sides of the fin structures 505 to improve pattern fidelity in the patterning operations.

The trenches 402 extend into the substrate 410, and have lengthwise directions substantially parallel to each other. The trenches 402 form base portions 412 in the substrate 410, where the base portions 412 protrude from the substrate 410, and the fin structures 505 are respectively formed above the base portions 412 of the substrate 410. The remaining portions of the epitaxial stack 550 are accordingly referred to as the fin structures 505 alternatively.

Figure 18:
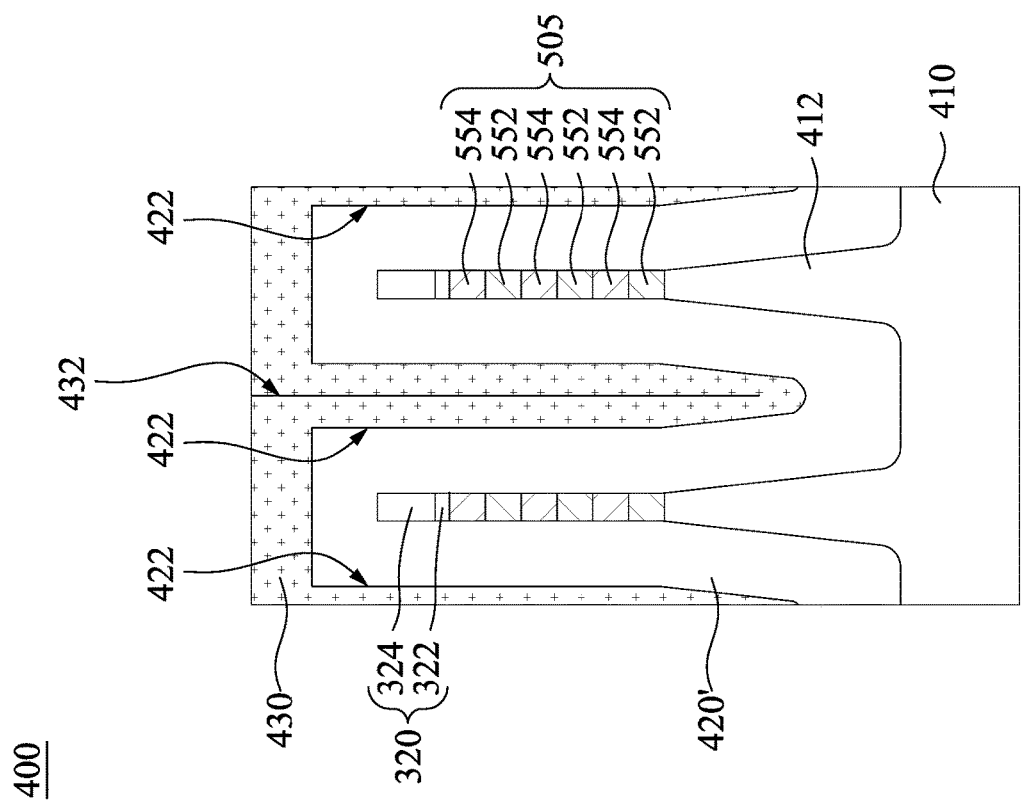

Reference is made to FIG. 18. An isolation layer 420' is formed over the substrate 410 and in the trenches 402. In some embodiments, the isolation layer 420' is formed to conformally cover the fin structures 505 by suitable deposition process, such as atomic layer deposition (ALD). Thus, plural trenches 422 are formed in the isolation layer 420' and between the fin structures 505. In some embodiments, the isolation layer 420' includes oxide, e.g., a silicon dioxide.

Subsequently, a first dielectric fin layer 430 is formed over the substrate 410 and covers the isolation layer 420'. The first dielectric fin layer 430 is filled in the trenches 422 in the isolation layer 420. In some embodiments, the trenches 422 may be filled by suitable processes such as, for example, ALD, CVD, FCVD, PVD, MBE, HDPCVD, MOCVD, RPCVD, PECVD, other suitable methods, and/or combinations thereof. In some embodiments, filling of the recesses 422 may be performed by an ALD process such that a seam 432 may be formed in the first dielectric fin layer 430. In some embodiments, the first dielectric fin layer 430 includes silicon carbon nitride (SiCN), silicon oxygen carbon nitride (SiOCN), or other carbon-containing materials.

The first dielectric fin layer 430 is formed using a deposition technique that can form conformal dielectric layers, such as thermal atomic layer deposition (ALD), plasma-enhanced (PE) ALD, pulsed PEALD, or atomic layer chemical vapor deposition (AL-CVD). ALD is an approach to filling dielectrics that involves depositing a monolayer of precursor over the substrate 410, purging the chamber, and introducing a reactant that reacts with the precursor to leave a monolayer of product. The cycle can be repeated many times to build a layer with a sufficient thickness to be functional. In some embodiments, the first dielectric fin layer 430 is formed by performing m cycles of the first deposition process to achieve a desired thickness, where m is equal to or greater than 1.

During the deposition processes, the structure is positioned on a chuck in a deposition process chamber. A vacuum is then applied to the deposition process chamber to remove oxygen and moisture and the temperature is raised to an acceptable level that is suitable for the deposition. Precursors are then fed into the deposition process chamber. The precursors may be silicon-containing precursors such as dichlorosilane (DCS), $SiH_4$, or other suitable materials.

In some embodiments, process gases are fed into the ALD process chamber. The process gas can be a nitride-containing gas, such as $NH_3$, $N_2/H_2$, or other suitable gases. Hence, the first dielectric fin layer 430 further includes nitride, and is a nitride-containing dielectric layer. In some other embodiments, the nitride-containing gas and oxygen-containing gas, such as $O_2$, $H_2O$, and/or other suitable gases, are sequentially fed into the ALD process chamber to modulate the N/O ratio of the first dielectric fin layer 430. In some embodiments, the ALD processes can be plasma-enhanced ALD processes. That is, the ALD processes include plasma treatments.

In embodiments where the precursors do not contain carbon, some other carbon-containing materials (such as carbon sources or organic hydrocarbons) may be provided. Carbon addition results in a layer with more resistance to wet etching process, such that increases the wet etch selectivity. In some embodiments, the carbon-containing materials may be chain-type hydrocarbon, written as CxHy, 2>X>4 and including at least one C=C bond. The carbons of C=C bond can be bond to Si or other elements of the first dielectric fin layer 430. The above mentioned processes (the precursor feeding process, the process gas feeding process, the plasma treatments, and/or the carbon addition process) are separated by individual purge periods. In some embodiments, a carbon concentration of the first dielectric fin layer 130 is greater than about 10%, such as about 10% to about 20%.

Figure 19:
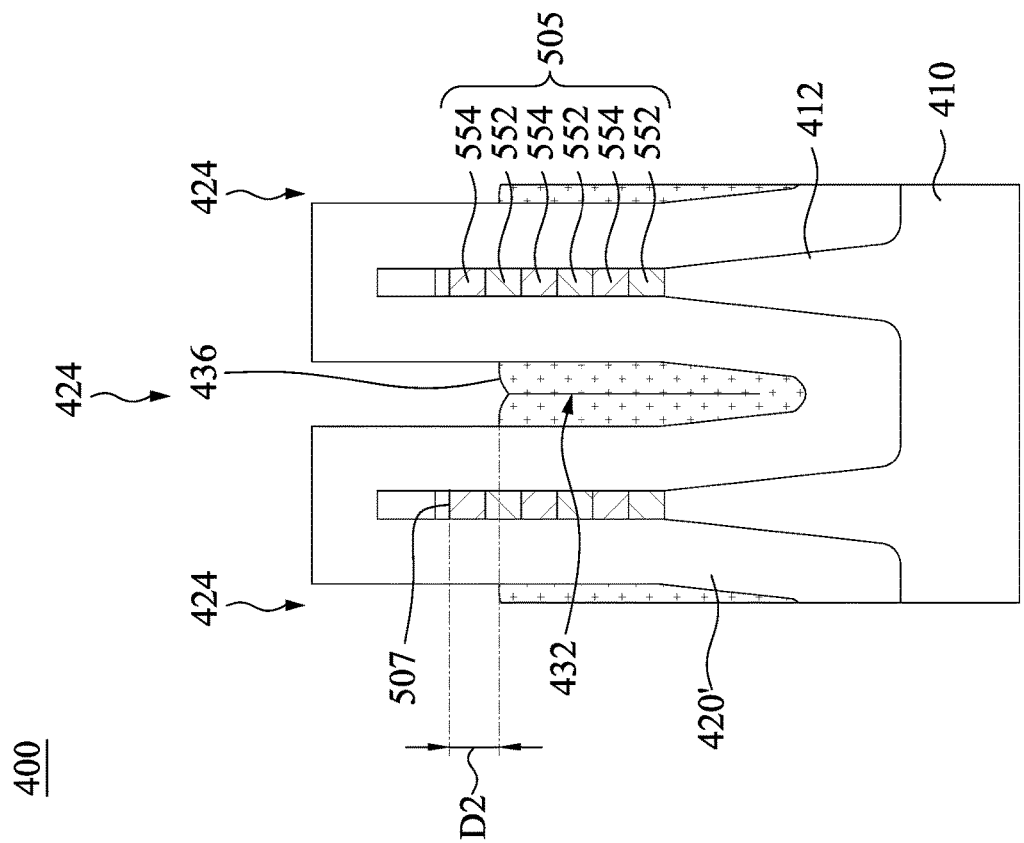

Reference is made to FIG. 19. One or more etching process(es) are performed to remove excess first dielectric fin layer 430 to form bottom dielectric fins 435 and recesses 424 thereon. As such, top surfaces 436 of the bottom dielectric fins 435 are lower than top surfaces 507 of the fin structures 505 by a distance D2. In some embodiments, the distance D2 is less than about 30 nm, e.g., in a range of about 20 nm to about 30 nm. In some embodiments, if the top surface 436 is higher than the top surface 507, the following formed second dielectric fin layer 440 will be totally removed during the planarization process (see FIG. 21); if the distance D2 is greater than about 30 nm, the following formed top dielectric fins 445 (see FIG. 21) may be removed too much during the etching process shown in FIG. 21.

In some embodiments, since the first dielectric fin layer 430 has the seam 432 therein, etching gas of the etching process may enter the seam 432. As such, portions of the first dielectric fin layer 430 near the seam 432 may be etched at a faster rate than other portions of the first dielectric fin layer 430, and the top surface 436 of the bottom dielectric fins 435 has convex portions on opposite sides of the seam 432.

In some embodiments, the etching process is performed by using a gaseous mixture of a fluorine containing gas, such as $C_4F_8$, $C_5F_8$, $C_4F_6$, $CHF_3$ or similar species, an inert gas, such as argon or helium, an optional weak oxidant, such as $O_2$ or CO or similar species, for a duration time sufficient to etch first dielectric fin layer 430 to form the bottom dielectric fins 435. The etching environment has a temperature between about 600° C. and about 700° C.

Figure 20:
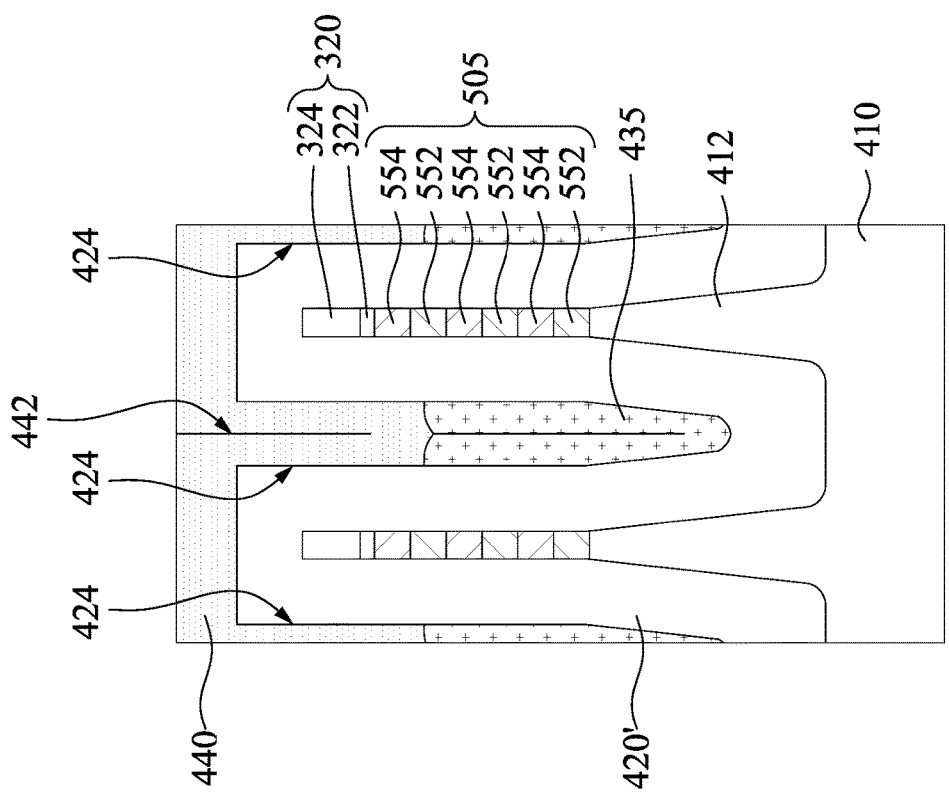

Reference is made to FIG. 20. A second dielectric fin layer 440 is formed over the substrate 410 and covers the isolation layer 420' and the bottom dielectric fins 435. The second dielectric fin layer 440 is filled in the recesses 424 in the isolation layer 420'. In some embodiments, the recesses 424 may be filled by suitable processes such as, for example, ALD, CVD, FCVD, PVD, MBE, HDPCVD, MOCVD, RPCVD, PECVD, other suitable methods, and/or combinations thereof. In some embodiments, filling of the trenches 424 may be performed by an ALD process such that another seam 442 may be formed in the second dielectric fin layer 440. In some embodiments, the second dielectric fin layer 140 includes silicon nitride ($SiN_x$), silicon oxynitride (SiON), silicon carbon nitride (SiCN), silicon oxygen carbon nitride (SiOCN).

During the deposition processes, the structure of FIG. 19 is positioned on a chuck in a deposition process chamber. A vacuum is then applied to the deposition process chamber to remove oxygen and moisture and the temperature is raised to an acceptable level that is suitable for the deposition. Precursors are then fed into the deposition process chamber. The precursors may be silicon-containing precursors such as dichlorosilane (DCS), $SiH_4$, or other suitable materials.

In some embodiments, process gases are fed into the ALD process chamber. The process gas can be a nitride-containing gas, such as $NH_3$, $N_2/H_2$, or other suitable gases. Hence, the second dielectric fin layer 440 further includes nitride, and is a nitride-containing dielectric layer. In some other embodiments, the nitride-containing gas and oxygen-containing gas, such as $O_2$, $H_2O$, or other suitable gases, are sequentially fed into the ALD process chamber to modulate the N/O ratio of the second dielectric fin layer 440. In some embodiments, the ALD processes can be plasma-enhanced ALD processes. That is, the ALD processes include plasma treatments.

In embodiments where the precursors do not contain carbon, some other carbon-containing materials (such as carbon sources or organic hydrocarbons) may be provided. Carbon addition results in a layer with more resistance to wet etching process, such that increases the wet etch selectivity. In some embodiments, the carbon-containing materials may be chain-type hydrocarbon, written as CxHy, 2>X>4 and including at least one C=C bond. The carbons of C=C bond can be bond to Si or other elements of the second dielectric fin layer 440. The above mentioned processes (the precursor feeding process, the process gas feeding process, the plasma treatments, and/or the carbon addition process) are separated by individual purge periods. In some embodiments, a carbon concentration of the second dielectric fin layer 440 is in a range of about 0% to about 10%. The carbon addition process can be omitted when the second dielectric fin layer 440 is free from carbon. That is, the carbon concentration of the second dielectric fin layer 140 is lower than the carbon concentration of the first dielectric fin layer 130. With such configuration, the first dielectric fin layer 130 and the second dielectric fin layer 140 have a slightly etching selectivity.

Figure 21:
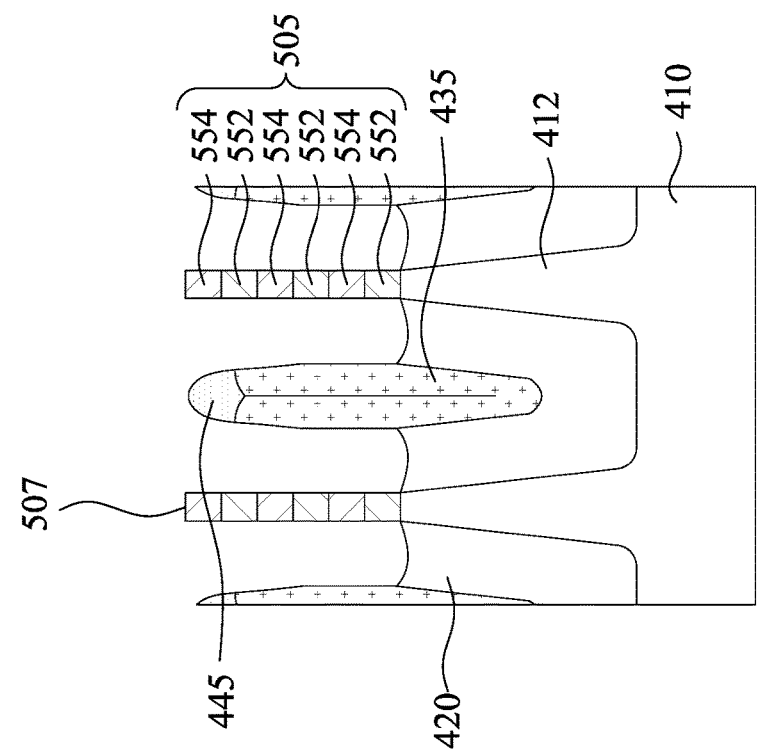

Reference is made to FIG. 21. One or more planarization process(es) and/or etching process(es) are performed to remove excess second dielectric fin layer 440 to form top dielectric fins 445 respectively over the bottom dielectric fins 435. For example, a planarization process is performed to remove portions of the second dielectric fin layer 440, the isolation layer 420, and the mask layers 320 until the top surfaces 507 of the fin structures 505 are exposed.

Subsequently, the isolation layer 420' (see FIG. 20) is then etched back such that the top dielectric fins 445, portions of the fin structures 505 and portions of the bottom dielectric fins 435 protrude from the remaining portions of the isolation layer 420'. The remaining portions of isolation layer 420' form isolation structures 420. The isolation structures 420 can be achieved by suitable methods such as, for example, an etching process that has suitable etch selectivity between materials of the isolation layer 420', the fin structures 505, the top dielectric fins 445, and the bottom dielectric fins 435. In some embodiments, the etching process is performed by using an etchant including $HF/NH_3$.

The etching process can have a higher etch rate of the isolation layer 420' than the etch rate of the fin structures 505, the top dielectric fins 445, and the bottom dielectric fins 435. Further, the etching process has a slightly etch selectivity between materials of the top dielectric fins 445 and the bottom dielectric fins 135. That is, the etching process etches the top dielectric fins 445 at an etching rate faster than that etches the bottom dielectric fins 435. For example, the etching process etches the top dielectric fins 445 faster than that etches the bottom dielectric fins 435 by more than about 3 times to about 5 times. Stated another way, the etching process etches the isolation layer 420' at a first etching rate, etches the first dielectric fin layer 430 at a second etching rate, and etches the second dielectric fin layer 440 at a third etching rate. The first etching rate is higher than the third etching rate, and the third etching rate is higher than the second etching rate. As such, top surfaces of the top dielectric fins 445 are slightly etched and are rounded. Comparing with the top dielectric fins 445, the bottom dielectric fins 435 are not or barely etched during the etching process.

Figure 22C:
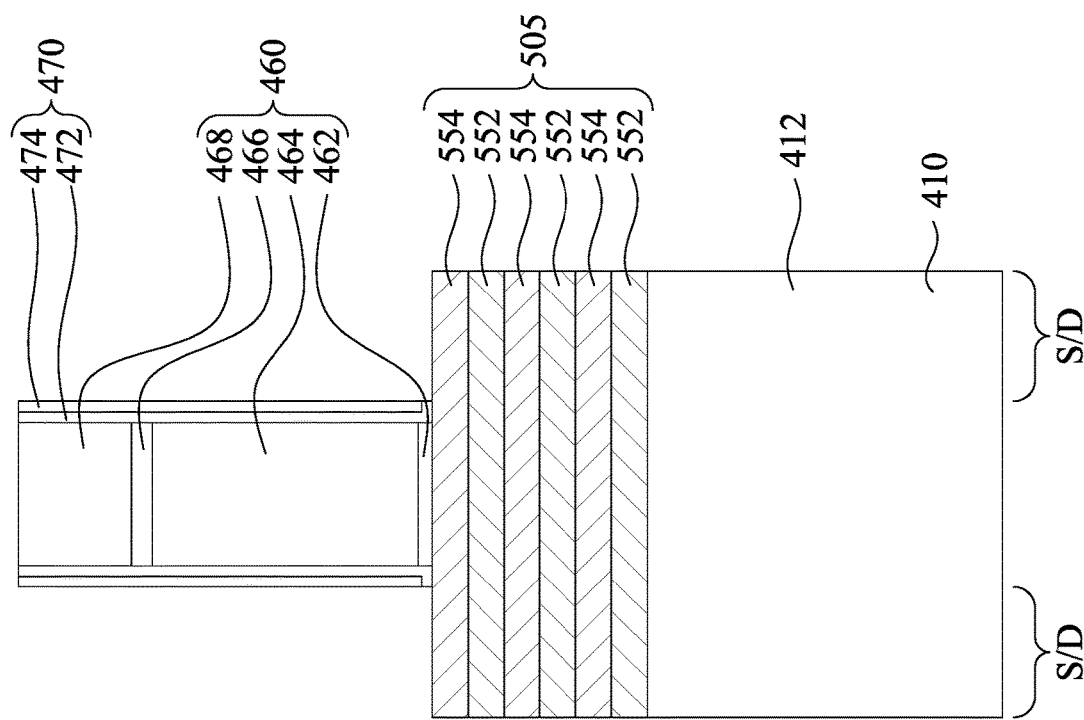

Reference is made to FIGS. 22A-22C. At least one dummy gate structure 460 is formed over the substrate 410 and are at least partially disposed over the fin structures 505. The portions of the fin structures 505 underlying the dummy gate structure 460 may be referred to as the channel regions. The dummy gate structure 460 may also define source/drain (S/D) regions of the fin structures 505, for example, the regions of the fin structures 505 adjacent and on opposing sides of the channel regions. As shown in FIG. 22A, since portions of the top dielectric fins 445 are removed during the etching process in FIG. 21, the gaps between the fin structures 505 and the top dielectric fins 445 are enlarged, and the dummy gate structure 460 can be easily deposited between the fin structures 505 and the top dielectric fins 445.

Dummy gate formation operation first forms a dummy gate dielectric layer 462 over the fin structures 505. Subsequently, a dummy gate electrode layer 464 and a hard mask which may include multiple layers 466 and 468 (e.g., an oxide layer 466 and a nitride layer 468) are formed over the dummy gate dielectric layer 462. The hard mask is then patterned, followed by patterning the dummy gate electrode layer 462 by using the patterned hard mask as an etch mask. In some embodiments, after patterning the dummy gate electrode layer 464, the dummy gate dielectric layer 462 is removed from the S/D regions of the fin structures 505. The etching process may include a wet etch, a dry etch, and/or combinations thereof. The etching process is chosen to selectively etch the dummy gate dielectric layer 462 without substantially etching the fin structures 505, the dummy gate electrode layer 464, the oxide mask layer 466 and the nitride mask layer 468.

After formation of the dummy gate structure 460 is completed, gate spacers 470 formed on sidewalls of the dummy gate structure 460. In some embodiments of the gate spacer formation operations, a spacer material layer is deposited on the substrate 410. The spacer material layer may be a conformal layer that is subsequently etched back to form gate spacers 470. In some embodiments, the spacer material layer includes multiple layers, such as a first spacer layer 472 and a second spacer layer 474 formed over the first spacer layer 472. The first and second spacer layers 472 and 474 each are made of a suitable material such as silicon oxide, silicon nitride, silicon carbide, silicon oxynitride, SiCN, silicon oxycarbide, SiOCN, and/or combinations thereof. By way of example and not limitation, the first and second spacer layers 472 and 474 may be formed by depositing in sequence two different dielectric materials over the dummy gate structure 460 using processes such as, CVD process, a subatmospheric CVD (SACVD) process, a flowable CVD process, an ALD process, a PVD process, or other suitable process. An anisotropic etching process is then performed on the deposited spacer layers 472 and 474 to expose portions of the fin structures 505 not covered by the dummy gate structure 460 (e.g., in source/drain regions of the fin structures 505). Portions of the spacer layers 472 and 474 directly above the dummy gate structure 460 may be removed by this anisotropic etching process. Portions of the spacer layer 472 and 474 on sidewalls of the dummy gate structure 460 may remain, forming gate sidewall spacers, which are denoted as the gate spacers 470, for the sake of simplicity. In some embodiments, the first spacer layer 472 is formed of silicon oxide that has a lower dielectric constant than silicon nitride, and the second spacer layer 474 is formed of silicon nitride that has a higher etch resistance against subsequent etching processing (e.g., etching source/drain recesses in the fin structures 505) than silicon oxide. In some embodiments, the gate spacers 470 may be used to offset subsequently formed doped regions, such as source/drain regions. The gate spacers 470 may further be used for designing or modifying the source/drain region profile.

Figure 23C:
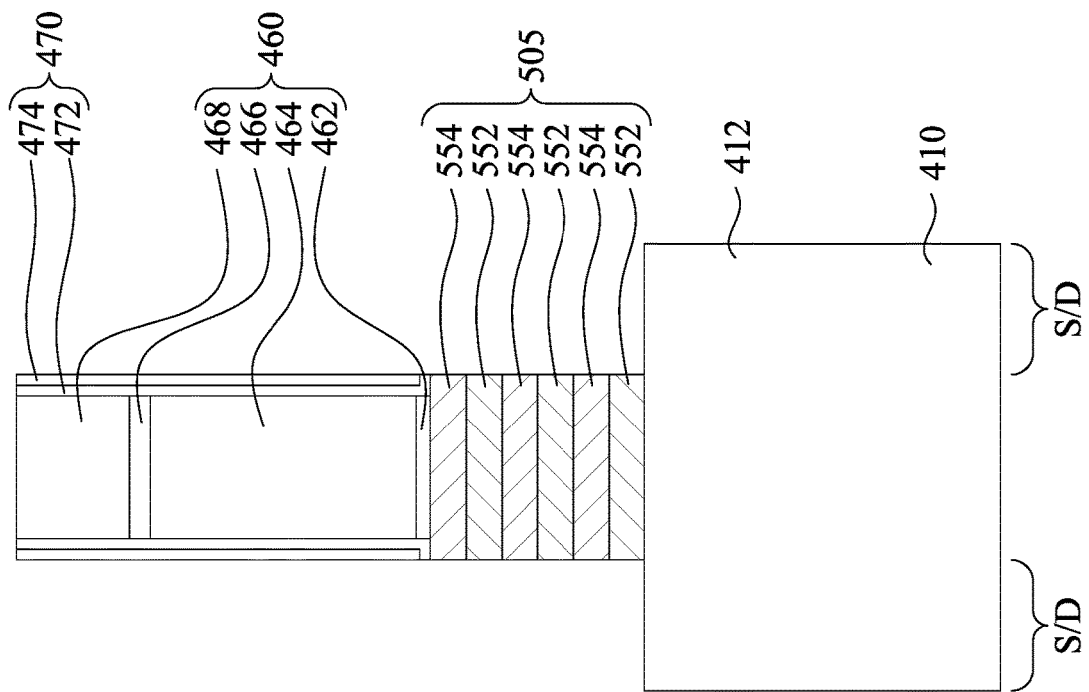

Reference is made to FIGS. 23A-23C. The exposed portions of the fin structures 505 are removed by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICP) etch, a transformer coupled plasma (TCP) etch, an electron cyclotron resonance (ECR) etch, a reactive ion etch (RIE), or the like and the reaction gas may be a fluorine-based gas (such as $SF_6$, $CH_2F_2$, $CH_3F$, $CHF_3$, or the like), chloride ($Cl_2$), hydrogen bromide (HBr), oxygen ($O_2$), the like, or combinations thereof. In some other embodiments, the SSD etching process may be performed by a wet chemical etch, such as ammonium peroxide mixture (APM), $NH_4OH$, TMAH, combinations thereof, or the like. In yet some other embodiments, the SSD etch step may be performed by a combination of a dry chemical etch and a wet chemical etch.

Figure 24C:
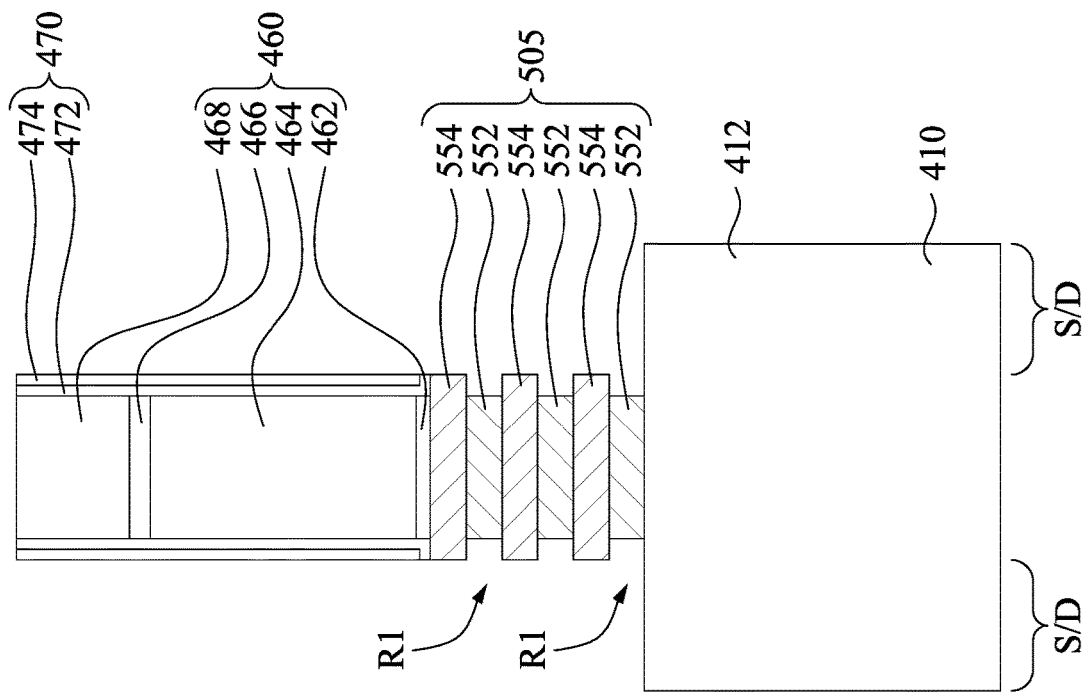
Figure 25B:
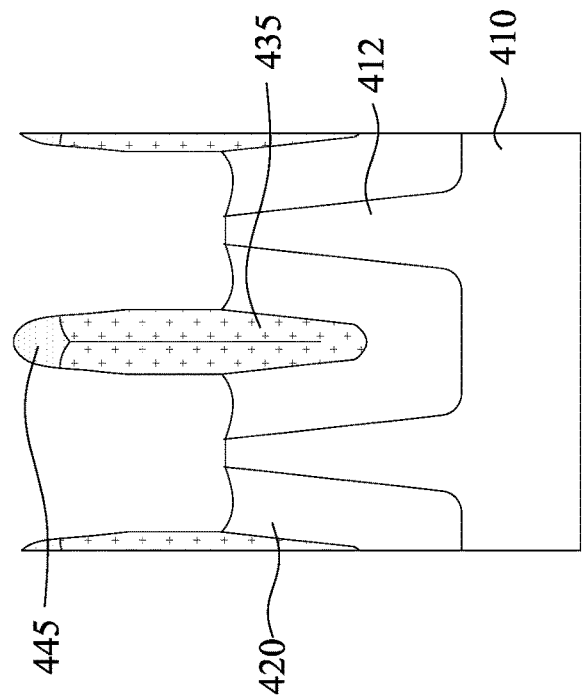
Figure 25A:
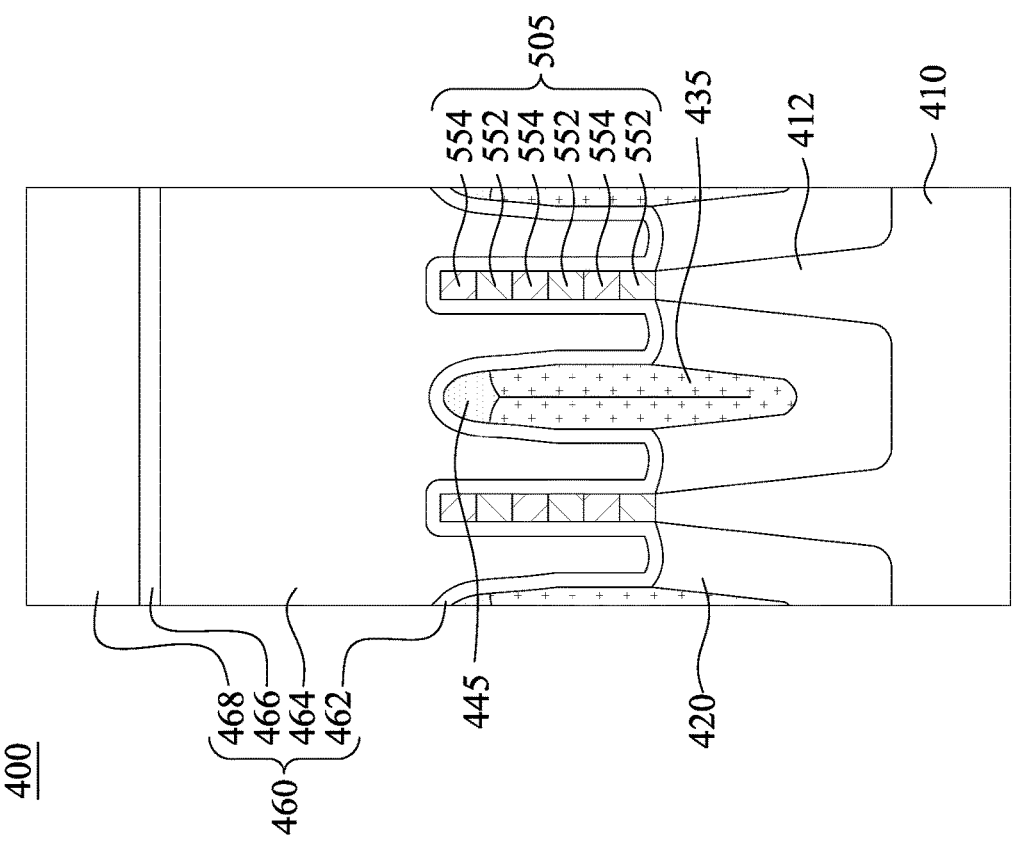
Figure 25C:
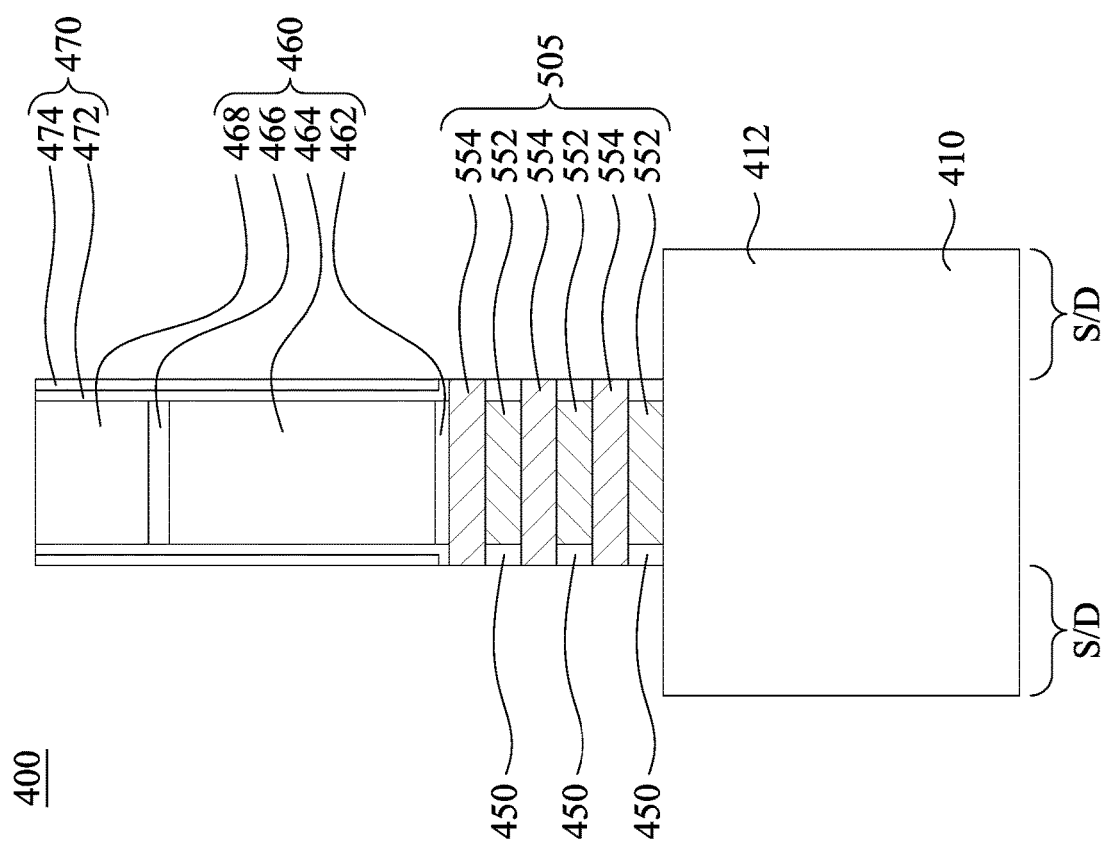

Reference is made to FIGS. 24A-25C. The epitaxial layers 552 are horizontally recessed (etched) to form recesses R1, as shown in FIGS. 24A-24C. Inner spacers 450 are respectively formed to fill the recesses R1, as shown in FIGS. 25A-25C. For example, a dielectric material layer is formed over the structure of FIGS. 24A-24C, and one or more etching operations are performed to form the inner spacers 450. In some embodiments, the inner spacers 450 includes a silicon nitride-based material, such as SiN, SiON, SiOCN or SiCN and combinations thereof and is different from the material of the gate spacers 470. In some embodiments, the inner spacers 450 are silicon nitride. The inner spacers 450 may fully fill the recesses as shown in FIGS. 25B and 25C. The dielectric material layer can be formed using CVD, including LPCVD and PECVD, PVD, ALD, or other suitable processes. The etching operations include one or more wet and/or dry etching operations. In some embodiments, the etching is an isotropic etching in some embodiments.

Figure 26B:
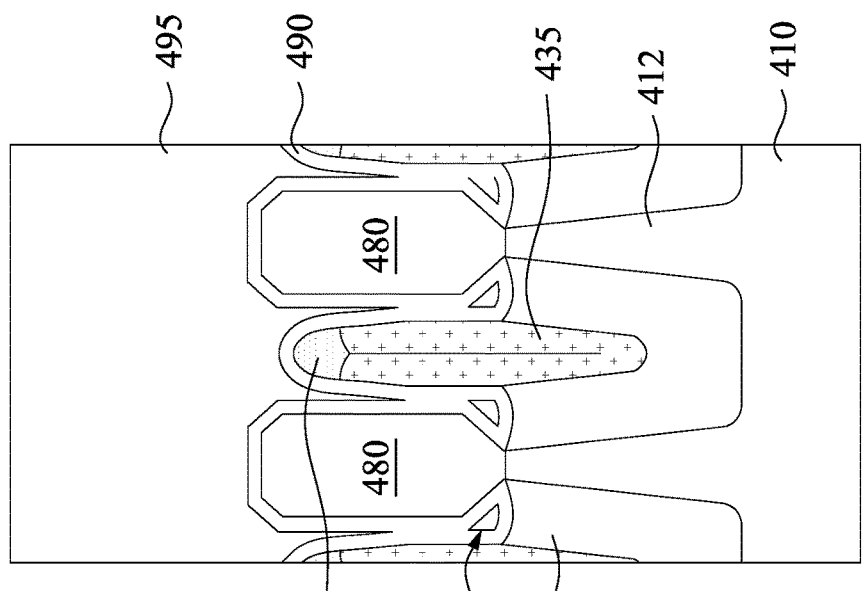
Figure 26A:
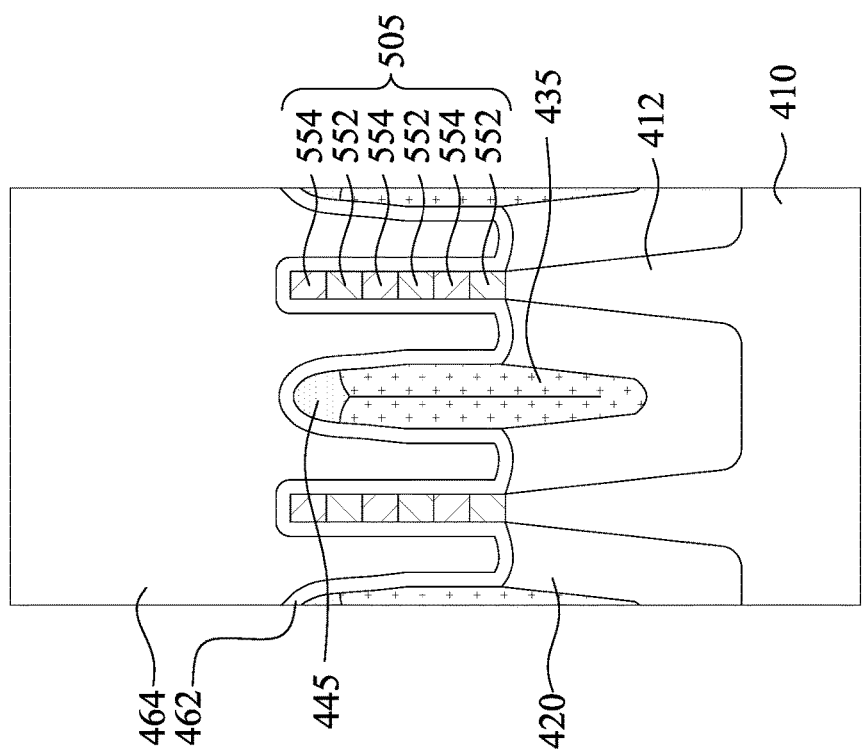
Figure 26C:
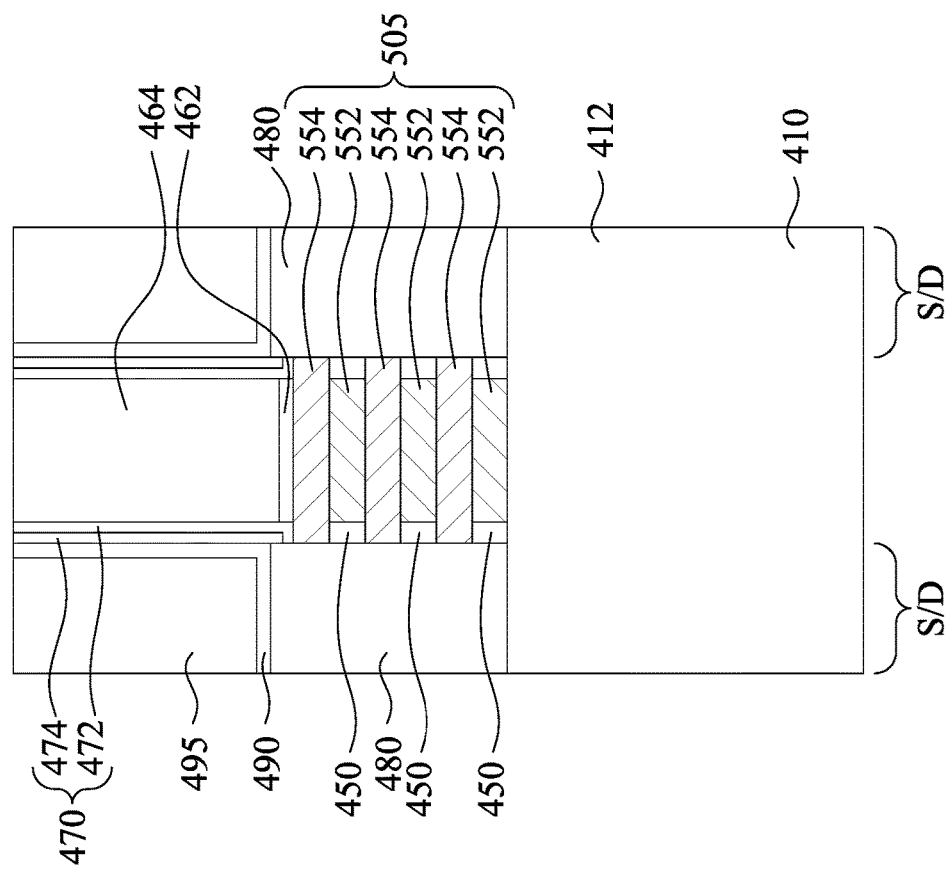

Reference is made to FIGS. 26A-26C. Source/drain epitaxial structures 480 are formed over the source/drain regions S/D of the fin structures 505. The source/drain epitaxial structures 480 may be formed by performing an epitaxial growth process that provides an epitaxial material on the fin structures 505. During the epitaxial growth process, the dummy gate structures 460, the gate spacers 470, and the inner spacers 450 limit the source/drain epitaxial structures 480 to the source/drain regions S/D. Materials and process details about the source/drain epitaxial structures 480 are similar to that of the source/drain epitaxial structures 180 of FinFETs discussed previously, and thus they are not repeated for the sake of brevity.

An interlayer dielectric (ILD) layer 495 is formed on the substrate 410. In some embodiments, a contact etch stop layer (CESL) 490 is also formed prior to forming the ILD layer 495. Materials and process details about the CESL 490 and the ILD layer 495 is similar to that of the CESL 490 and the ILD layer 495, and thus they are not repeated for the sake of brevity. In some examples, after depositing the ILD layer 495, a planarization process may be performed to remove excessive materials of the ILD layer 495. For example, a planarization process includes a chemical mechanical planarization (CMP) process which removes portions of the ILD layer 495 (and CESL 490, if present) overlying the dummy gate structures 460 and planarizes a top surface of the integrated circuit structure 400. In some embodiments, the CMP process also removes hard mask layers 466, 468 (as shown in FIGS. 25A-25C) and exposes the dummy gate electrode layer 464. In some embodiments, at least one air gap 492 is defined by the CESL 490 and is formed under the source/drain epitaxial structures 480.

Figure 27B:
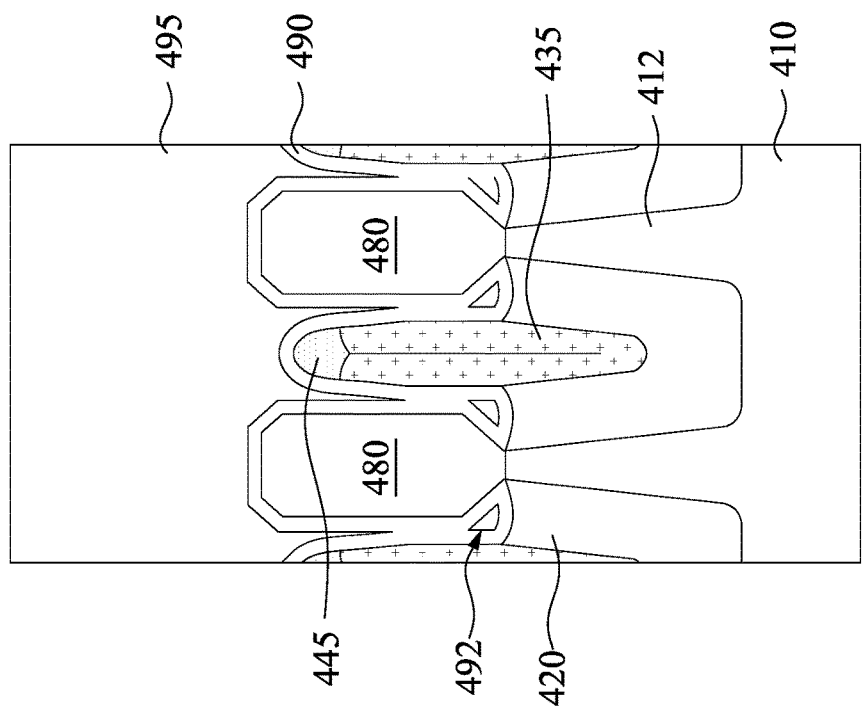
Figure 27A:
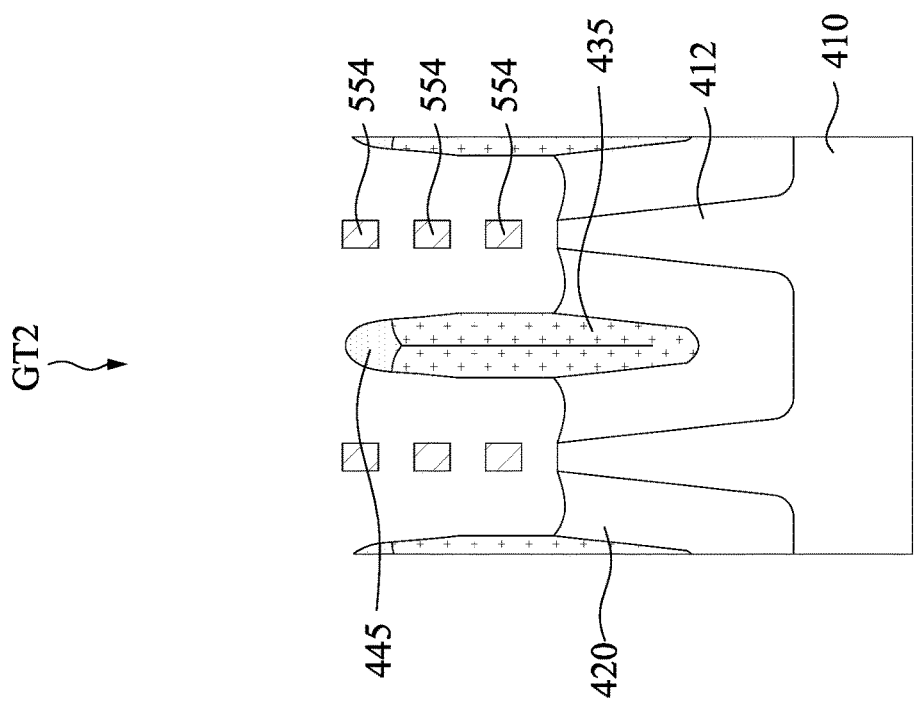
Figure 27C:
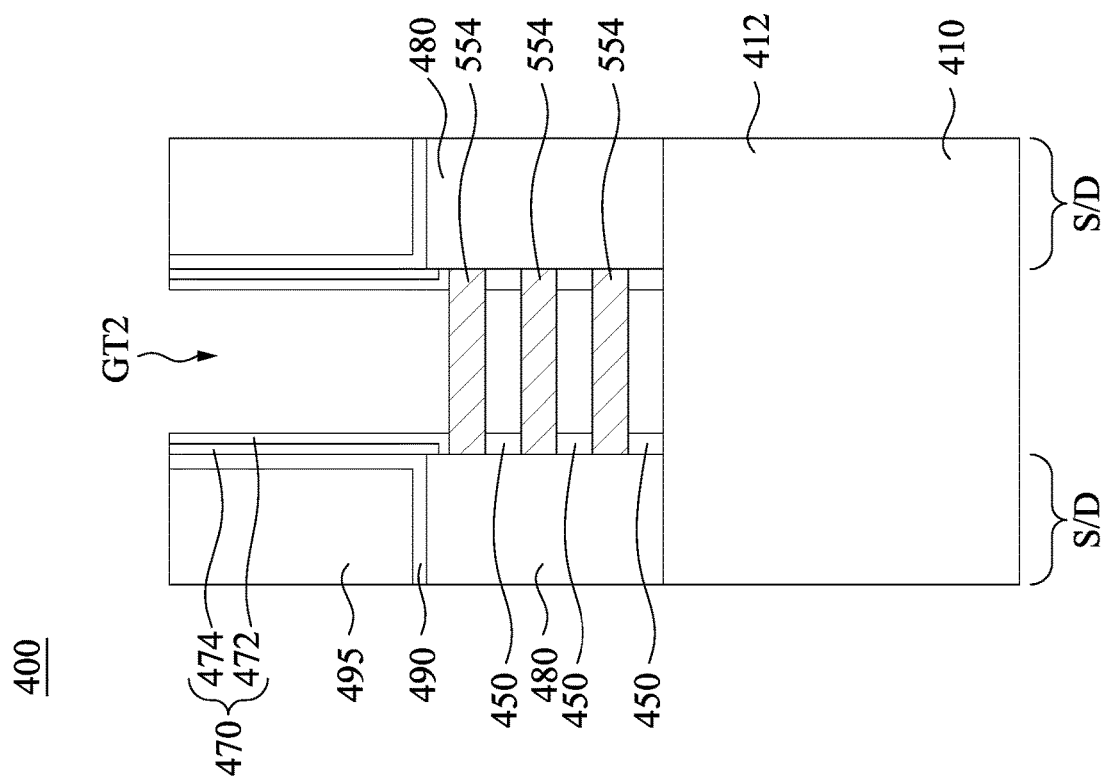

Reference is made to FIGS. 27A-27C. The dummy gate electrode layer 464 and the dummy gate electrode layer 462 (as shown in FIGS. 26A-26B) are removed first, and then the sacrificial layers are removed. The epitaxial layers 552 are then removed. In some embodiments, the dummy gate electrode layer 464 is removed by using a selective etching process (e.g., selective dry etching, selective wet etching, or combinations thereof) that etches the materials in dummy gate electrode layer 464 at a faster etch rate than it etches other materials (e.g., the gate spacers 470, the ILD layer 495, and/or the CESL 490), thus resulting in gate trenches GT2 between corresponding gate spacers 470. Subsequently, the sacrificial layers in the gate trenches GT2 are removed by using another selective etching process that etches the sacrificial layers at a faster etch rate than it etches the channel layers. The epitaxial layers 554 become nanosheets suspended over the substrate 410 and between the source/drain epitaxial structures 480. This operation is also called a channel release process. In some embodiments, the channel layers can be interchangeably referred to as nanowires, nanoslabs and nanorings, depending on their geometry. For example, in some other embodiments the channel layers may be trimmed to have a substantial rounded shape (i.e., cylindrical) due to the selective etching process for completely removing the sacrificial layers. In that case, the channel layers can be called nanowires.

Figure 28B:
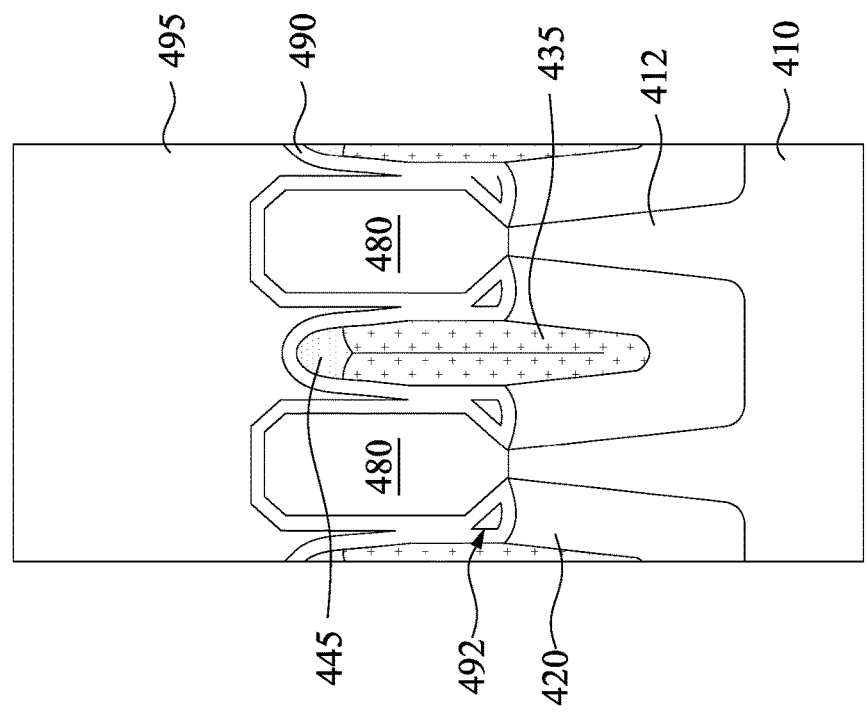
Figure 28A:
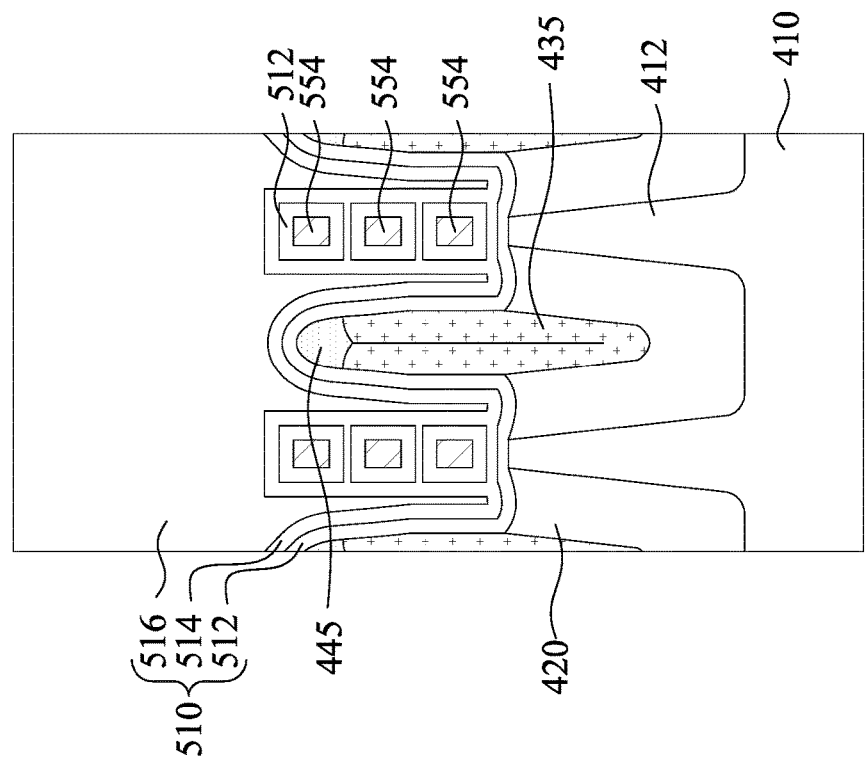
Figure 28C:
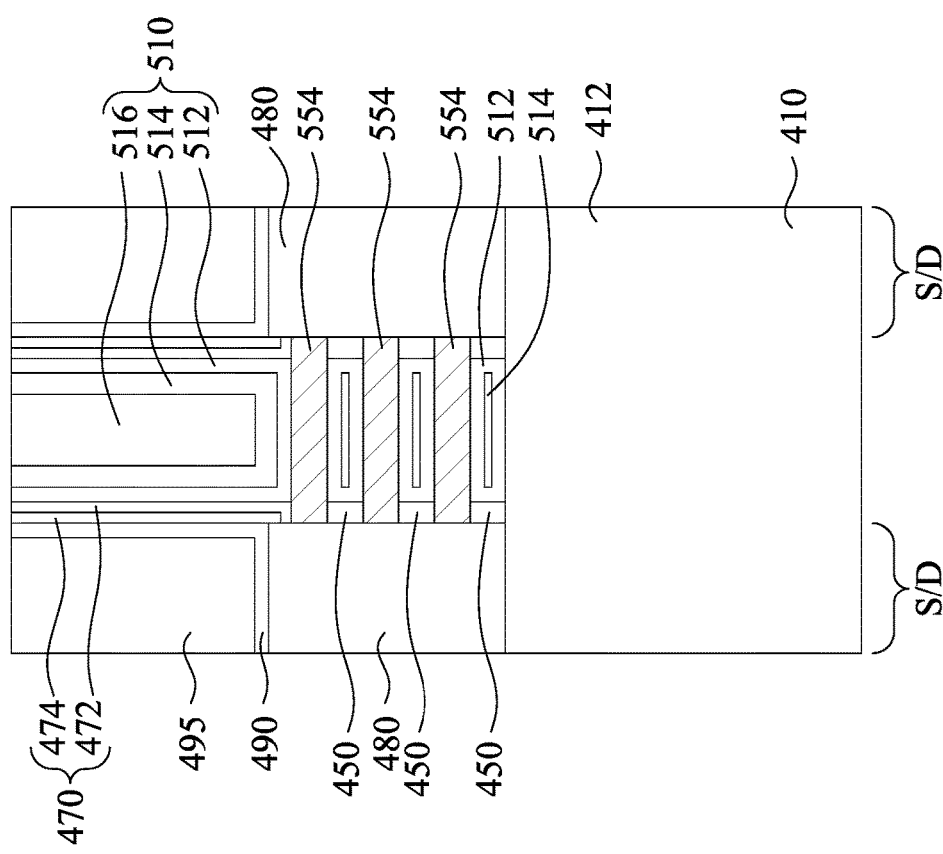

Reference is made to FIGS. 28A-28C. A replacement gate structure 510 is formed in the gate trench GT2 to surround each of the channel layers suspended in the gate trench GT2. The gate structure 510 may be the final gate of a GAA FET. As shown in FIG. 28A, since portions of the top dielectric fins 445 are removed during the etching process in FIG. 21, the gaps between the semiconductor layers 554 and the top dielectric fins 445 are enlarged, and the gate structure 510 can be easily deposited between the semiconductor layers 554 and the top dielectric fins 445. The final gate structure 510 may be a high-k/metal gate stack, however other compositions are possible. In some embodiments, the gate structures 510 forms the gate associated with the multi-channels provided by the plurality of channel layers. In various embodiments, the gate structure 510 includes a gate dielectric layer 512 formed around the channel layers, a work function metal layer 514 formed around the gate dielectric layer 512, and a fill metal 516 formed around the work function metal layer 514 and filling a remainder of gate trench GT2. The gate dielectric layer 512 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 514 and/or fill metal layer 516 used within the gate structures 510 may include a metal, metal alloy, or metal silicide. Formation of the gate structures 510 may include depositions to form various gate materials, one or more liner layers, and one or more CMP processes to remove excessive gate materials. As illustrated in a cross-sectional view of FIG. 28A, the gate structure 510 surrounds each of the channel layers, and thus is referred to as a gate of a GAA FET. Materials and process details about the gate structures 510 of GAA FETs are similar to the gate structures 210 of FinFETs, and thus they are not repeated for the sake of brevity.

Figure 29B:
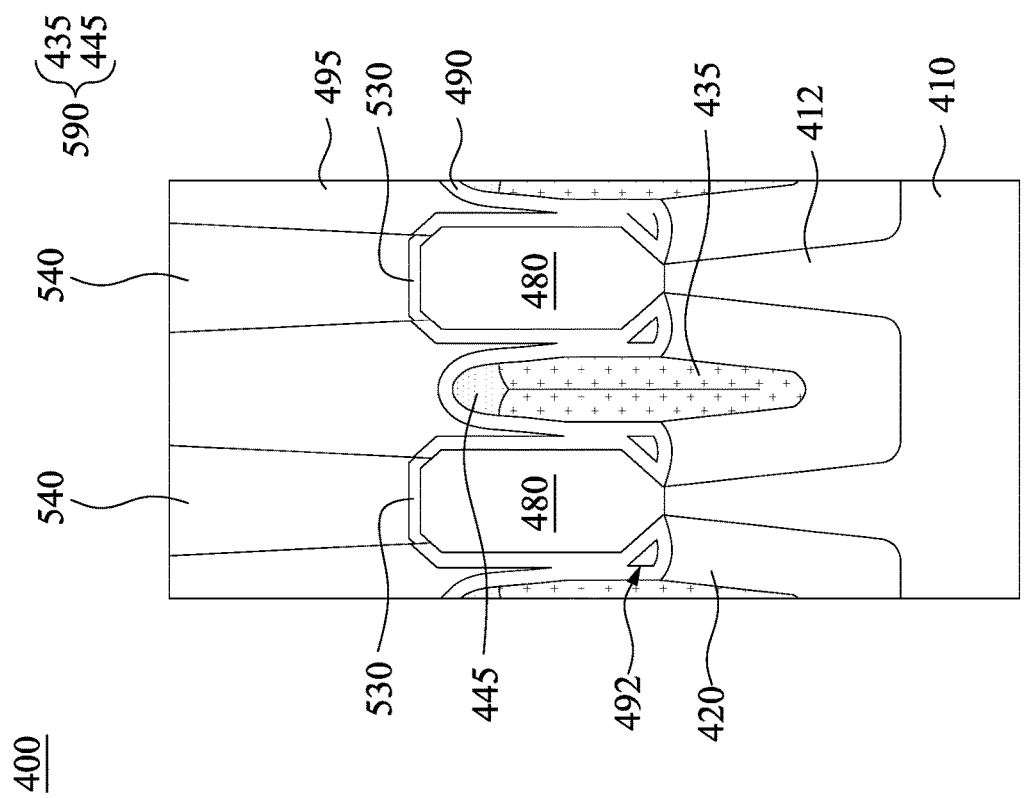
Figure 29A:
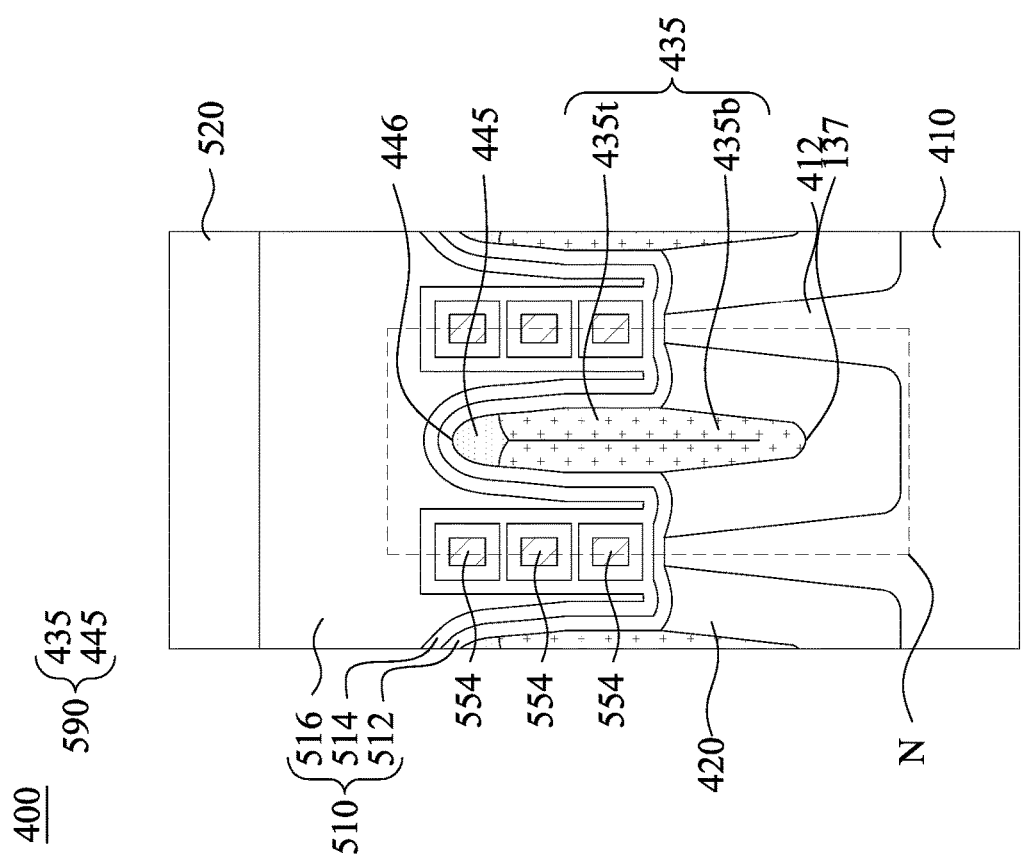
Figure 29D:
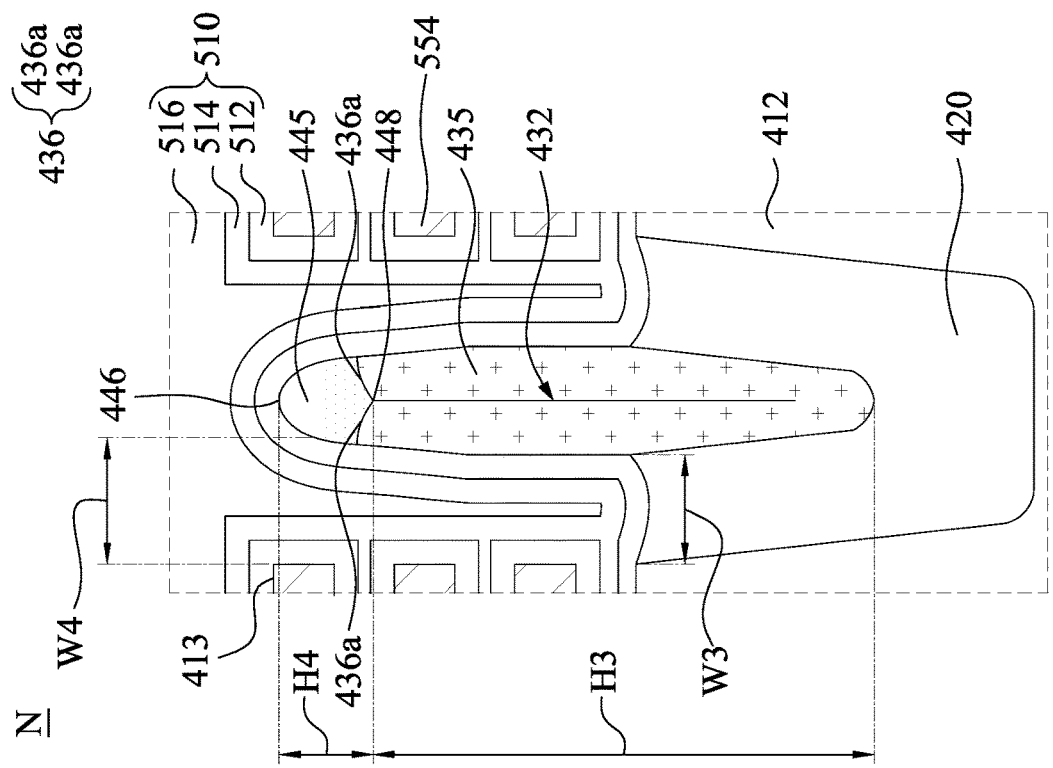
FIG. 29D is an enlarged view of area N in FIG. 29A.
Figure 29C:
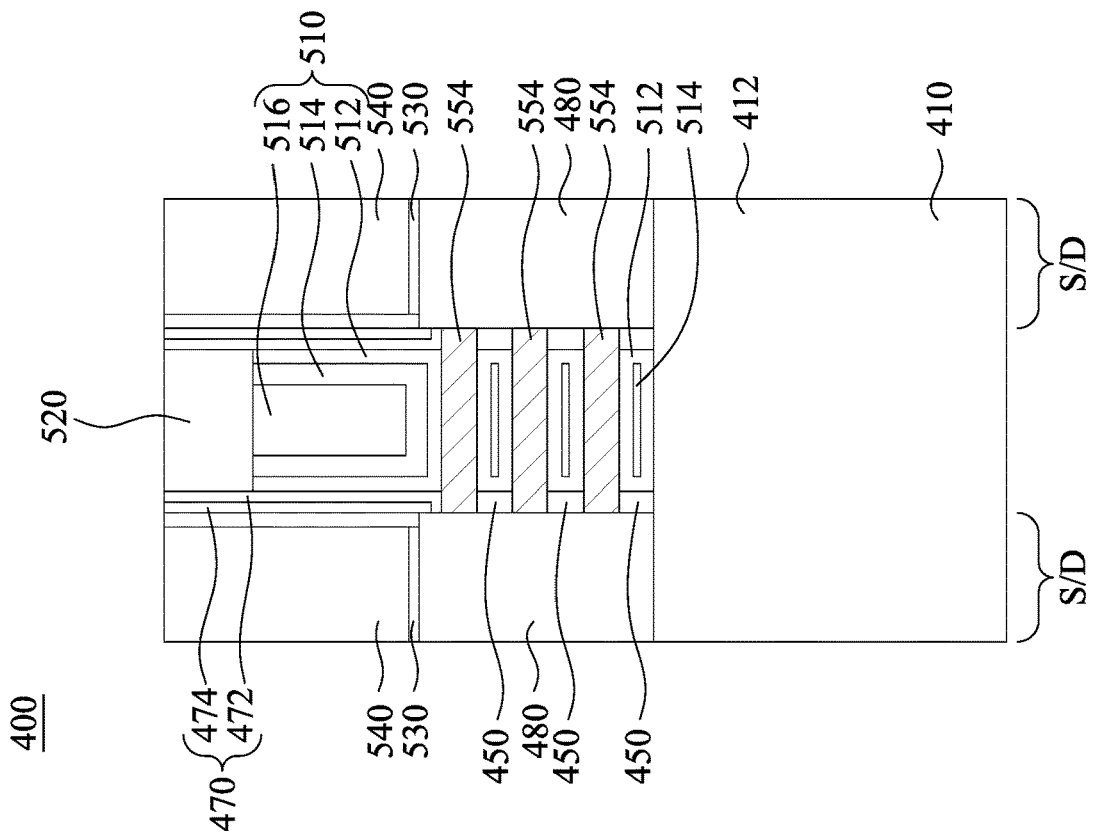

Reference is made to FIGS. 29A-29C. A dielectric cap 520 is optionally formed over the etched-back gate structures 510. For example, a dielectric cap layer, including $SiN_x$, $Al_xO_y$, AlON, $SiO_xC_y$, $SiC_xN_y$, combinations thereof or the like, is formed by a suitable deposition technique such as CVD, plasma-enhanced CVD (PECVD), ALD, remote plasma ALD (RPALD), plasma-enhanced ALD (PEALD), combinations thereof or the like. A CMP process is then performed to remove the dielectric cap layer outside the recess, leaving portions of the dielectric cap layer in the recess to serve as the dielectric cap 520.

Source/drain contacts 540 are then formed extending through the ILD layer 495 (and the CESL 490, if present). Formation of the source/drain contacts 540 includes, by way of example and not limitation, performing one or more etching processes to form contact openings extending though the ILD layer 495 to expose the source/drain epitaxial structures 480, depositing one or more metal materials overfilling the contact openings, and then performing a CMP process to remove excessive metal materials outside the contact openings. In some embodiments, the one or more etching processes are selective etching that etches the ILD layer 495 at a faster etch rate than etching the dielectric caps 520 and the gate spacers 470. As a result, the selective etching is performed using the dielectric caps 520 and the gate spacers 470 as an etch mask, such that the contact openings and hence the source/drain contacts 540 are formed self-aligned to the source/drain epitaxial structures 480 without using an additional photolithography process. In that case, the dielectric caps 520 allowing for forming the source/drain contacts 540 can be called SAC caps 520. In some embodiments, metal alloy layers 530 are formed over the source/drain epitaxial structures 480 prior to form the source/drain contacts 540. The metal alloy layers 530 may be silicide when the source/drain epitaxial structures 480 include silicon.

In FIG. 29A, the integrated circuit structure 400 includes the semiconductor layers 554, dielectric fin structures 590, isolation layers 420, and the gate structures 510. The semiconductor layers 554 are over the base portions 412 of the substrate 410. The isolation layers 420 are over the substrate 410 and between the base portions 412. For example, the isolation layers 420 are in contact with the base portions 412. Each of the dielectric fin structures 590 are respectively protrude from the isolation layers 420 and includes the bottom dielectric fin 435 and the top dielectric fin 445. The carbon concentration of the bottom dielectric fin 435 is greater than the carbon concentration of the top dielectric fin 445. The bottom 435b of the bottom dielectric fin 435 is embedded in and in contact with the isolation layer 420, and the top 435t of the bottom dielectric fin 435 protrudes from the isolation layer 420. The isolation layer 420 surrounds the bottom 435b of the bottom dielectric fin 435. The top dielectric fin 445 is over the bottom dielectric fin 435 and is spaced apart from the isolation layer 420. The bottom 435b of the bottom dielectric fin 435 tapers downward, and the top 435t of the bottom dielectric fin 435 tapers upward. Stated another way, a sidewall of the top 435t of the bottom dielectric fin 435 and a sidewall of the bottom 435b of the bottom dielectric fin 135 are not parallel to each other. In FIG. 29B, the integrated circuit structure 400 further includes the source/drain epitaxial structures 480 connected to the base portions 412. The source/drain epitaxial structures 480 have sidewalls facing the dielectric fin structures 590, and the sidewalls of the source/drain epitaxial structures 480 are not parallel to the sidewalls of the top dielectric fin 445.

FIG. 29D is an enlarged view of area N in FIG. 29A. In FIGS. 29A and 29D, the bottom dielectric fin 435 has a seam 432 therein, and the top dielectric fin 445 covers the seam 432 of the bottom dielectric fin 435. The bottom dielectric fin 435 has a top surface 436 which includes two convex portions 436a on opposite sides of the seam 432 of the bottom dielectric fin 435. Stated another way, the top dielectric fin 445 has a bottom surface (corresponding to the top surface 436 of the bottom dielectric fin 435) includes a bottommost portion 448 and two concave portions (corresponding to the convex portions 436a of the bottom dielectric fin 435) on opposite sides of the bottommost portion 448. Further, the bottommost portion 448 is directly above the seam 432 of the bottom dielectric fin 435.

The top dielectric fin 445 has a top surface 446. In some embodiments, the top surface 446 of the top dielectric fin 445 is rounded than the convex portions 436a of the top surface 436 of the bottom dielectric fin 435 (corresponding to the concave portions of the bottom surface of the top dielectric fin 445). Further, the bottom surface 437 of the bottom dielectric fin 435 is rounded.

The top dielectric fin 445 has a height H4 shorter than about 30 nm, e.g., about 20 nm to about 30 nm. The bottom dielectric fin 435 has a height H3 in a range of about 80 nm to about 120 nm. In some embodiments, a ratio of the height H4 to the height H3 is in a range of about 1/10 to about 1/2.

The gate structure 510 wrapping around each of the semiconductor layers 554 and is across the dielectric fin structures 290. As shown in FIG. 29D, a portion of the gate structure 510 in contact with the isolation layer 420 has a width W3, and another portion of the gate structure 510 in contact with the top dielectric fin 445 has a width W4 greater than the width W3.

FIGS. 30A and 30B are cross-sectional views of an integrated circuit structure (or a semiconductor device) 400a in accordance with some embodiments of the present disclosure. The difference between the semiconductor device 400a in FIGS. 30A and 30B and the semiconductor device 400 in FIGS. 29A-29C is the height of the bottom dielectric fins 435. Other relevant structural details of the semiconductor device 400a in FIGS. 30A and 30B are the same as or similar to the semiconductor device 100 in FIGS. 29A-29C, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the dielectric fin structure includes a top dielectric fin having a rounded top surface and/or has a tapered shaped. As such, a window for depositing the gate structure (both the dummy gate structure and the metal gate structure) is enlarged. Another advantage is that the formation of the top dielectric fin and bottom dielectric fin are similar, simplifies the manufacturing process of the integrated circuit structure. Further, the etching process has a distinguishable etching selectivity between the top dielectric fin and the bottom dielectric fin, such that the bottom dielectric fin does not damaged during the recessing process of the isolation layer.

According to some embodiments, a device includes a semiconductor fin, an isolation layer, a dielectric fin structure, and a gate structure. The semiconductor fin is over a substrate. The isolation layer is over the substrate and adjacent the semiconductor fin. The dielectric fin structure is over the isolation layer and includes a bottom dielectric fin and a top dielectric fin. The isolation layer surrounds a bottom of the bottom dielectric fin. The top dielectric fin is over the bottom dielectric fin and is spaced apart from the isolation layer. The gate structure is across the semiconductor fin and the dielectric fin structure. A portion of the gate structure in contact with the isolation layer has a first width, and another portion of the gate structure in contact with the top dielectric fin has a second width greater than the first width.

According to some embodiments, a device includes a channel layer, an isolation layer, a dielectric fin structure, a gate structure, and a source/drain epitaxial structure. The channel layer is over a base portion of a substrate. The isolation layer is in contact with the base portion of the substrate. The dielectric fin structure protrudes from the isolation layer and includes a bottom dielectric fin and a top dielectric fin. The bottom dielectric fin is in contact with the isolation layer. The top dielectric fin is over the bottom dielectric fin. A bottom surface of the top dielectric fin bottom surface of the top dielectric fin is concave. The gate structure warps around the channel layer and is across the dielectric fin structure. The source/drain epitaxial structure is connected to the channel layer and adjacent to the dielectric fin structure. The source/drain epitaxial structure has a sidewall facing the dielectric fin structure. The sidewall of the source/drain epitaxial structure is not parallel to a sidewall of the top dielectric fin of the dielectric fin structure.

According to some embodiments, a method includes forming a first fin and a second fin over a substrate. An isolation layer is formed over the first and second fins and the substrate such that a trench is formed in the isolation layer and between the first and second fins. A first dielectric fin layer is deposited in the trench of the isolation layer. The first dielectric fin layer is etched back to form a bottom dielectric fin and a recess in the isolation layer and over the bottom dielectric fin. A second dielectric fin layer is deposited in the recess and over the bottom dielectric fin. A planarization process is performed to remove portions of the second dielectric fin layer and the isolation layer until top surfaces of the first and second fins are exposed. An etching process is performed to recess the isolation layer such that a remaining portion of the second dielectric fin layer and a portion of the bottom dielectric fin protrude from the recessed isolation layer. A gate structure is formed over the remaining portion of the second dielectric fin layer, the bottom dielectric fin, and the first and second fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin and a second fin over a substrate;
   depositing an isolation layer over the first and second fins and the substrate such that a trench is formed in the isolation layer and between the first and second fins;
   depositing a first dielectric fin layer in the trench of the isolation layer;
   etching back the first dielectric fin layer to form a bottom dielectric fin and a recess in the isolation layer and over the bottom dielectric fin;
   depositing a second dielectric fin layer in the recess and over the bottom dielectric fin;
   performing a planarization process to remove portions of the second dielectric fin layer and the isolation layer until top surfaces of the first and second fins are exposed;
   performing an etching process to recess the isolation layer such that a remaining portion of the second dielectric fin layer and a portion of the bottom dielectric fin protrude from the recessed isolation layer; and
   forming a gate structure over the remaining portion of the second dielectric fin layer, the bottom dielectric fin, and the first and second fins.

2. The method of claim 1, wherein a carbon concentration of the first dielectric fin layer is greater than a carbon concentration of the second dielectric fin layer.

3. The method of claim 2, wherein both the first and second dielectric fin layers comprise silicon and nitrogen.

4. The method of claim 1, wherein the etching process etches the isolation layer at a first etching rate, etches the first dielectric fin layer at a second etching rate, and etches the second dielectric fin layer at a third etching rate, wherein the first etching rate is higher than the third etching rate, and the third etching rate is higher than the second etching rate.

5. The method of claim 4, wherein the third etching rate is about 3 times to about 5 times of the second etching rate.

6. The method of claim 1, wherein etching back the first dielectric fin layer is such that a top surface of the bottom dielectric fin is lower than a top surface of the first fin.

7. A method comprising:
   forming a semiconductor fin over a substrate;
   forming an isolation layer over the substrate and adjacent the semiconductor fin;
   forming a dielectric fin structure over the isolation layer and comprising:
      a bottom dielectric fin, wherein the isolation layer surrounds a bottom of the bottom dielectric fin; and
      a top dielectric fin over the bottom dielectric fin and spaced apart from the isolation layer, wherein a top surface of the top dielectric fin is rounded; and
   forming a gate structure across the semiconductor fin and the dielectric fin structure, wherein a portion of the gate structure in contact with the isolation layer has a first width, and another portion of the gate structure in contact with the top dielectric fin has a second width greater than the first width.

8. The method of claim 7, wherein a carbon concentration of the bottom dielectric fin is greater than a carbon concentration of the top dielectric fin.

9. The method of claim 7, wherein the top surface of the top dielectric fin is rounder than a top surface of the semiconductor fin.

10. The method of claim 7, wherein the bottom dielectric fin has a seam therein, and the top dielectric fin covers the seam of the bottom dielectric fin.

11. The method of claim 10, wherein a top surface of the bottom dielectric fin comprises two convex portions on opposite sides of the seam.

12. The method of claim 7, wherein the bottom of the bottom dielectric fin tapers downward, and a top of the bottom dielectric fin tapers upward.

13. The method of claim 7, wherein a bottom surface of the bottom dielectric fin is rounded.

14. The method of claim 7, wherein the semiconductor fin comprises a top portion and a bottom portion under the top portion, the top portion is made of SiGe, and the bottom portion is made of Si.

15. A method comprising:
   forming a channel layer over a base portion of a substrate;
   forming an isolation layer in contact with the base portion of the substrate;
   forming a dielectric fin structure protruding from the isolation layer and comprising:
      a bottom dielectric fin in contact with the isolation layer; and
      a top dielectric fin over the bottom dielectric fin, wherein a bottom surface of the top dielectric fin is concave;
   forming a gate structure warping around the channel layer and across the dielectric fin structure; and
   forming a source/drain epitaxial structure connected to the channel layer and adjacent to the dielectric fin structure, wherein the source/drain epitaxial structure has a sidewall facing the dielectric fin structure, and the sidewall of the source/drain epitaxial structure is not parallel to a sidewall of the top dielectric fin of the dielectric fin structure.

16. The method of claim 15, wherein the bottom surface of the top dielectric fin comprises a bottommost portion and two concave portions on opposite sides of the bottommost portion.

17. The method of claim 16, wherein the top surface of the top dielectric fin is rounder than the two concave portions of the bottom surface of the top dielectric fin.

18. The method of claim 15, wherein the top dielectric fin is spaced apart from the isolation layer.

19. The method of claim 15, wherein the top dielectric fin tapers upward.

20. The method of claim 15, wherein a height of the top dielectric fin is in a range of about 20 nm to about 30 nm.

* * * * *